(12) United States Patent
Inoue

(10) Patent No.: US 7,894,727 B2
(45) Date of Patent: *Feb. 22, 2011

(54) OPERATIONAL AMPLIFIER CIRCUIT, BANDPASS FILTER CIRCUIT, AND INFRARED SIGNAL PROCESSING CIRCUIT

(75) Inventor: Takahiro Inoue, Katsuragi (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 661 days.

This patent is subject to a terminal disclaimer.

(21) Appl. No.: 11/933,054

(22) Filed: Oct. 31, 2007

(65) Prior Publication Data

US 2008/0112711 A1 May 15, 2008

(30) Foreign Application Priority Data

Nov. 15, 2006 (JP) .............................. 2006-309631

(51) Int. Cl.
*H04B 10/06* (2006.01)
*H03F 3/45* (2006.01)

(52) U.S. Cl. ...................................... 398/202; 330/258

(58) Field of Classification Search .......... 398/202–214
See application file for complete search history.

(56) References Cited

U.S. PATENT DOCUMENTS

| | | | | |
|---|---|---|---|---|
| 5,155,447 A * | 10/1992 | Huijsing et al. | ............. | 330/107 |
| 5,247,211 A * | 9/1993 | Sakura | ......................... | 327/72 |
| 5,428,316 A | 6/1995 | Molnar | | |
| 5,578,964 A | 11/1996 | Kim et al. | | |
| 6,181,196 B1 | 1/2001 | Nguyen | | |
| 6,335,655 B1 | 1/2002 | Yamamoto | | |
| 6,516,026 B1 | 2/2003 | Blatz | | |
| 6,704,560 B1 * | 3/2004 | Balteanu et al. | ............. | 455/333 |
| 7,173,486 B1 * | 2/2007 | Sutardja | ...................... | 330/107 |
| 7,635,837 B2 * | 12/2009 | Uo et al. | .................. | 250/214 A |
| 7,719,349 B2 * | 5/2010 | Okada | ......................... | 327/553 |
| 2003/0052661 A1 | 3/2003 | Tachimori | | |
| 2003/0171108 A1 | 9/2003 | Eichin et al. | | |
| 2004/0239426 A1 | 12/2004 | Miwa et al. | | |
| 2005/0118975 A1 * | 6/2005 | Ismail | ......................... | 455/283 |
| 2008/0112711 A1 * | 5/2008 | Inoue | ......................... | 398/202 |
| 2008/0112712 A1 * | 5/2008 | Inoue | ......................... | 398/208 |

FOREIGN PATENT DOCUMENTS

JP 6-510407 A 11/1994

(Continued)

*Primary Examiner*—Shi K Li
(74) *Attorney, Agent, or Firm*—Birch, Stewart, Kolasch & Birch, LLP

(57) ABSTRACT

An operational amplifier circuit includes a transconductance amplifier circuit which converts a differential input voltage into a differential output current; a common-mode feedback circuit which outputs a control signal to the transconductance amplifier circuit 1 so as to make a D.C. voltage level of a differential output voltage of the transconductance amplifier circuit equal to a reference voltage; a voltage supply circuit which supplies a reference voltage to the common-mode feedback circuit; and an output load to which the differential output voltage of transconductance amplifier circuit is applied, and which constitutes an output terminal of the operational amplifier circuit 5. A power source voltage is supplied to each of the circuits. The operational amplifier circuit has an improved power-source noise canceling characteristic while maintaining its dynamic range.

14 Claims, 26 Drawing Sheets

FOREIGN PATENT DOCUMENTS

| | | |
|---|---|---|
| JP | 7-307624 A | 11/1995 |
| JP | 10-173482 A | 6/1998 |
| JP | 11-288321 A | 10/1999 |
| JP | 11-331076 A | 11/1999 |
| JP | 2003-84846 A | 3/2003 |
| JP | 2004-056541 A | 2/2004 |
| JP | 2004-328487 A | 11/2004 |
| JP | 2005-354172 A | 12/2005 |
| JP | 2006-060410 A | 3/2006 |
| JP | 2006-148572 A | 6/2006 |
| JP | 2008-125023 A | 5/2008 |

\* cited by examiner

When CLK = H, Q data is switched

When CLK = L, Q data is latched, and D data is input (THRESHOLD LEVEL)

US 7,894,727 B2

OPERATIONAL AMPLIFIER CIRCUIT, BANDPASS FILTER CIRCUIT, AND INFRARED SIGNAL PROCESSING CIRCUIT

This Nonprovisional application claims priority under 35 U.S.C. §119(a) on Patent Application No. 2006/309631 filed in Japan on Nov. 15, 2006, the entire contents of which are hereby incorporated by reference.

FIELD OF THE INVENTION

The present invention relates to an operational amplifier circuit, a bandpass filter circuit, and an infrared signal processing circuit whose respective power-source noise canceling characteristics are improved while their dynamic ranges are kept from decreasing.

BACKGROUND OF THE INVENTION

Typical examples of an infrared signal processing circuit are: remote controllers of home electric appliances and peripheral devices of personal computers, each of which performs data communication in compliance with IrDA (Infrared Data Association) standard or IrDA Control standard.

For example, a conventional infrared remote control receiver 110 includes a photodiode chip 101 and a reception chip 108 as shown in FIG. 23. The photodiode chip 101 converts a remote control transmission signal received from an infrared remote control transmitter (not shown) into a current signal Iin. The reception chip 108 includes: a current-to-voltage-conversion circuit 102 for converting the current signal Iin having been generated into a voltage signal; an amplifying circuit 103 for amplifying the voltage signal having been generated; a bandpass filter circuit (hereinafter, BPF) 104 for extracting a carrier frequency component from the voltage signal having been amplified; a carrier detection circuit 105 for detecting a carrier from the carrier frequency component having been extracted; an integrating circuit 106 for integrating carrier-existing periods; and a hysteresis comparator 107 which compares an output of the integrating circuit 106 with a threshold level, thereby (i) judging whether or not the carrier exits and (ii) outputting the result of the judgment in the form of digital output. The digital output Dout of the hysteresis comparator 107 is sent to a microcomputer or the like which controls an electronic device.

FIG. 24 shows an output of each circuit of the infrared remote control receiver 110. FIG. 24(a) shows an output of the current signal Iin. FIG. 24(b) shows an output of the BPF 104 (solid line) and that of the carrier detection circuit 105 (dotted line). FIG. 24(c) shows an output of the integrating circuit 106 (solid line). FIG. 24(d) shows a digital output Dout of the infrared remote control receiver 110.

Note that the dotted line in FIG. 24(c) is a threshold level.

The infrared remote control receiver performs a high-gain amplification. As such, an influence from power source noise is remarkable. For this reason, power-source noise canceling characteristic PSRR (power supply rejection ratio) needs to be improved.

FIG. 25 shows a configuration of an infrared remote control receiver 120 whose power-source noise canceling characteristic is improved compared to the infrared remote control receiver 110. The infrared remote control receiver 120 has the same configuration as that of the infrared remote control receiver 110 except in that an operational amplifier circuit 103a is substituted for the amplifying circuit 103.

As shown in FIG. 26, the operational amplifier circuit 103a includes: a transconductance amplifier circuit (hereinafter simply referred to as GM) 111; a constant voltage circuit (VS)112, and an output load ZL.

The gain Av of the operational amplifier circuit 103a is:

$$Av=(vout^+ - vout^-)/(vin^+ - vin^-)=gm*ZL$$

where:

vin$^+$ and vin$^-$ are differential input voltages of the operational amplifier circuit 103a;

vout$^+$ and vout$^-$ are differential output voltages of the operational amplifier circuit 103a;

gm is a transconductance of the GM111; and

ZL is a load impedance.

As shown in the figure, in the operational amplifier circuit 103a, a power source voltage for the GM111 is an output voltage vref of the constant voltage circuit 112, and not a power source voltage vdd which could be varied due to power source noise. Therefore, the power-source noise canceling characteristic can be improved. However, when the output voltage vref of the constant voltage circuit 112 is used as the power source voltage for the GM111, the dynamic range is reduced by a difference between vdd and vref (i.e., vdd−vref). For example, since vdd−vref usually needs to be approximately 0.2V, the output voltage vref of the constant voltage circuit 112 is 2.2V when the power source voltage vdd is 2.4V. As such, the GM111 operates at 2.2V.

A battery-driven device is required to operate at a low voltage. However, since the operational amplifier circuit 103a adopting the constant voltage circuit 112 fails to ensure a sufficient dynamic range when operated at a low voltage, the operational amplifier circuit 103a is not suitable for a low-voltage operation. Further, it is crucial to ensure a sufficient dynamic range in an infrared remote control receiver. This is because a BPF whose output amplitude is large is arranged in a stage after the amplifying circuit.

For the above reasons, improving of a power-source noise canceling characteristic by means of the operational amplifier circuit 103a is not feasible in an infrared remote control receiver.

SUMMARY OF THE INVENTION

In view of the foregoing problems, the present invention was made, and it is an object of the present invention to realize an operational amplifier circuit, a bandpass filter circuit and an infrared signal processing circuit, each of which has an improved power-source noise canceling characteristic while its dynamic range is kept from being reduced.

In order to achieve the foregoing object, an operational amplifier circuit of the present invention includes: a transconductance amplifier circuit for converting a differential input voltage into a differential output current; a common-mode feedback circuit to which a differential output voltage of the transconductance amplifier circuit and a reference voltage are input, and which outputs a control signal to the transconductance amplifier circuit so as to make a D.C. voltage level of a differential output voltage of the transconductance amplifier circuit equal to the reference voltage; a voltage supply circuit for supplying, as the reference voltage, a voltage which is hardly affected by the power source voltage to the common-mode feedback circuit; and an output load to which the differential output voltage of the transconductance amplifier circuit is applied, and which constitutes an output terminal of the operational amplifier circuit, wherein the power source voltage is supplied from a power source terminal to each of the circuits.

With the configuration, the operational amplifier circuit of the present invention is able to make a D.C. voltage level of a differential output of the transconductance amplifier circuit equal to the reference voltage. As the reference voltage, a voltage which is hardly affected by the power source voltage is supplied. Thus, power-source noise canceling characteristic is improved. Further, in the transconductance amplifier circuit, the power source voltage is supplied from the power source terminal. Therefore, the dynamic range is not reduced by much. Thus, it is possible to provide an operational amplifier circuit whose power-source noise canceling characteristic is improved while its dynamic range is kept from being decreased.

In order to achieve the foregoing object, a bandpass filter circuit of the present invention includes: a first transconductance amplifier circuit for converting a differential input voltage into a differential output current; a second transconductance amplifier circuit for converting a differential input voltage into a differential output current; a third transconductance amplifier circuit for converting a differential input voltage into a differential output current; a first common-mode feedback circuit to which a differential output voltage of the first transconductance amplifier circuit and a reference voltage are input, and which outputs a first control signal to the first transconductance amplifier circuit so as to make a D.C. voltage level of a differential output voltage of the first transconductance amplifier circuit equal to the reference voltage; a second common-mode feedback circuit to which a differential output voltage of the second transconductance amplifier circuit and the reference voltage are input, and which outputs a second control signal to the second transconductance amplifier circuit so as to make a D.C. voltage level of a differential output voltage of the second transconductance amplifier circuit equal to the reference voltage; a voltage supply circuit for supplying, as the reference voltage, a voltage which is hardly affected by the power source voltage to the first and second common-mode feedback circuits; and a first capacitor; a second capacitor; and a third capacitor, wherein: a noninverting input terminal is connected, via the first capacitor, to (i) a noninverting output section of the first transconductance amplifier circuit and (ii) a noninverting input section of the second transconductance amplifier circuit; an inverting input terminal is connected, via the second capacitor, to (i) an inverting output section of the first transconductance amplifier circuit and (ii) an inverting input section of the second transconductance amplifier circuit; a noninverting output section of the second transconductance amplifier circuit is connected to (i) an inverting input section of the first transconductance amplifier circuit, (ii) a noninverting input section and an inverting output section of the third transconductance amplifier circuit, and (iii) one end of the third capacitor; an inverting output section of the second transconductance amplifier circuit is connected to (i) a noninverting input section of the first transconductance amplifier circuit, (ii) an inverting input section and a noninverting output section of the third transconductance amplifier circuit, and (iii) another end of the third capacitor; the noninverting output section of the third transconductance amplifier circuit serves as an inverting output terminal, the inverting output section of the third transconductance amplifier circuit serves as a noninverting output terminal; the noninverting output section and the inverting output section of the first transconductance amplifier circuit serve as input terminals of the first common-mode feedback circuit; the noninverting output section and the inverting output section of the second transconductance amplifier circuit serve as input terminals of the second common-mode feedback circuit; and the power source voltage is supplied from a power source terminal to each of the circuits.

With the configuration, the bandpass filter circuit of the present invention is able to make a D.C. voltage level of a differential output of the transconductance amplifier circuit equal to the reference voltage. As the reference voltage, a voltage which is hardly affected by the power source voltage is supplied. Thus, power-source noise canceling characteristic is improved. Further, in the transconductance amplifier circuit, the power source voltage is supplied from the power source terminal. Therefore, the dynamic range is not reduced by much. Thus, it is possible to provide a bandpass filter circuit whose power-source noise canceling characteristic is improved while its dynamic range is kept from being decreased.

In order to achieve the foregoing object, a bandpass filter circuit of the present invention includes: a first transconductance amplifier circuit for converting a differential input voltage into a differential output current; a second transconductance amplifier circuit for converting a differential input voltage into a differential output current; a first common-mode feedback circuit to which a differential output voltage of the first transconductance amplifier circuit and a reference voltage are input, and which outputs a first control signal to the first transconductance amplifier circuit so as to make a D.C. voltage level of a differential output voltage of the first transconductance amplifier circuit equal to the reference voltage; a second common-mode feedback circuit to which a differential output voltage of the second transconductance amplifier circuit and the reference voltage are input, and which outputs a second control signal to the second transconductance amplifier circuit so as to make a D.C. voltage level of a differential output voltage of the second transconductance amplifier circuit equal to the reference voltage; a voltage supply circuit for supplying, as the reference voltage, a voltage which is hardly affected by the power source voltage to the first and second common-mode feedback circuits; and a first capacitor; a second capacitor; and a third capacitor, wherein: the first transconductance amplifier circuit includes a first output section and a second output section; a noninverting input terminal is connected, via the first capacitor, to (i) a noninverting output section in the first output section of the first transconductance amplifier circuit and (ii) a noninverting input section of the second transconductance amplifier circuit; an inverting input terminal is connected, via the second capacitor, to (i) an inverting output section in the first output section of the first transconductance amplifier circuit and (ii) an inverting input section of the second transconductance amplifier circuit; a noninverting output section of the second transconductance amplifier circuit is connected to (i) an inverting input section of the first transconductance amplifier circuit, (ii) an inverting output section in the second output section of the first transconductance amplifier circuit, and (iii) one end of the third capacitor; an inverting output section of the second transconductance amplifier circuit is connected to (i) a noninverting input section of the first transconductance amplifier circuit, (ii) a noninverting output section in the second output section of the first transconductance amplifier circuit, and (iii) another end of the third capacitor; the noninverting output section of the second transconductance amplifier circuit serves as a noninverting output terminal, and the inverting output section of the second transconductance amplifier circuit serves as an inverting output terminal; the noninverting output section and the inverting output section in the first output section of the first transconductance amplifier circuit serve as input terminals of the first common-mode feedback circuit; the noninverting output section and the inverting output section of the second transconductance amplifier circuit serve as input terminals of the second common-mode feedback circuit; and the power source voltage is supplied from a power source terminal to each of the circuits.

With the configuration, the bandpass filter circuit of the present invention is able to make a D.C. voltage level of a differential output of the transconductance amplifier circuit equal to the reference voltage. As the reference voltage, a voltage which is hardly affected by the power source voltage is supplied. Thus, power-source noise canceling characteristic is improved. Further, in the transconductance amplifier circuit, the power source voltage is supplied from the power source terminal. Therefore, the dynamic range is not reduced by much. Thus, it is possible to provide a bandpass filter circuit whose power-source noise canceling characteristic is improved while its dynamic range is kept from being decreased.

Further, in the bandpass filter circuit of the present invention, the first and the third transconductance amplifier circuits of the foregoing bandpass filter circuit having the first to third transconductance amplifier circuits are realized with a single transconductance amplifier. It is therefore possible to simplify the circuit configuration, and cut down the costs.

In order to achieve the foregoing object, an infrared signal processing circuit of the present invention includes any one of the foregoing bandpass filter circuits.

In the configuration, the infrared signal processing circuit of the present invention includes any one of the foregoing bandpass filter circuits. Therefore, the power-source noise canceling characteristic is improved while the dynamic range is kept from being decreased. Thus, it is possible to provide an infrared signal processing circuit whose power-source noise canceling characteristic is improved while its dynamic range is kept from being decreased.

In order to achieve the foregoing object, an infrared signal processing circuit of the present invention includes: a photo-acceptance element for converting an infrared signal received into an electric signal; an amplifying circuit for amplifying the electric signal; the bandpass filter as set forth in claim 10 for extracting a carrier frequency component from the electric signal amplified; and a carrier detection circuit including (I) a first comparing circuit which compares an output signal of the bandpass filter with a first threshold voltage whose level is a noise detection level, (II) a second comparing circuit which compares the output signal of the bandpass filter with a second threshold voltage whose level is higher than the first threshold voltage and is a first carrier detection level, (III) a third comparing circuit which compares the output signal of the bandpass filter with a third threshold voltage whose level is higher than the second threshold voltage and is a peak detection level for judging the output signal of the band pass filter and a level of the output signal, (IV) a logic circuit which (i) controls a gain of the amplifying circuit based on an output signal of the first comparing circuit so that the output signal of the first comparing circuit is not output, and (ii) controls the gain and Q-value of the bandpass filter circuit based on an output signal of the third comparing circuit so that the output signal of the third comparing circuit is not output, the carrier detection circuit outputting as a carrier an output signal of the second comparing circuit.

The infrared signal processing circuit of the present invention having the above configuration is provided with the foregoing bandpass filter circuit. Therefore, the power-source noise canceling characteristic is improved while the dynamic range is kept from being decreased. Thus, it is possible to provide an infrared signal processing circuit whose power-source noise canceling characteristic is improved while its dynamic range is kept from being decreased.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 11(*b*) is a diagram showing an operation of the comparator.

FIG. 11(*c*) is a diagram showing an operation of the comparator.

FIG. 12(*b*) is a diagram showing an operation of the oscillation circuit.

FIG. 15(*c*) is a diagram showing an operation of the D flip-flop

FIG. 22(b) is a diagram for explaining the stability of the BPF and distortion in the waveform of an output, and is showing the waveform of an output signal from the BPF.

DESCRIPTION OF THE EMBODIMENTS

Embodiment 1

Figure 1:
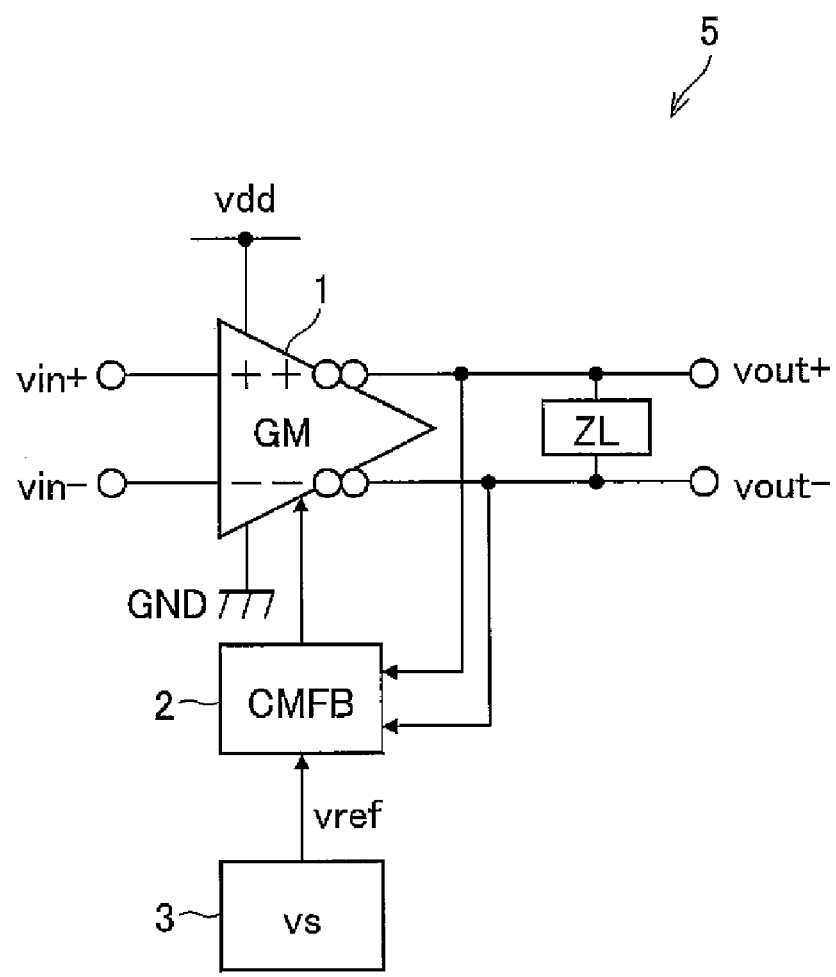
FIG. 1 is a diagram showing a configuration of an operational amplifier circuit of one embodiment.
Figure 2:
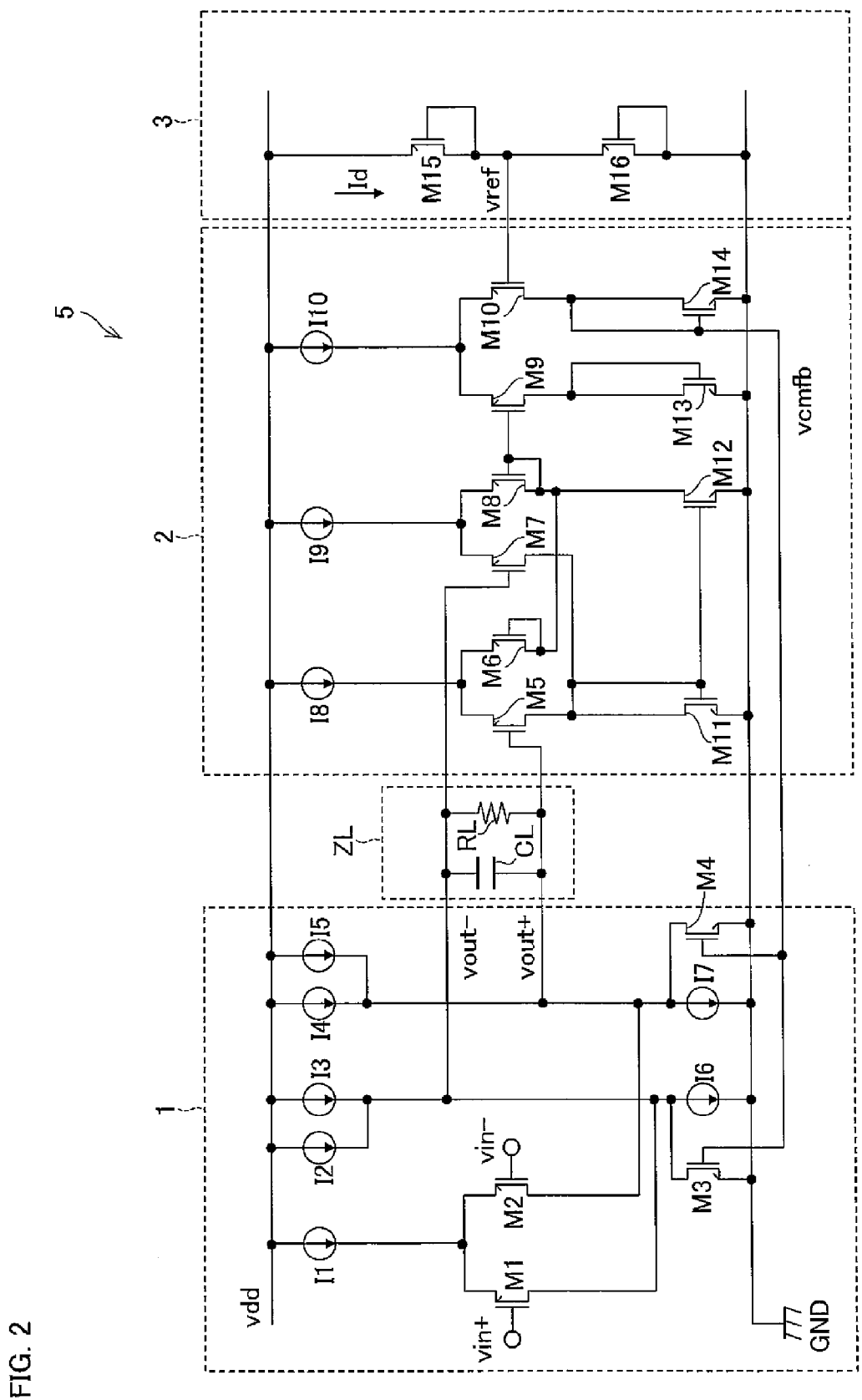
FIG. 2 is a diagram showing a specific configuration of the operational amplifier circuit.
Figure 3:
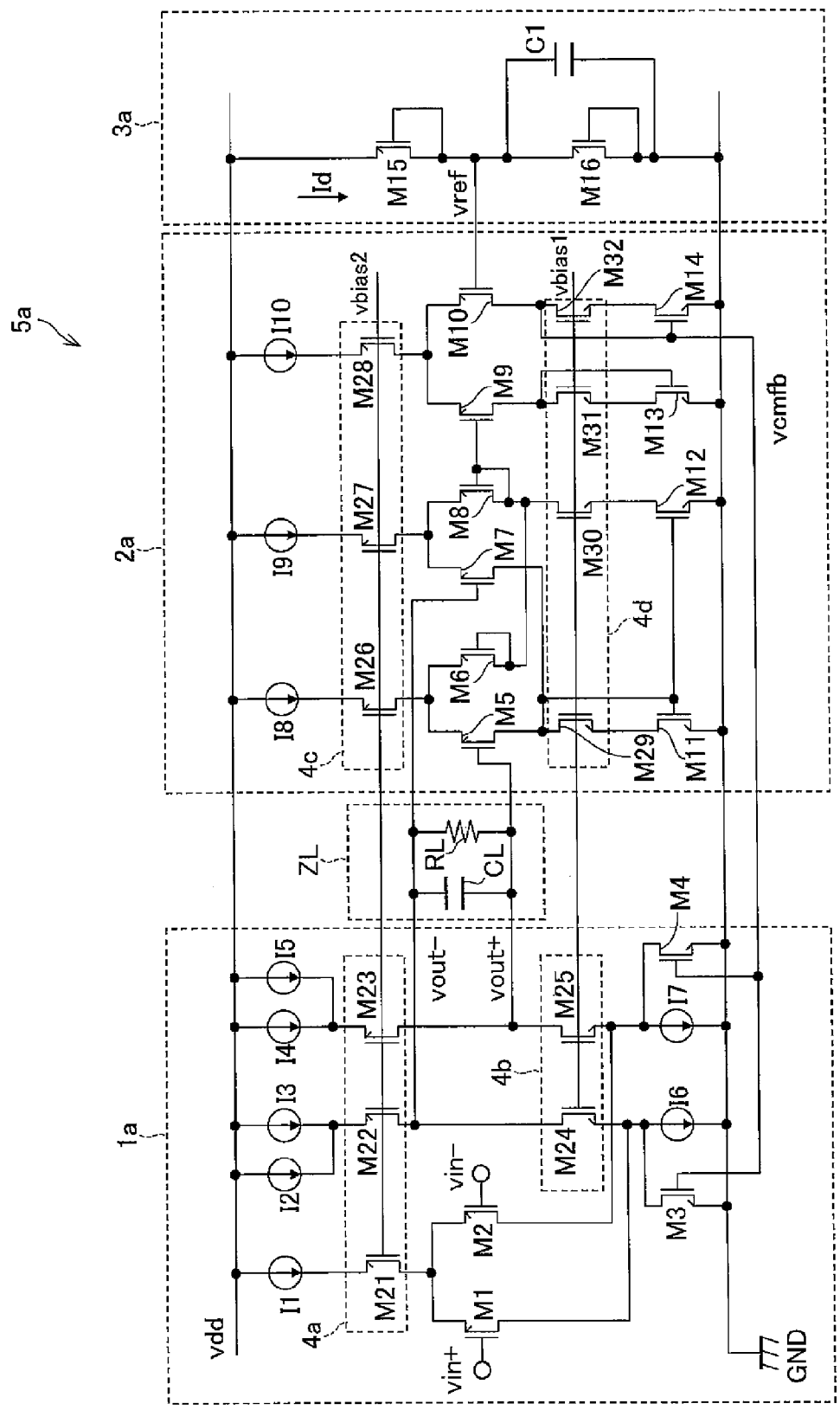
FIG. 3 is a diagram showing a specific configuration of an alternative form of the operational amplifier circuit.

The following describes an embodiment of the present embodiment with reference to FIG. 1 to FIG. 3.

FIG. 1 shows a configuration of an operational amplifier circuit 5.

The operational amplifier circuit 5 includes: a transconductance amplifier circuit (hereinafter simply referred to as GM) 1 which converts a differential input voltage into a differential output current; an output load ZL to which a differential output voltage of the GM1 is applied and which constitutes an output terminal of the operational amplifier circuit 5; a common-mode feedback circuit (hereinafter simply referred to as CMFB) 2 to which the differential output voltage of the GM1 and a reference voltage vref are input, and which outputs a control signal to the GM1 so that a D.C. voltage level of the differential output voltage of the GM1 equals the reference voltage vref; and a voltage supply circuit (VS) 3 which supplies the reference voltage vref to the CMFB2. An input terminal of the operational amplifier circuit 5 includes a non-inverting and an inverting input section of the GM1.

The gain Av of the operational amplifier circuit 5 is:

$$Av = (vout^+ - vout^-)/(vin^+ - vin^-) = gm * ZL$$

Where:

$vin^+$ and $vin^-$ are differential input voltages of the operational amplifier circuit 5;

$vout^+$ and $vout^-$ are differential output voltages of the operational amplifier circuit 5;

gm is a transconductance of the GM1; and

ZL is a load impedance.

FIG. 2 shows a specific configuration of the operational amplifier circuit 5. The operational amplifier circuit 5 can be constituted through a CMOS (Complementary Metal Oxide Semiconductor) process.

The GM1 includes: P-channel MOS transistors M1 and M2; N-channel MOS transistors M3 and M4; and constant current sources I1 to I7.

One end of the constant current source I3 is connected to the power source terminal. Another end of the constant current source I3 is connected to one end of the constant current source I6. Another end of the constant current source I6 is connected to a GND terminal. The constant current source I3 and the constant current source I2 are connected in parallel to each other. The constant current source I6 and the transistor M3 are connected in parallel to each other. One end of the constant current source I4 is connected to the power source terminal. Another end of the constant current source I4 is connected to one end of the constant current source I7. Another end of the constant current source I7 is connected to the GND terminal. The constant current source I4 and the constant current source I5 are connected in parallel to each other. The constant current source I7 and the transistor M4 are connected in parallel to each other.

The drain of the transistor M3 is connected to the drain of the transistor M1. The drain of the M4 is connected to the drain of the transistor M2. The sources of the transistors M1 and M2 are connected to each other, and are connected to the power source terminal via the constant current source I1. The gate of the transistor M1 serves as a noninverting input terminal, and a differential voltage $vin^+$ is input thereto. The gate of the transistor M2 serves as an inverting input terminal, and a differential voltage $vin^-$ is input thereto.

A connection point between the drain of the transistor M3 and the other end of the constant current source T3 serves as an output terminal of the GM1, and is connected to one end of the capacitor CL serving as the output load ZL. A connection point between the drain of the transistor M4 and the other end of the constant current source I4 serves as another output terminal of the GM1, and another end of the capacitor CL is connected thereto. To the capacitor CL, connected in parallel is a resistor RL which serves as an output load ZL.

The CMFB2 includes: P-channel MOS transistors MS to M10; N-channel MOS transistors M11 to M14; and constant current sources I8 to I10.

The sources of the transistors M5 and M6 are connected to each other, and are connected to the power source terminal via the constant current source I8. The sources of the transistors M7 and M8 are connected to each other, and are connected to the power source terminal via the constant current source I9. The sources of the transistors M9 and M10 are connected to each other, and are connected to the power source terminal via the constant current source I10.

The drain of the transistor M5 is connected to the drain of the transistor M11. The drain of the transistor M6 is connected to its gate and the drain of the transistor M8. The drain of the transistor M7 is connected to the drain of the transistor M5, and the gate of the transistor M11. The drain of the transistor M8 is connected to its gate and the drain of the transistor M12. The gates of the transistors M11 and M12 are connected to each other. The sources of the transistors M11 and M12 are connected to the GND terminal.

The gate of the transistor M9 is connected to the gate of the transistor M8. The drain of the transistor M9 is connected to the drain and gate of the transistor M13. The drain of the transistor M10 is connected to the drain and the gate of the transistor M14. The sources of the transistors M13 and M 14 are connected to the GND terminal.

The gate of the transistor M5 serves as an input terminal of the CMFB2, and is connected to one end of the resistor RL (to the connection point between the drain of the transistor M4 and the other end of the constant current source I4, and the connection point at which the other end of the capacitor CL is connected). The gate of the transistor M7 serves as another input terminal of the CMFB2, and is connected to another end of the resistor RL (to the connection point between the drain of the transistor M3 and the other end of the constant current source I3, and the connection point at which that one end of the capacitor CL is connected). The drain of the transistor M14 is connected to the gates of the transistors M3 and M4 in the GM1.

The voltage supply circuit 3 includes P-channel MOS transistors M15 and M16 (first and second MOS transistors).

The source of the transistor M15 is connected to the power source terminal. The gate and drain of the transistor M15 are connected to each other, and are connected to the source of the transistor M16. The gate and drain of the transistor M16 are connected to each other, and are connected to the GND terminal.

The gate of the transistor M10 in the CMFB2 is connected to a connection point between (i) the source of the transistor M16 and (ii) a connection point between the gate and drain of the transistor M15.

The reference voltage vref is acquired from the connection point between (i) the source of the transistor M16 and (ii) the connection point between the gate and drain of the transistor M15 of the constant voltage circuit 3. This reference voltage vref is input to the gate of the transistor M10 of the CMFB2. That way, a control voltage vcmfb (control signal) is acquired from the drain of the transistor M14 of the CMFB2, and is input to the gates of the transistors M3 and M4 of the GM1. Thus, the D.C. voltage level of a differential output of the GM1 equals the reference voltage vref.

Here, the reference voltage vref of the voltage supply circuit 3 is expressed by the following Formula (3) corresponding to the above Formula (1).

Since a current (Id) flowing in the transistor M15 and that flows in the transistor M16 equals each other, $$Id = (1/2)*\mu p*Cox*(W1/L1)*(vgs1-vth)^2 = \quad (3)$$
$$(1/2)*\mu p*Cox*(W2/L2)*(vgs2-vth)^2.$$

Thus, $$vgs1 = vth + ((W2/L2)/(W1/L1)^{1/2})*(vgs2-vth).$$

Since $$vdd = vgs1 + vgs2, =$$
$$vth + ((W2/L2)/(W1/L1)^{1/2})*(vgs2-vth)+vgs2.$$

Since $$vref = vgs2, = \{(W1/L1)^{1/2}/((W2/L2)^{1/2}+(W1/L1)^{1/2})\}*vdd +$$
$$\{((W2/L2)^{1/2}-(W1/L1)^{1/2})((W2/L2)^{1/2}+(W1/L1)^{1/2})\}*vth,$$

where:
Id is a drain current;
$\mu p$ is the mobility of electrons;
Cox is an oxidized film capacitance;
W is a channel width;
L is a channel length;
W1/L1 is a W/L ratio of the transistor M15;
W2/L2 is a W/L ratio of the transistor M16;
vgs1 is a gate-source voltage of the transistor M15;
vgs2 is a gate-source voltage of the transistor M16; and
vth is a threshold voltage.

Here, for example, supposing that W1=W2=W L1=9*L2=9*L,

The Formula (3) is:

$$vref=(1/4)*vdd+(1/2)*vth \quad (4).$$

Supposing that vdd=3V and vth=0.8V in the Formula (4) (corresponding to the formula (2)), vref=1.15V.

At this point, the power source noise is (¼), and a resulting power-source noise canceling characteristic is −12 dB.

As described, with the voltage supply circuit 3, the reference voltage vref which is hardly affected by the power source voltage (i.e., power source noise is cancelled) is acquired. With the reference voltage vref, the D.C. voltage level of the differential output of the GM1 in the operational amplifier circuit 5 is set. Thus, the power-source noise canceling characteristic of the operational amplifier circuit 5 is improved.

Further, in the operational amplifier circuit 5, the power source voltage of the GM1 is the power source voltage vdd supplied from the power source terminal. Therefore, the dynamic range is not reduced.

Further, in the operational amplifier circuit 5, the GM1 adopts a full-differential configuration. Therefore, in-phase inputs are canceled, and it is possible to cancel in-phase power source noise even if such noise is directly superimposed on an input.

Further, in the voltage supply circuit 3, the reference voltage vref is acquired with a simple configuration using two MOS transistors.

FIG. 3 shows a configuration of an operational amplifier circuit 5a which is an alternative form of the operational amplifier circuit 5.

As shown in the figure, the operational amplifier circuit 5a includes: a GM1a, CMFB2a, a constant voltage circuit 3a, and an output load ZL.

As shown in the figure, GM1a has a configuration of the GM1 shown in FIG. 2. Additionally, the GM1 includes: a cascode circuit 4a having P-channel MOS transistors M21 to M23; and a cascode circuit 4b having N-channel MOS transistors M24 and M25.

The transistor M21 is connected to a point between (i) a connection point between sources of the transistors M1 and M2 and (ii) constant current source I1. The transistor M22 is connected to a point between (i) a connection point between the drain of the transistor M1 and that one end of the constant current source I6 and (ii) the constant current source I3. The transistor M23 is connected to a point between (i) a connection point between the drain of the transistor M2 and the other end of the constant current source I4 and (ii) the constant current source I4. The transistor M24 is connected between the drains of the transistors M1 and M22. The transistor M25 is connected between the drains of the transistors M2 and M23.

The CMFB2 has the configuration of the CMFB2 shown in FIG. 2) and further includes: a cascode circuit 4c having P-channel MOS transistors M26 to M28; and a cascode circuit 4d having N-channel MOS transistors M29 to M32.

The transistor M 26 is connected between (i) a connection point between sources of the transistors M5 and M6 and (ii) the constant current source I8. The transistor M 27 is connected between (i) a connection point between sources of the transistors M7 and M8 and (ii) the constant current source I9. The transistor M 28 is connected between (i) a connection point between sources of the transistors M9 and M10 and (ii) the constant current source I10.

The transistor M29 is connected between (i) a connection point between the drains of the transistor M5 and M7 and (ii) the drain of the transistor M11. The transistor M30 is connected between (i) a connection point between the drains of the transistor M6 and M8 and (ii) the drain of the transistor M12. The transistor M31 is connected between (i) a connection point between the drain of the transistor M9 and the gate of the transistor M13 and (ii) the drain of the transistor M13. The transistor M32 is connected between (i) a connection point between the drain of the transistor M10 and the gate of the transistor M14 and (ii) the drain of the transistor M14.

The gates of the transistors of the cascode circuits 4a and 4c are connected to one another, and bias voltage vbias 2 is input thereto. The gates of the transistors of the cascode circuits 4b and 4d are connected to one another, and bias voltage vbias 1 is input thereto.

As described, the GM1a and the CMFB 2a includes cascode circuits. Therefore, the bandwidths of the GM1a and the CMFB 2a cover a broader bandwidth.

For example, where ro1 is an output impedance of the the constant current source of a CMFB2a without the cascode circuits 4c and 4d, an output impedance ro2 of the constant current source of the CMFB2a having the cascode circuits 4c and 4d is:

$$ro2 = gmc*roc*ro1 \quad (5)$$

where:

gmc is a transconductance of the transistor of the cascode circuits 4c and 4d; and roc is an output impedance of the transistor of the cascode circuits 4c and 4d.

With the provision of the cascode circuits as shown in the Formula (5), the output impedance of the constant current source is made larger than a case where no cascode circuit is provided. Accordingly, a broader bandwidth can be covered.

Next, the voltage supply circuit 3a has the configuration of the voltage supply circuit 3 shown in FIG. 2, and further includes a capacitor C1 (capacitor, fourth capacitor) which is provided in parallel to the transistor M16. A reference voltage Vrefa of the constant voltage circuit 3a is expressed by the Formula (3) indicating the reference voltage vref of the constant voltage circuit 3. Thus, it is possible to acquire a voltage which is hardly affected by the power source voltage: i.e., a voltage from which the power source noise is cancelled.

Further, since the voltage supply circuit 3a has the capacitor C1, it is possible to configure a lowpass filter.

A parallel-connected impedance of the transistor M16 and the capacitor C1 is:

$$(1/gm2) // (1/(s*C1)) = 1/(s*C1 + gm2).$$

Since the reference voltage Vrefa is a value resulted by dividing the power source voltage vdd by (i) an impedance of the transistor M15, and (ii) a parallel-connected impedance of the transistor M16 and the capacitor C1, $$\begin{aligned}vrefa = \\ vdd*(1/gm2)//(1/(s*C1))/((1/GM1) + (1/gm2)//(1/(s*C1))) = \\ vdd*(1/(s*C1+gm2))/((1/GM1) + 1/(s*C1+gm2)).\end{aligned}$$

By sorting this:

$$vrefa = (GM1/C1)/(s + (1/C1)*(1/((1/GM1)//(1/gm2)))).$$

Thus, it is possible to acquire a lowpass filter whose time constant is $C1*((1/GM1)//(1/gm2))$, where:

GM1 is a transconductance of the transistor M15, and is $\mu p * Cox * (W1/L1) * (vgs1 - Vth)$;

gm2 is a transconductance of the transistor M16, $\mu p * Cox * (W2/L2) * (Vgs2 - Vth)$.

As described, since the voltage supply circuit 3a includes the lowpass filter, it is capable of canceling the power source noise, even if the noise is high frequency noise.

As mentioned above, the operational amplifier circuit of the present invention including the GM and the CMFB is capable of making the D.C. voltage level of a differential output voltage of the GM equal to the reference voltage vref. Further, as the reference voltage vref, a voltage hardly affected by the power source voltage is supplied. That way, power source noise is canceled. Further, with the power source voltage for the GM supplied from the power source terminal, the dynamic range is ensured.

Embodiment 2

An embodiment of the present invention is described below with reference to FIG. 4 to FIG. 7.

Figure 4:
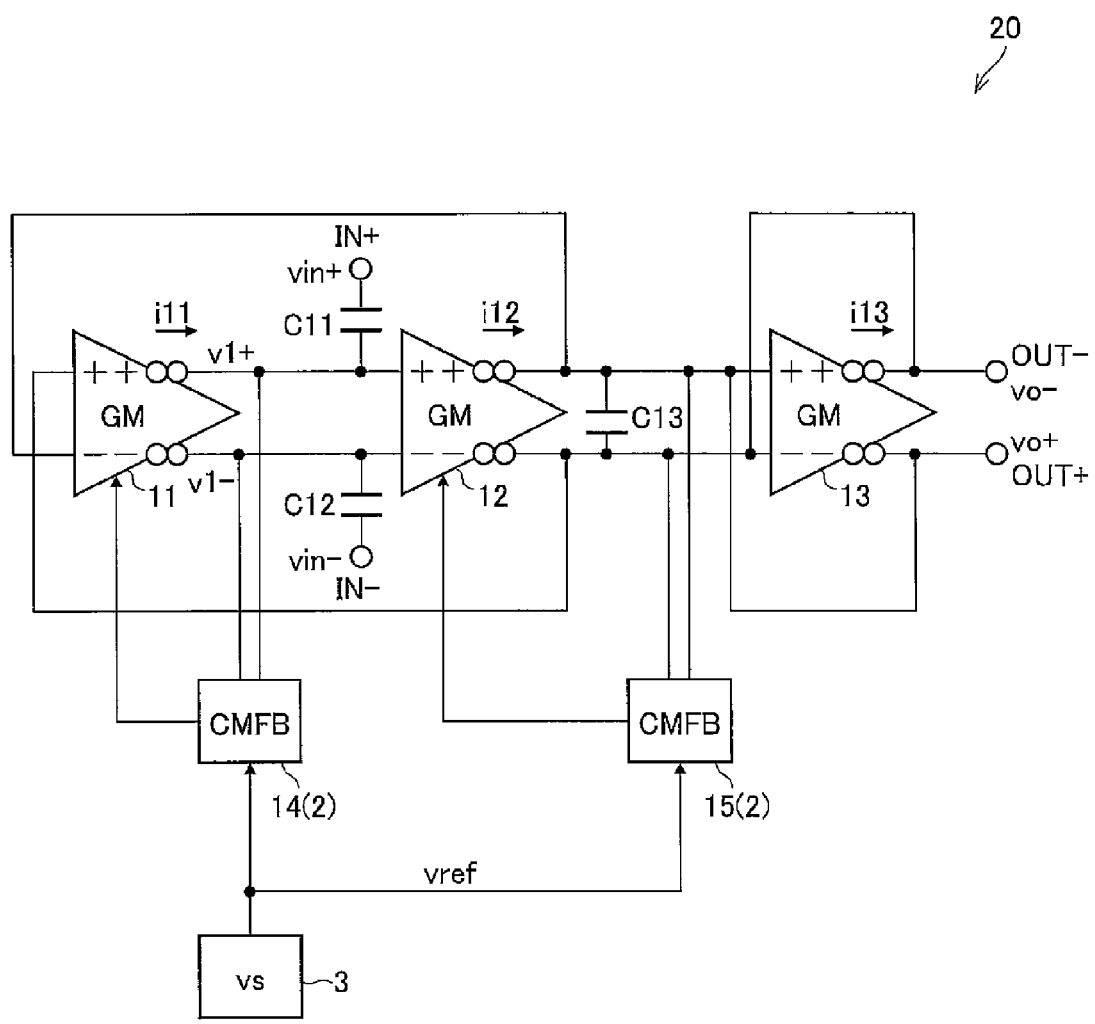
FIG. 4 is a diagram showing a configuration of a bandpass filter of another embodiment.

FIG. 4 shows a configuration of a bandpass filter circuit (hereinafter BPF) 20.

The BPF 20 is a full-differential bandpass filter circuit including: transconductance amplifier circuits (hereinafter, simply referred to as GMs) 11 to 13 (first to third transconductance amplifier circuits) for converting a differential input voltage into a differential output current; common-mode feedback circuits (hereinafter, simply referred to as CMFBs) 14 and 15 (first and second common-mode feedback circuits); capacitors C11 to C13 (first capacitor to third capacitor); and a voltage supply circuit 3 of the foregoing Embodiment 1. Hereafter, the GM11 to GM13 are sometimes referred to as GM, collectively. Further, no explanation for the voltage supply circuit 3 is provided here, as it is already explained in Embodiment 1.

A noninverting output section of the GM11 is connected to a noninverting input section of the GM12, and an inverting output section of the GM11 is connected to an inverting input section of the GM12. A noninverting output section of the GM12 is connected to a noninverting input section of the GM13, and an inverting output section of the GM12 is connected to an inverting input section of the GM13.

Further, the noninverting output section of the GM12 is connected to an inverting input section of the GM11, and the inverting output section of the GM12 is connected to a noninverting input section of the GM11. Further, the noninverting output section and inverting output section of the GM12 are connected in parallel to the capacitor C13. Further, the noninverting output section of the GM12 is connected to an inverting output section of the GM13, and the inverting output section of the GM12 is connected to a noninverting output section of the GM13.

A noninverting input terminal IN+ of the BPF 20 is connected to a connection point between the noninverting output section of the GM11 and the noninverting input section of the GM12, via the capacitor C11. An inverting input terminal IN− of the BPF 20 is connected to a connection point between the inverting output section of the GM11 and the inverting input section of the GM12, via the capacitor C12. A noninverting output terminal OUT+ of the BPF 20 serves as the inverting output section of the GM13, and the inverting output terminal OUT− of the BPF 20 serves as the noninverting output section of the GM13.

The CMFB14 has input terminals which are the noninverting and inverting output sections of the GM11. Through the input terminals, the GMFB14 receives (i) a differential output voltage of the GM11 and (ii) the reference voltage vref, which is hardly affected by the power source voltage (i.e., power source noise is cancelled), from the voltage supply circuit 3. The CMFB14 outputs a first control signal to the GM11 so that the D.C. voltage level of a differential output voltage of the GM11 equals the reference voltage vref. The CMFB15 has input terminals which are the noninverting and inverting output sections of the GM12. Through the terminals, the CMFB15 receives (i) a differential output voltage from the GM12, and the reference voltage vref from the voltage supply circuit 3. The CMFB15 outputs a second control signal to the GM12 so that the D.C. voltage level of the differential output voltage of the GM12 equals the reference voltage vref. A specific configuration of the CMFBs 14 and 15 are the same as that of the CMFB2 (see FIG. 2) described in the foregoing Embodiment 1, and therefore no further explanation is provided here.

Figure 5:
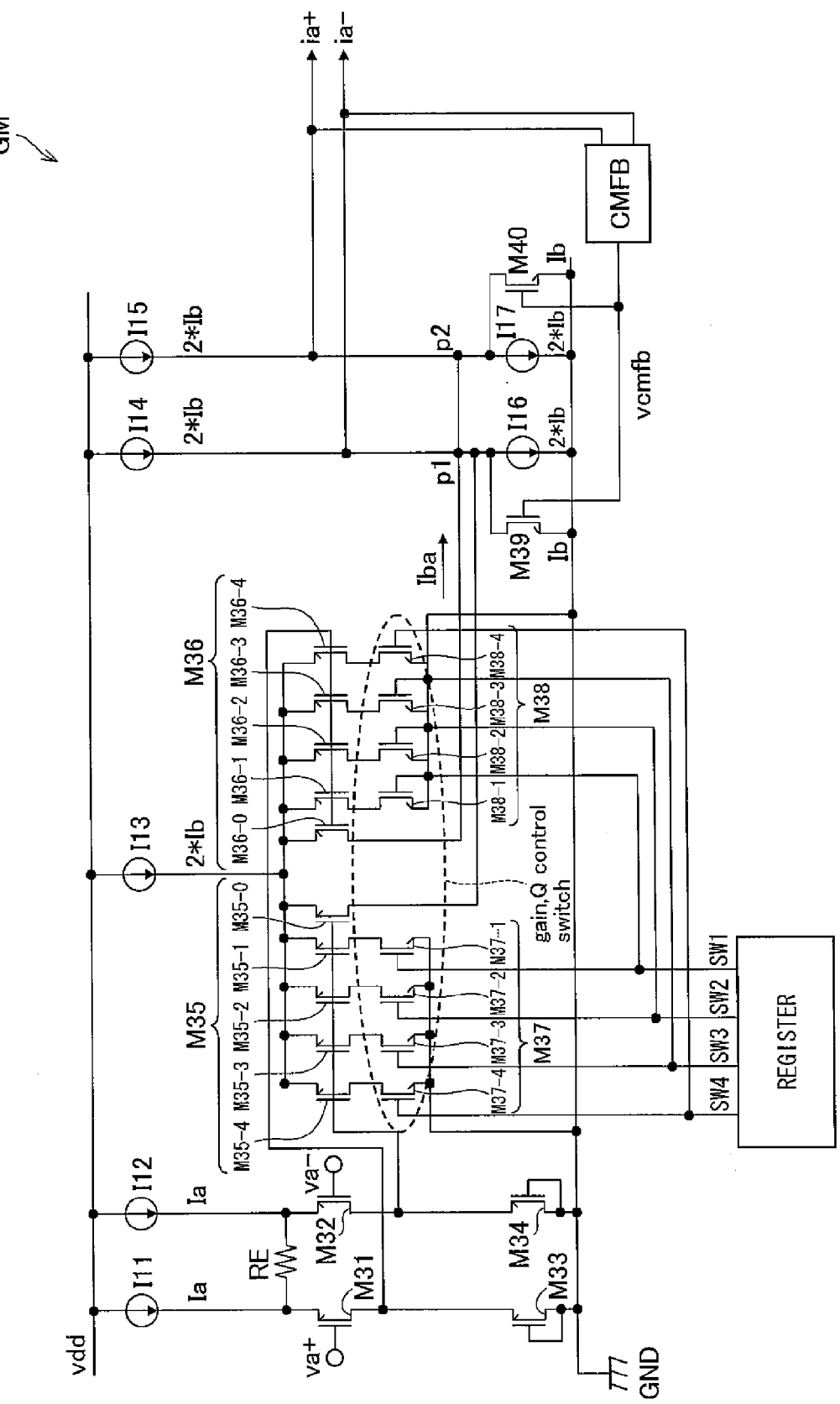
FIG. 5 is a diagram showing a specific configuration of a transconductance amplifier circuit provided in the bandpass filter circuit.

FIG. 5 shows a specific configuration of the GM.

The GM includes: P-channel MOS transistors M31 to M36, N-channel MOS transistors M37 to M40, current sources I11 to I22, and a resistor RE.

The source of the transistor M31 is connected to a power source terminal via the current source I1. The source of the transistor M32 is connected to the power source terminal via the current source I12. The resistor RE is connected to: a connection point between the source of the transistor M31 and the current source I11; and a connection point between the source of the transistor M32 and the current source I12. The drain of the transistor M31 is connected to the source of the transistor M33, and the drain of the transistor M32 is connected to the source of the transistor M34. The gate and the drain of the transistor M33 are connected to each other, and are connected to a GND terminal. The gate and the drain of the transistor M34 are connected to each other and are connected to the GND terminal. The gate of the transistor M31 serves as a noninverting input section, and the gate of the transistor M32 serves as an inverting input section.

The transistor M35 is a group of transistors including transistors M35-0 to M35-4 whose gates are connected to one another and whose sources are connected to one another. The transistor M36 is a group of transistors including transistors M36-0 to M36-4 whose gates are connected to one another and whose sources are connected to one another. The transistor M37 is a group of transistors including transistors M37-1 to M37-4 whose sources are connected to one another. The transistor M38 is a group of transistors including transistors M38-1 to M38-4 whose sources are connected to one another.

The gates of the transistor M35 (i.e., the respective gates, of the transistors M35-0 to M35-4, which are connected to one another) are connected to the drain of the transistor M32. The gates of the transistor M36 (i.e., the respective gates, of the transistors M36-0 to M36-4, which are connected to one another) are connected to the drain of the transistor M31.

The sources of the transistor M35 (i.e., the respective sources, of the transistors M35-0 to M35-4, which are connected to one another) are connected to the power source terminal via a current source I13. Similarly, the sources of the transistor M36 (i.e., the respective sources, of the transistors M36-0 to M36-4, which are connected to one another) are connected to the power source terminal via the current source I13.

The drain of the transistor M5-1 is connected to the drain of the transistor M7-1. The drain of the transistor M5-2 is connected to the drain of the transistor M7-4. The drain of the transistor M5-3 is connected to the drain of the transistor M7-3. The drain of the transistor M5-4 is connected to the drain of the transistor M7-4. The respective sources of the transistors M7-1 to M7-4 are connected to the GND terminal.

The drain of the transistor M36-1 is connected to the drain of the transistor M38-1. The drain of the transistor M36-2 is connected to the drain of the transistor M38-2. The drain of the transistor M36-3 is connected to the drain of the transistor M38-3. The drain of the transistor M36-4 is connected to the drain of the transistor M38-4. The respective sources of the transistors M38-1 to M38-4 are connected to the GND terminal.

An adjustment signal SW1 from the register is input to the respective gates of the transistors M37-1 and M38-1. An adjustment signal SW2 from the register is input to the respective gates of the transistors M37-2 and M38-2. An adjustment signal SW3 from the register is input to the respective gates of the transistors M37-3 and M58-3. An adjustment signal SW4 from the register is input to the respective gates of the transistors M37-4 and M38-4.

One end of a current source I14 is connected to the power source terminal. Another end of the current source I14 is connected to one end of a current source I16. Another end of the current source I16 is connected to the GND terminal. The transistor M39 is parallel-connected to the current source I16. One end of a current source I15 is connected to the power source terminal. Another end of the current source I15 is connected to one end of a current source I22. Another end of the current source I22 is connected to the GND terminal. The transistor M40 is parallel-connected to the current source I22.

The drain of the transistor M39 is connected to the drain of the transistor M35-0. The drain of the transistor M40 is connected to the drain of the transistor M36-0. Here, it is supposed that p1 is a connection point between the drain of the transistor M39 and the drain of the transistor M35-0, and that P2 is a connection point between the drain of the transistor M40 and the drain of the transistor M36-0. The connection point p1 serves as an inverting output section. The connection point p2 serves as a noninverting output section. The connection points p1 and p2 also serve as input terminals of the CMFB, and a control voltages vcmfb (first and second control signals) are input from the CMFB to the gates of the transistors M39 and M40. Thus, the D.C. voltage level of a differential output of the GM equals the reference voltage vref. Here, FIG. 5 shows a configuration of the GMs 11 and 12. The GM13 has a configuration which is basically the same as those of the GMs 11 and 12. However, the GM13 does not include transistors M39 and M40, and is not connected to the CMFB.

The BPF20 is hardly affected by the power source voltage from the voltage supply circuit 3, as in the case of the operational amplifier circuit 5 of the Embodiment 1. That is, in the BPF 20, the reference voltage vref from which power source noise has been canceled is supplied. Using this reference voltage vref, the respective D.C. voltage levels of differential output voltages from the GMs 11 and 12 are set. Thus, the power-source noise canceling characteristic of the BPF 20 is improved.

Further, in the BPF20, the power source voltages of the GMs 11 and 12 are a power source voltage vdd supplied from the power source terminal. Therefore, the dynamic range is not reduced.

Further, by adopting a full-differential bandpass filter circuit as the BPF 20, in-phase inputs are canceled. Therefore, it is possible to cancel power source noise even if such noise is superimposed on an input.

The transfer function H(s) of the BPF 20 having a configuration as described above is expressed by the following Formula (6). Further, the constants (i.e., natural angular frequency ω0, Q-value, and gain H) of the BPF 20 are respectively expressed by the Formulas (7) to (9).

According to Kirchhoff's law, an output of the noninverting output section of the GM11 is $gm11*(-vo-vo)=s*C11*(v1-vin)$, and an output of the inverting output section of the GM11

$-gm11*(-vo-vo)=s*C11*(-v1-(-vin))$.

Thus, the output of the noninverting output section and that of the inverting output section are equal to each other.

Further, an output of the noninverting output section of the GM12 is $$GM12*(v1-(-v1))-GM13*(vo-(-vo))=s*C13*(vo-(-vo)), \text{ and}$$

an output of the inverting output section of the GM12 is $$-GM12*(v1-(-v1))+GM13*vo-(-vo))=s*C13*(-vo-(vo))$$

Thus, the output of the noninverting output section and that of the inverting output section are equal to each other.

v1 is eliminated from the above formulas, and since H(s)=vo/vin, $$H(s) = \{(GM12/C13)*s\}/ \qquad (6)$$
$$\{s^2 + (GM13/C13)*s + ((gm11*GM12)/((C11/2)*C13))\}$$

$$\omega0 = ((gm11*GM12)/((C11/2)*C13))^{1/2} = gm/C \qquad (7)$$

$$Q = ((C13/(C11/2))*(gm11*GM12)/(GM13^2))^{1/2} = gm/GM13 \qquad (8)$$

$$H = GM12/GM13 = gm/GM13 \qquad (9)$$

where:
s is a complex number
vin is an input voltage of the BPF 20, and is vin=(vin$^+$)=−(vin$^-$);
vin$^+$ is a voltage input to the noninverting input terminal IN$^+$ of the vin$^+$;
vin$^-$ is a voltage input to the inverting input terminal IN$^-$ of the vin$^-$;
vo is an output voltage of the BPF 20, and is vo=(vo$^+$)=−(vo$^-$);
vo$^+$ is a voltage output from the noninverting output terminal OUT$^+$ of the vo$^+$;
vo$^-$ is a voltage output from the inverting output terminal OUT$^-$ of the vo$^-$;
v1 is an output voltage of the GM11, and is v1=(v1$^+$)=−(v1$^-$);
v1$^+$ is a voltage output from the noninverting output section of the v1$^+$;
v1$^-$ is a voltage output from the inverting output section of the v1$^-$;
GM11 is a transconductance of the GM11;
GM12 is a transconductance of the GM12;
GM13 is a transconductance of the GM13;
i11 is an output current of the GM11;
i12 is an output current of the GM12;
i13 is an output current of the GM13;
C11 is a capacitance value of each of the capacitors C11 and C12;
C13 is a capacitance value of the capacitor C13.
Further, gm=gm11=GM12, and

C=C11/2=C13.

From the above Formulas (7) to (9), it is understood that the constants of the BPF 20 are adjusted by adjusting the gm 11, GM12, and GM13. Particularly, by controlling only the GM13, it is possible to adjust the Q-value and the gain H while keeping the natural angular frequency ω0 constant. Further, for example, when GM13=β*gm(0<β<1), Q=1/β and H=1/β. Thus, the Q-value and the gain H are adjusted simply by adjusting the β.

Figure 6:
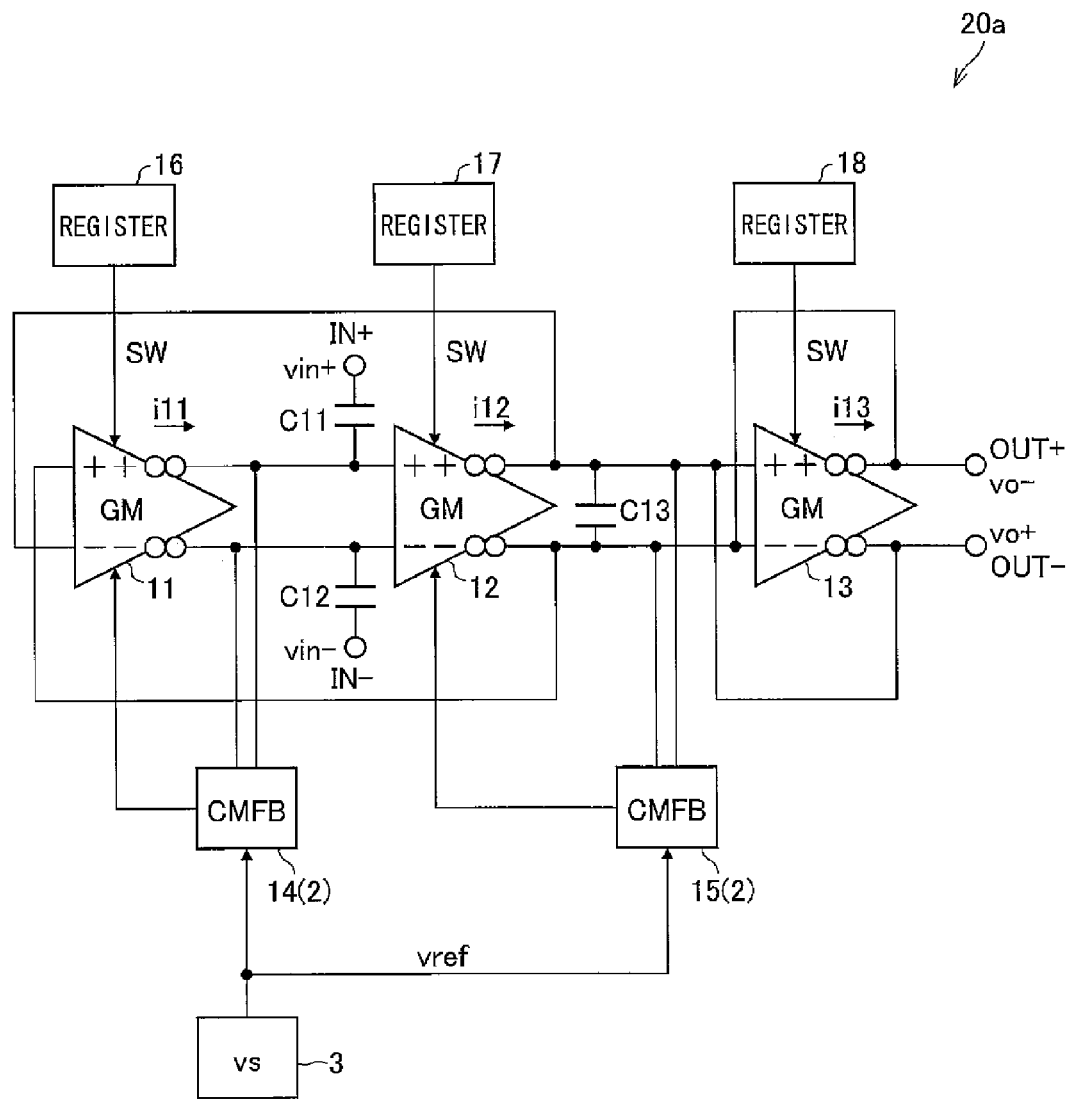
FIG. 6 is a diagram showing a configuration for adjusting the transconductance of the transconductance amplifier circuit.

FIG. 6 shows a BPF 20a having a configuration for adjusting the gm of the GM in the BPF 20.

As shown in the figure, the BPF 20a has registers 16 to 18 (adjusting means) in addition to the configuration shown in FIG. 4. Each of the registers outputs to the associated GM an adjustment signal SW for adjusting the gm in response to an external signal, thereby adjusting gm. That way, the constants of the BPF 20 are adjusted.

The adjustment signal SW from the register 16 adjusts GM11 of the GM11, thereby adjusting the natural angular frequency ω0 and the Q-value of GM11. Similarly, the adjustment signal SW from the register 17 adjusts GM12 of the GM12, thereby adjusting the natural angular frequency ω0, the Q-value, and the gain H of the GM12. The adjustment signal SW from the register 18 adjusts GM13 of the GM13, thereby adjusting the Q-value and the gain H. (See Formulas (7) to (9)).

Figure 7:
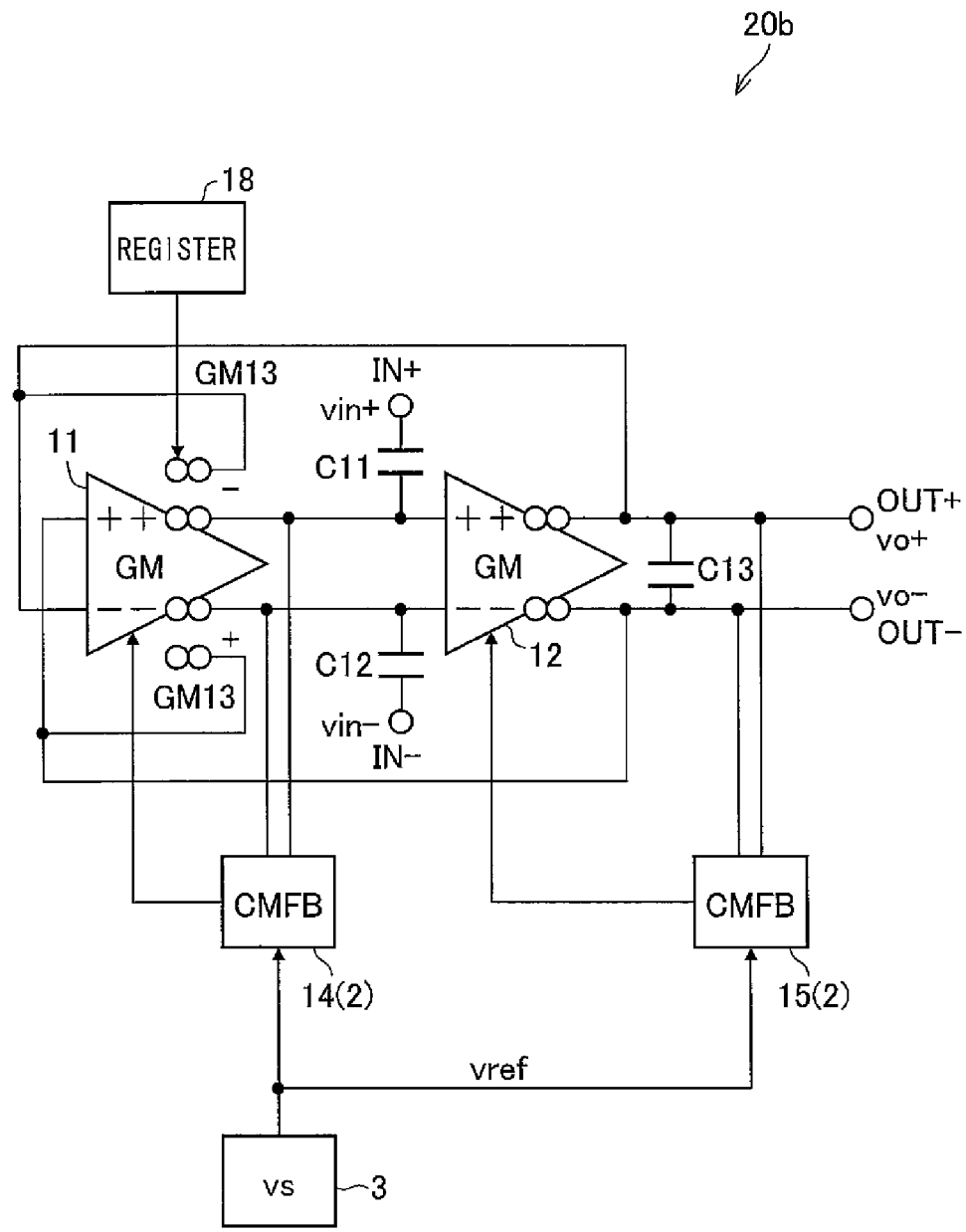
FIG. 7 is a diagram showing another exemplary configuration of the bandpass filter circuit.

FIG. 7 shows a BPF 20b which is an alternative form of the BPF 20. In the BPF 20b, the GM11 and GM13 are realized with a single transconductance amplifier circuit, and the GM11 has first and second output sections.

A noninverting output section in the first output section of the GM11 is connected to a noninverting input section of the GM12, and an inverting output section in the first output section of the GM11 is connected to an inverting input section of the GM12. A noninverting output section of the GM12 is connected to an inverting input section of the GM1, and an inverting output section of the GM12 is connected to a noninverting input section of the GM11. Further, the noninverting output section and the inverting output section of the GM12 are connected to a capacitor C13. Further, the noninverting output section of the GM12 is connected to an inverting output section in the second output section of the GM11, and the inverting output section of the GM12 is connected to a noninverting output section in the second output section of the GM11.

A noninverting input terminal IN$^+$ of the BPF 20b is connected to a connection point between the noninverting output section in the first output section of the GM11 and the noninverting input section of the GM12, via a capacitor C11. An inverting input terminal IN$^-$ of the BPF 20b is connected to a connection point between the inverting output section in the first output section of the GM11 and the inverting input section of the GM12, via the capacitor C12. A noninverting output terminal OUT$^+$ of the BPF 20b serves as the noninverting output section of the GM12, and an inverting output terminal OUT$^-$ of the BPF 20b serves as the inverting output section of the GM12.

The noninverting output section and the inverting output section of the GM11 serve as input terminals of the CMFB 14, to which terminal a differential output voltage of the GM11 and the reference voltage vref are input. The CMFB 14 outputs a first control signal to the GM11 so that a D.C. voltage level of the differential output of the GM11 equals the reference voltage vref. The noninverting output section and the inverting output section of the GM12 serve as input terminals of the CMFB 15, to which terminal a differential output voltage of the GM11 and the reference voltage vref are input. The CMFB 15 outputs a second control signal to the GM12 so that a D.C. voltage level of the differential output of the GM12 equals the reference voltage vref.

With the configuration, in the BPF 20b, the characteristic of canceling power-source noise as is the case of the BPF 20, while avoiding a decrease in the dynamic range. Further, the BPF 20b is able to obtain a transfer function similar to that of the BPF 20. Further, since a full-differential configuration is adopted, constants such as the Q-value can be adjusted, and power source noise superimposed on an input is cancelled. Further, in the BPF 20b, the GM11 and the GM12 are realized with a single transconductance amplifier circuit. This simplifies the circuit configuration, and therefore cutting back of the cost is possible. Further, in a case of providing only the register 18 (for controlling the second output section of the GM11) as shown in the figure, the circuit configuration is further simplified, and further cutting back of the cost is possible. However, it is needless to mention that the configurations shown in FIG. 6 and FIG. 7 are mere examples.

Next described is a specific adjustment method of the gm of the GM.

In the GM having the above-described configuration, the transistors M31 to M36 operate in their weakly inversion regions. A current in each weakly inversion region is expressed by the following Formula (10).

$$Id=(W/L)*Ido*exp(Vgs/(n*Vt)) \quad (10)$$

According to the Formula (10), $$gm=Id/(n*Vt),$$

$$re=(n*Vt)/Ia, \text{ and}$$

$$\Delta I=2*va/(RE+2re),$$

where:
Id is a drain current;
W is a channel width;
L is a channel length;
Ido is a parameter of a current in a weak inversion region; and
Vgs is a gate-source voltage.
Further, $$n=1+Cd/Cox$$

Cd is capacity of depletion layer;
Cox is the capacitance of a gate oxidized film;

$$Vt=k*T/q;$$

k is Boltzmann constant;
T is an absolute temperature;
q is an elementary charge of an electron;
re is a reciprocal of each transconductance of each of the transistors.
Ia is an output current of each of the current sources I11 and I12;
RE is a resistor value of the resistor RE;
ΔI is a current flowing in the resistor RE; and
va is an input voltage of the GM, and is va=(va$^+$)=−(va$^-$).
According to the translinear loop of the transistors M33 to M36, $$Vgs33 + Vgs35 = Vgs34 + Vgs36 \quad (11)$$

$$ia = (Iba/Ia)*\Delta I$$

$$gm = ia/va = 2*(Iba/Ia)/(RE + 2*((n*Vt)/Ia))$$

where:
Iba is a value of a current flowing in each of the transistors M35_0 and M36_0; and
ia is an output current of the GM, and is ia=(ia$^+$)=−(ia$^-$);
gm is adjusted by controlling the current value Iba in the Formula (11). Specifically, the current value Iba is controlled with a register and MOS switches (i.e., transistors M37-1 to M37-4, and transistors M38-1 to M38-4).

For example, the respective W/L ratios of the transistors M35-0 to M35-4, and the transistors M36-0 to M36-4 are set as follows.
Transistors M35-0 and M36-0: (W0/L0)
Transistors M35-1 and M36-1: (W0/L0)
Transistors M35-2 and M36-2: (W0/L0)*$2^1$
Transistors M35-3 and M36-3: (W0/L0)*$3^2$
Transistors M55-4 and M36-4: (W0/L0)*$4^3$ Then, the transistors M37-1 to M37-4 and the transistors M38-1 to M38-4 are switched between on and off, by control signals SW from the register (in this case, SW1 to SW4, supposing that the register is 4 bit register). That way, the current value Iba in each of the transistors M35-0 and M36-0 can be controlled.

Table 1 shows specifically how gm is adjusted. Here, in the case of Table 1, the gm is adjusted by the BPF 20b shown in FIG. 7. As shown in the table, the current value Iba in each of the transistors M35-0 and M36-0 vary according to the control signals SW from the register. With the variation in the current value Iba, the gm is varied. As mentioned above, since a 4-bit register is adopted in this case, gm can be adjusted in 16 different ways. The current value Iba is expressed the following Formula (12).

$$Iba=Ib*(½^m)(m=0 \text{ to } 4) \quad (12)$$

TABLE 1

| SW4, SW3, SW2, SW1 | Iba | gm | Q |
|---|---|---|---|
| 1111 | Ib * (1/16) | gm (Small) | 16 |
| 1110 | Ib * (1/15) | ↓ | 15 |
| 1101 | Ib * (1/14) | ↓ | 14 |
| 1100 | Ib * (1/13) | ↓ | 13 |
| 1011 | Ib * (1/12) | ↓ | 12 |
| 1010 | Ib * (1/11) | ↓ | 11 |
| 1001 | Ib * (1/10) | ↓ | 10 |
| 1000 | Ib * (1/9) | ↓ | 9 |
| 0111 | Ib * (1/8) | ↓ | 8 |
| 0110 | Ib * (1/7) | ↓ | 7 |
| 0101 | Ib * (1/6) | ↓ | 6 |
| 0100 | Ib * (1/5) | ↓ | 5 |
| 0011 | Ib * (1/4) | ↓ | 4 |
| 0010 | Ib * (1/3) | ↓ | 3 |
| 0001 | Ib * (1/2) | ↓ | 2 |
| 0000 | Ib | gm (Large) | 1 |

$$Q = gm/GM13 = \{2*(Ib/Ia)/(Re+2*((n*Vt)/Ia))\}/ \quad (13)$$

$$\{2*(Iba/Ia)/(Re+2*((n*Vt)/Ia))\} = 2^m$$

Through this adjustment of the gm, the Q-value can be adjusted so as to fall within a range from 16 to 1 as shown by Formula (13).
Further, $$H = gm/GM13 = \{2*(Ib/Ia)/(Re+2*((n*Vt)/Ia))\}/ \quad (14)$$

$$\{2*(Iba/Ia)/(Re+2*((n*Vt)/Ia))\} = 2^m$$

Thus, through this adjustment of the gm, the gain H can be also adjusted so as to fall within a range from 16 to 1 as shown by Formula (14).

As mentioned above, the BPF of the present invention with the GMs and CMFBs makes the D.C. voltage level of a differential output voltage of each GM equals the reference voltage vref. Further, as the reference voltage vref, supplied is a voltage which is hardly affected by the power source voltage. That way, the power source noise is canceled. Further, the dynamic range is ensured by supplying the power source voltage for the GM from the power source terminal. Further, the configuration allows adjustment of constants such as Q-value, by means of adjusting the gm.

The present embodiment deals with the case where the BPF includes the voltage supply circuit 3 and the CMFBs 14 and 15 having the same configuration as that of the CMFB2. It is however needless to mention that the voltage supply circuit 3*a* and the CMFB2*a* mentioned in the foregoing Embodiment 1 are also adoptable.

Embodiment 3

The following describes another embodiment of the present invention with reference to FIG. 8 to FIG. 16.

The present embodiment deals with an infrared remote control receiver (infrared signal processing circuit) (transmission rate=1 kbps or less, spatial transmission distance=10 m or longer) having a BPF of the present invention. Here, the infrared remote control receiver has functions such as a function to reduce inverter fluorescent light noise, a function to reduce distortion in the waveform of an output from the BPF, or the like.

Figure 8:
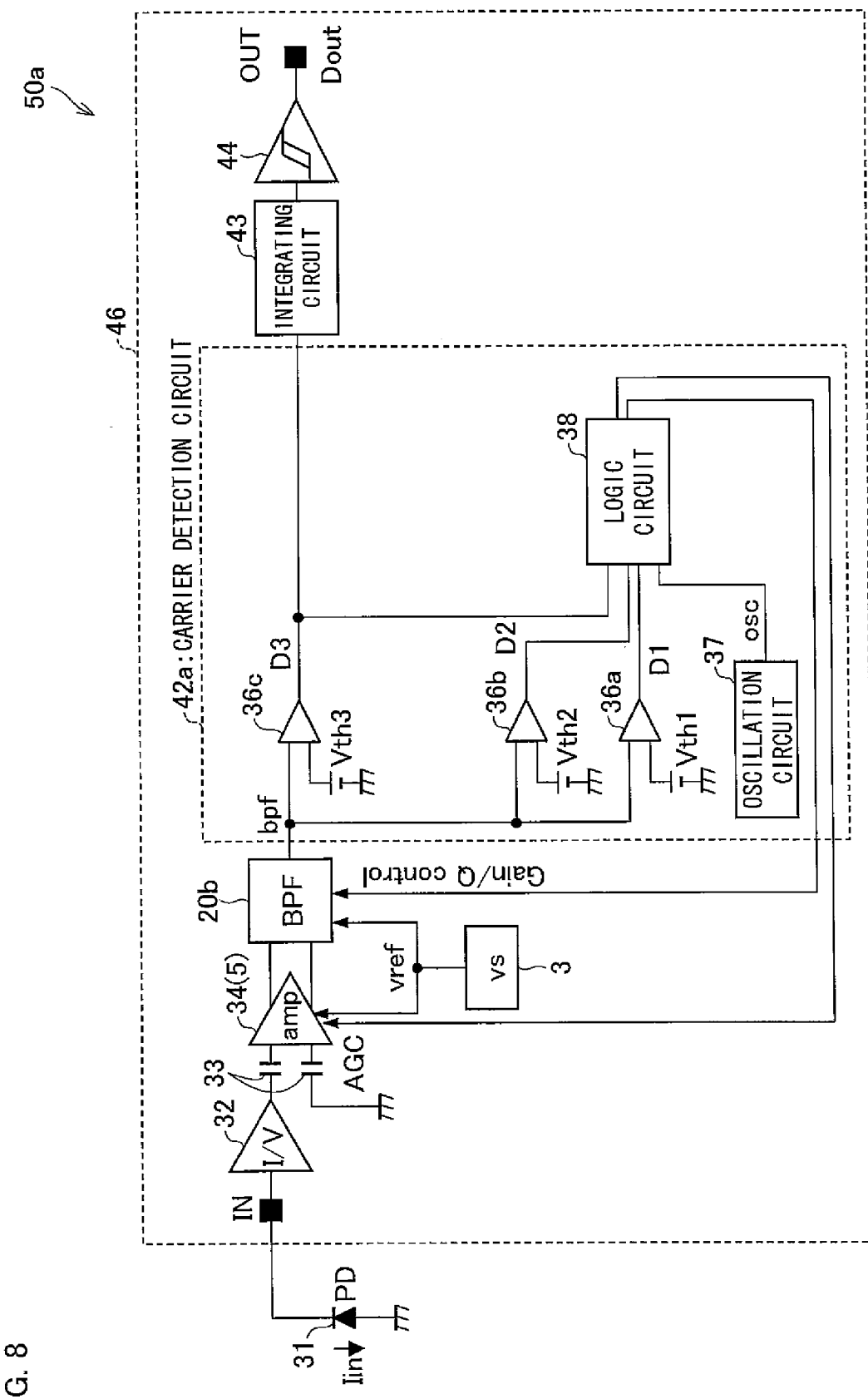
FIG. 8 is a diagram showing a configuration of an infrared remote control receiver according to the other embodiment.

As an example of such an infrared remote control receiver, FIG. 8 shows a configuration of an infrared remote control receiver 50*a*.

An infrared remote control receiver 50*a* includes a photodiode chip 31 (photo-acceptance element) and a reception chip 46. The reception chip 46 includes: a current-to-voltage-conversion circuit 32; a capacitor 33; an amplifier (amplifying circuit) 34; the BPF 20*b* (as an example); a carrier detection circuit 42*a*; an integrating circuit 43; a hysteresis comparator 44; and a voltage supply circuit 3.

The amplifier 34 has a similar configuration to that of the operational amplifier circuit 5 of the foregoing Embodiment 1. The voltage supply circuit 3 supplies a reference voltage vref to the amplifier circuit 34 and the BPF 20*b*. In the figure, an input terminal IN serves as an input terminal of the reception chip 46, and an output terminal OUT serves as an output terminal of the reception chip 46.

In the infrared remote control receiver 50*a*, the photodiode chip 31 converts a remote control transmission signal (infrared signal) received from an infrared remote control transmitter (not shown) into a current signal Iin. This current signal Iin is then converted into a voltage signal by the current-to-voltage-conversion circuit 32, and the voltage signal is amplified by the amplifier 34. Then, from the voltage signal amplified, the BPF 20*b* extracts a carrier frequency component, and the carrier detection circuit 42*a* detects a carrier in the carrier frequency component extracted. A period during which the carrier exists is integrated by the integrating circuit 43, and whether or not the carrier exits is judged in the hysteresis comparator 44. The result of the judgment is then output in the form of digital output Dout. This digital output Dout is sent to a microcomputer or the like which controls an electronic device.

With the amplifier 34 and the BPF20*b*, the power-source noise canceling characteristic of the infrared remote control receiver 50*a* is improved while its dynamic range is kept from decreasing.

The carrier detection circuit 42*a* includes: comparators 36*a* (first comparing circuit), 36*b* (third comparing circuit), and 36*c* (second comparing circuit); an oscillation circuit 37; and a logic circuit 38 which performs a logical operation on the basis of respective outputs of the comparators 36*a* to 36*c*. In addition to detecting of a carrier, the carrier detection circuit 42*a* controls the gain of the amplifier 34 and the gain and Q-value of the BPF 20*b*.

An output signal bpf from the BPF 20*b* is input to one of input terminals of each of the comparators 36*a* to 36*c*. To another input terminal of the comparator 36*a*, a threshold voltage Vth1 (first threshold voltage) is input. To another input terminal of the comparator 36*b*, a threshold voltage Vth2 (third threshold voltage) is input. To another input terminal of the comparator 36*c*, a threshold voltage Vth3 (second threshold voltage) is input. The threshold voltage Vth1 is a noise detection level. The threshold voltage Vth2 is a peak detection level for judging the level of the output signal bpf from the BPF 20*b*. The threshold voltage Vth3 is a first signal detection level (a first carrier detection level). These threshold voltages Vth1 to Vth3 are such that: Vth1<Vth3<Vth2.

The comparator 36*a* compares the output signal bpf of the BPF 20*b* with the threshold voltage Vth1, and outputs an output signal D1 if the level of the output signal bpf of the BPS 20*b* surpasses the level of the threshold voltage Vth1. Similarly, the comparator 36*b* compares the output signal bpf of the BPF 20*b* with the threshold voltage Vth2, and outputs an output signal D2 if the level of the output signal bpf of the BPF 20*b* surpasses the level of the threshold voltage Vth2. The comparator 36*c* compares the output signal bpf of the BPF 20*b* with the threshold voltage Vth3, and outputs an output signal D3 if the level of the output signal bpf of the BPF 20*b* surpasses the level of the threshold voltage Vth3.

The oscillation circuit 37 oscillates at the same frequency as the center frequency of the BPF 20*b*, for example.

Figure 9:
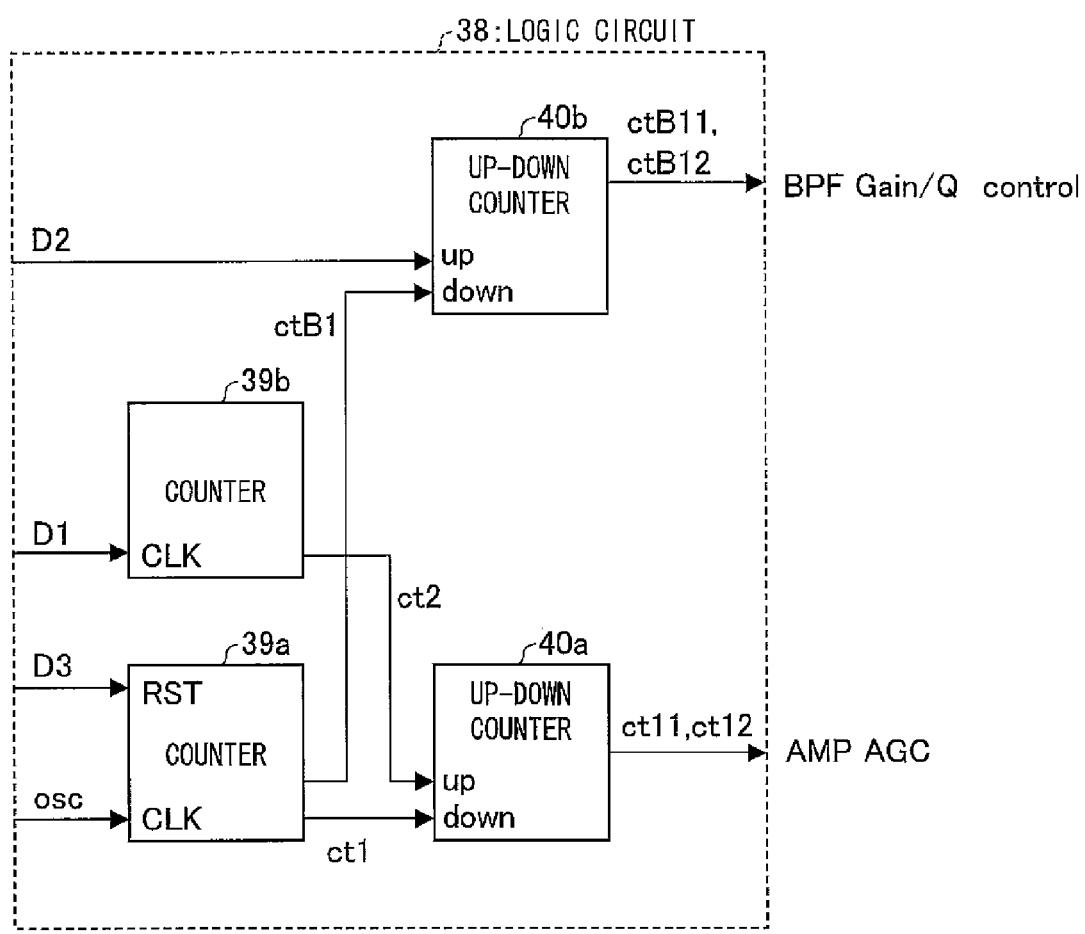
FIG. 9 is a block diagram showing a logic circuit in the infrared remote control receiver.

FIG. 9 shows an exemplary configuration of the logic circuit 38.

The logic circuit 38 includes: counters 39*a* (first counter) and 9*b* (second counter); and up-down counters 40 (first up-down counter) and 40*b* (second up-down counter).

The counter 39*a* performs counting operation in response to an output signal (clock signal) osc from the oscillation circuit 37. When a predetermined number of pulses (e.g. 15 bits, $2^{15}$=32768 pulses) are counted, the counter 39*a* outputs an amplifier control signal ct1 (first amplifying circuit control signal) for increasing the gain to the up-down counter 40*a*. The counter 39*a* also outputs, when a predetermined number of pulses (e.g. 10 bits, $2^{10}$=1024 pulses) are counted, a BPF control signal ctB1 for increasing the gain and Q-value to the up-down counter 40*b*. Furthermore, to a reset terminal RST of the counter 39*a*, the output D3 from the comparator 36*c* is input.

The time constant of the amplifier control signal ct1, for setting the time constant for controlling the amplifier, is 300 msec or more. Further, the time constant of the BPF control signal ctB1, for setting the time constant for controlling the BPF, is 300 msec or less.

The counter 39*b* performs counting operation in response to the output signal D1 from the comparator 36*a*. When a predetermined number of pulses (e.g. 14 bits, $2^{14}$=16384 pulses) are counted, the counter 39*b* outputs to the up-down counter 40*a* an amplifier control signal ct2 (second amplifying circuit control signal) for reducing the gain. The time constant of the amplifier control signal ct2, for setting the time constant for controlling the amplifier, is 300 msec or more. Here, the respective numbers of outputs of the amplifier control signals ct1 and ct2 have the following relation: the number of outputs of the amplifier control signal ct2>the number of outputs of the amplifier control signal ct1.

The up-down counter 40*a* performs counting operation in response to an amplifier control signal ct1 output from the counter 39a, and outputs an amplifier control signal ct11 (first control signal) to the amplifier 34 to increase the gain of the amplifier 34. Further, the up-down counter 40a performs counting operation in response to the amplifier control signal ct2 output from counter 39b, and outputs an amplifier control signal ct12 (second control signal) to the amplifier 34 to reduce the gain of the amplifier 34.

The up-down counter 40b performs counting operation in response to the BPF control signal ctB1 output from the counter 39a, and outputs a BPF control signal ctB11 (third control signal) to the BPF 20b to increase the gain and Q-value of the BPF 20b. Further, the up-down counter 40b receives an output signal D2 from the comparator 36b, and performs counting operation in response to the output signal D2. Then, the up-down counter 40b outputs a BPF control signal ctB12 (fourth control signal) to the BPF 20b to reduce the gain and Q-value of the BPF 20b.

The BPF control signals ctB11 and ctB12 output from the up-down counter 40b are input to a register 18 of the BPF 20b. Then, an adjustment signal SW as shown in Table 1 is output from the register 18, and thus, the gain and the Q-value of the BPF 20b are controlled.

As described, the carrier detection circuit 42a can be realized in a form of digital circuit. This allows downsizing of the chip size, consequently allowing reduction of the cost.

Figure 10:
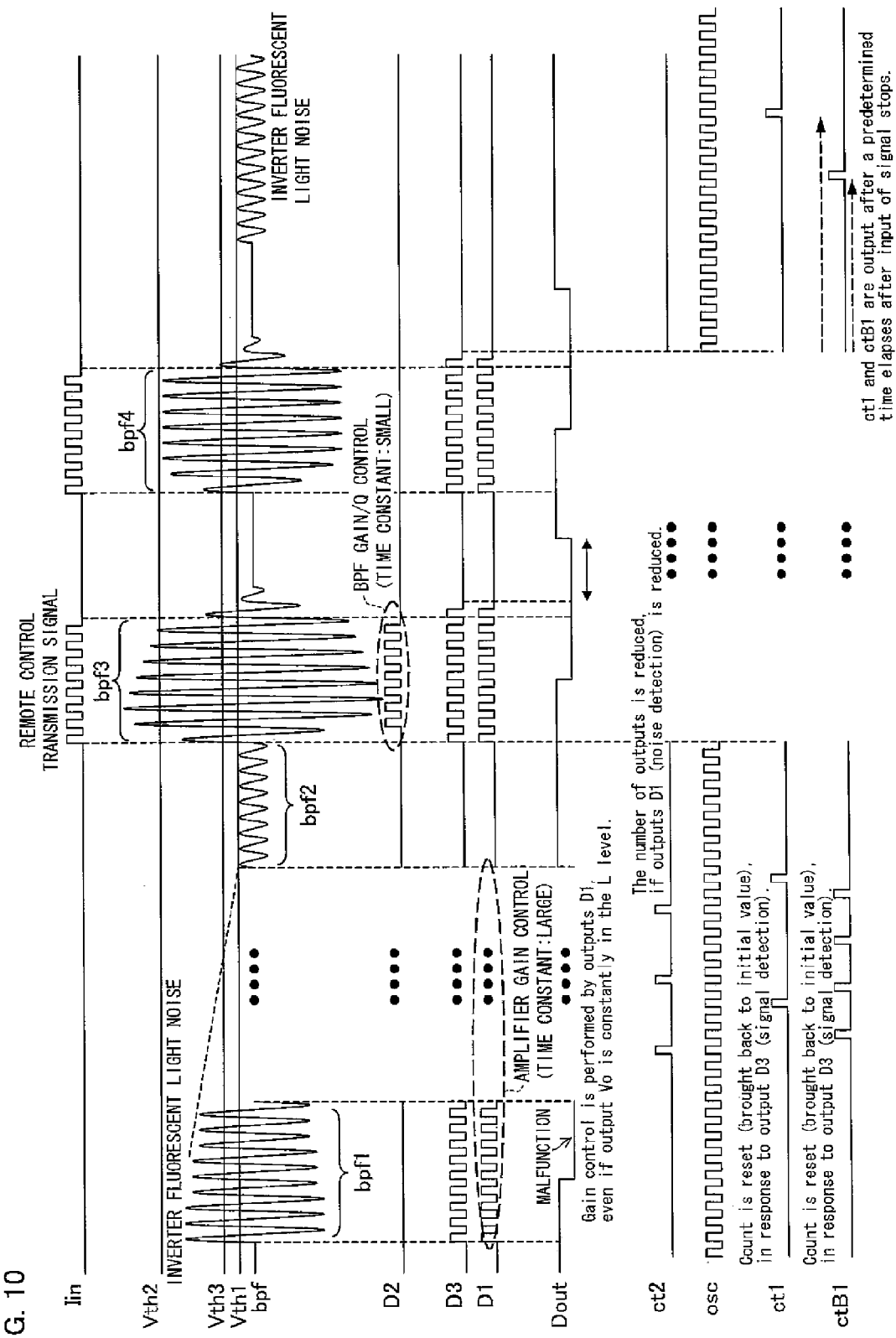
FIG. 10 is a diagram showing an operation waveform of each circuit in the infrared remote control receiver.
Figure 11:
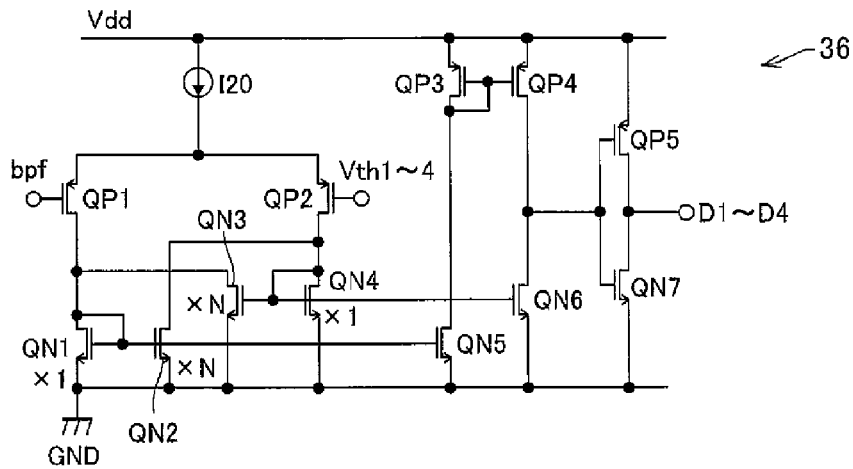
FIG. 11(*a*) is a circuit diagram showing a specific configuration of a comparator in the infrared remote control receiver.
Figure 11:
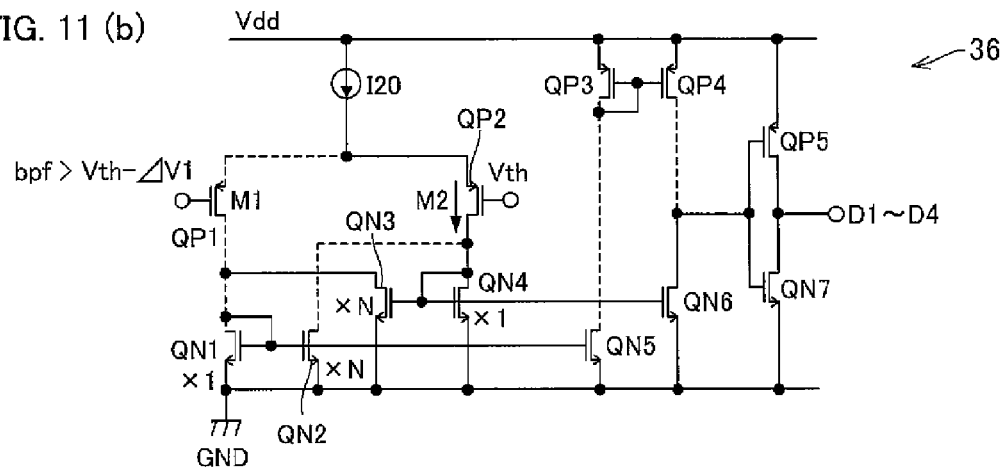
Figure 11:
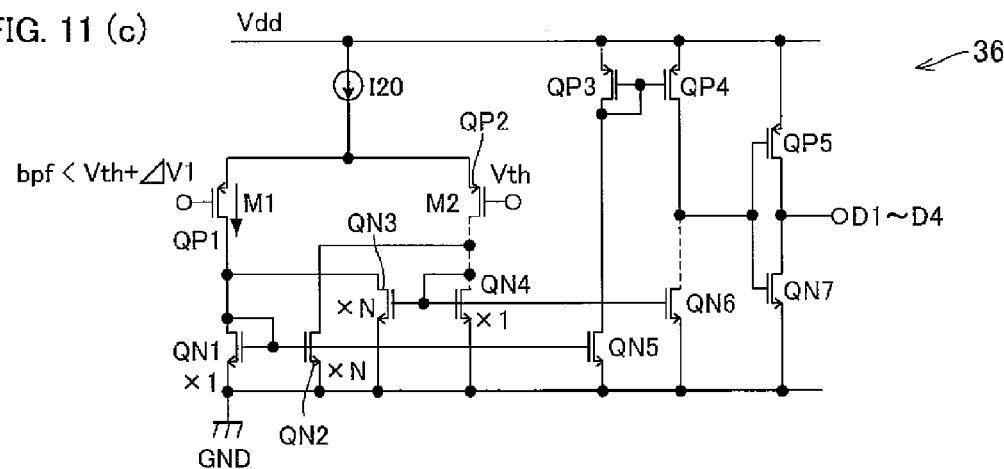
Figure 12:
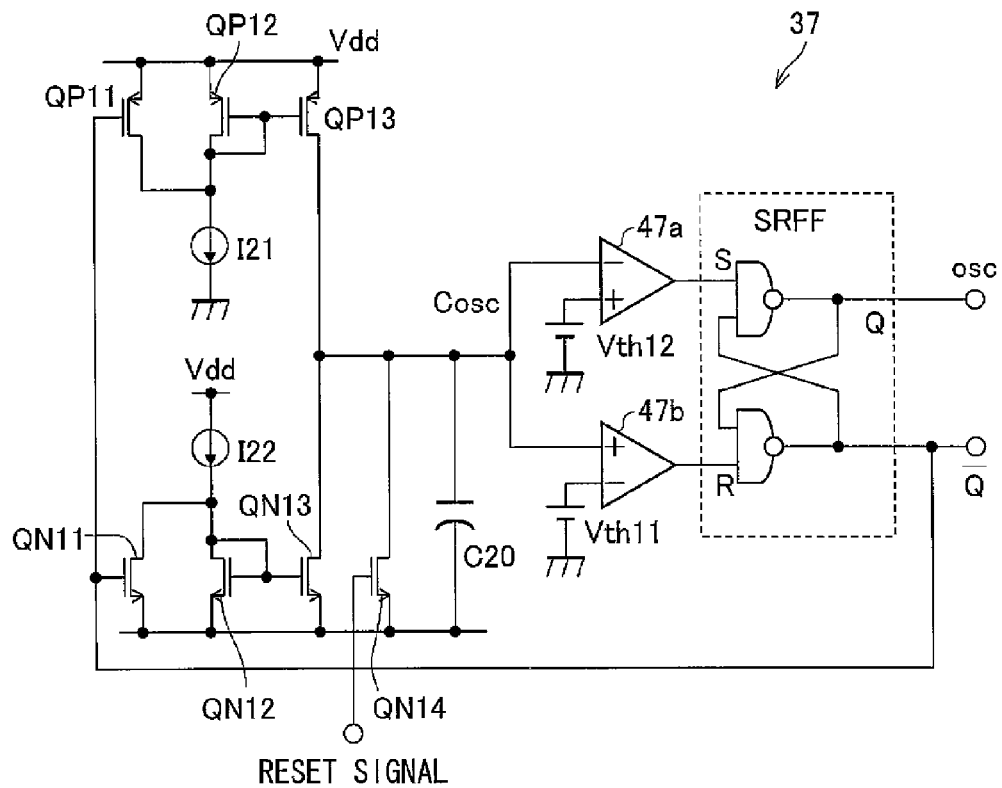
FIG. 12(*a*) is a circuit diagram showing a specific configuration of an oscillation circuit in the infared remote control receiver.
Figure 12:
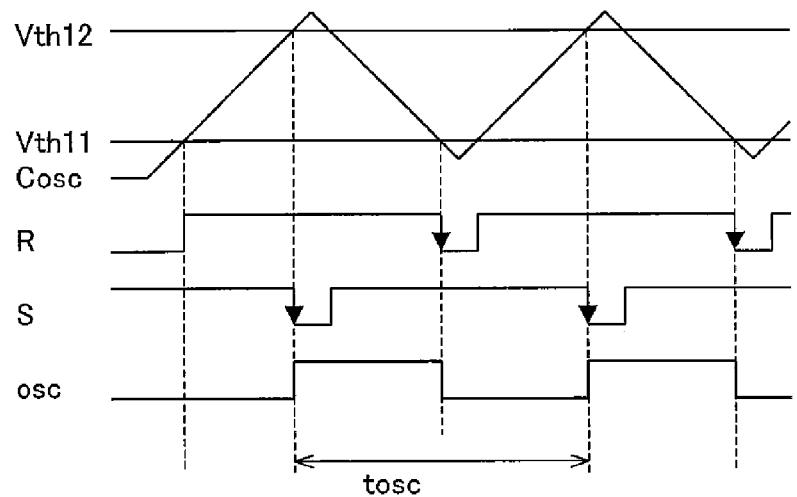

Next described with reference to FIG. 10 is the operation of the infrared remote control receiver 50a. FIG. 10 shows an operation waveform of each circuit in the infrared remote control receiver 50a. In FIG. 10, noise from a fluorescent light enters before a remote control transmission signal enters.

First, when the fluorescent light noise enters the infrared remote control receiver 50a, the current-to-voltage-conversion circuit 32, amplifier 34, and BPF 20b respectively perform processes supposed to be performed, and an output signal bpf (bpf1 in the figure) from the BPF 20b is input to each of the comparators 36a to 36c in the carrier detection circuit 42a. Thus, output signals D1 and D3 are respectively output from the comparators 36a and 36c, as shown in the figure.

Since the output signal D3 from the comparator 36c resets the counter 39a, the counting operation of the counter 39a is stopped. Meanwhile, the output signal D1 from the comparator 36a is input to the counter 39b, and the counter 39b outputs the amplifier control signal ct2 in response to the input. The amplifier control signal ct2 is then input to the up-down counter 40a. In response to this, the up-down counter 40a outputs the amplifier control signal ct12 to the amplifier 34, so as to cause the amplifier to reduce its gain.

Through this gain control of the amplifier 34, the fluorescent light noise is attenuated. When the comparator 36c stops outputting the output signal D3, the counter 39a starts its counting operation, and the BPF control signal ctB1 is output to the up-down counter 40b. In response to this, the up-down counter 40b outputs the BPF control signal ctB11 to the BPF 20b, so as to causes the BPF 20b to raise its gain and Q-value.

Subsequently, the amplifier control signal ct1 is output to the up-down counter 40a. In response to this, the up-down counter 40a outputs the amplifier control signal ct11 to the amplifier 34, so as to cause the amplifier 34 to raise its gain. Through the above-mentioned controls of the amplifier 34 and BPF 20b, the fluorescent light noise is attenuated to a level not more than the threshold voltage Vth1 of the comparator 36a (See Signal bpf2 in the figure). In other words, the noise is attenuated to the level which causes no malfunction. Thus, it is possible to restrain malfunctions attributed to the fluorescent light noise.

Next, when a remote control transmission signal is input to the infrared remote control receiver 50a, the current-to-voltage-conversion circuit 32, amplifier 34, and the BPF 20b perform processes supposed to be performed, and an output signal bpf (Signal bpf3 in the figure) from the BPF 20b is input to each of the comparators 36a to 6c of in the carrier detection circuit 42a. Thus, output signals D1 to D3 are respectively output from the comparators 36a to 36c, as shown in the figure. Then, the output signal D1 and the output signal osc of the oscillation circuit c37 causes the above mentioned control of the amplifier 34.

Here, in the control caused by the output signal D1 from the comparator 36a and the output signal osc from the oscillation circuit 37, a sufficient time constants of 300 msec or more is ensured for both of the amplifier control signals ct1 and ct2. Therefore, rapid variation of the gain is avoided, and a stable reception sensitivity is achieved at a time of inputting a remote control transmission signal.

Further, since the counter 39a is reset while the output signal D3 of the comparator 36c is output, it is only the control for reducing the gain of the amplifier 34 which is performed, and not the control for increasing the gain of the amplifier 34 or the control for increasing the gain and the Q-value of BPF 20b which are caused by the output signal osc of the oscillation circuit 37. Thus, the amount of variation of the gain is made small, and a stable reception sensitivity is achieved at a time of inputting a remote control transmission signal. Furthermore, since it is only the control for reducing the gain of the amplifier 34 which is performed, malfunctions attributed to fluorescent light noise can be further restrained.

While the above-mentioned control is performed, the BPF 20b is controlled by the output signal D2 of the comparator 36b. When the output signal D2 of the comparator 36b is output, the gain and Q-value of the BPF 20b are controlled, judging that (i) close-distance communication such as the one described in "BACKGROUND ART" is performed, and (ii) distortion in the waveform of the output signal D3 of the comparator 36c will occur.

Specifically, when the output signal D2 of the comparator 36b is input to the up-down counter 40b, the up-down counter 40b outputs the BPF control signal ctB12 to the BPF 20b to cause the BPF 20b to reduce the gain and Q-value thereof. Through this, the output signal bpf of the BPF 20b is attenuated to a level not higher than the threshold voltage Vth2 of the comparator 36b (See bpf4 in the figure), and the level of the output signal bpf is optimized. Thus, the problem of not being able to receive signals will not occur. Further, when the output signal D2 of the comparator 36b is not output, the control of the BPF 20b is not performed. Therefore, a high Q-value and a high gain is maintained. This control is done quickly, since the time constant set in the up-down counter 40b is small.

Here, since the Q-value of the BPF 20b is increased through the control caused by the output signal D1 of the comparator 36a and the output signal osc of the oscillation circuit 37, problems such as the following may occur: deterioration in the stability of the BPF 20b; and/or deterioration of the reception sensitivity due to increase in waveform distortion of the output signal bpf of the BPF 20b. However, since the Q-value of the BPF 20b is reduced through the above-described control of the BPF 20b, such problems will not occur.

Next, when the input of the remote control transmission signal stops, only the counter 39a operates and outputs the gain control signal ctB1 to the up-down counter 40b. Then, the BPF control signal ctB 11 causes the BPF 20b to raise its gain and Q-value. After that, the gain control signal ct1 is output to the up-down counter 40a, and the gain control signal ct 11 causes the amplifier 34 to raise its gain.

Here, the above description deals with the case where the remote control transmission signal enters after fluorescent light noise is attenuated. However, it is possible that the remote control transmission signal enters before fluorescent light noise is attenuated. This however is not a particular concern, as rapid control of the gain and the Q-value of the BPF 20b are caused by the output signal D2 of the comparator 36b.

FIG. 11(a) shows a specific example of configuration of the comparator 36, and FIG. 11(b) and FIG. 11(c) show an operation of the comparator 36. In the following, a MOS transistor QP refers to a P-channel MOS transistor, and a MOS transistor QN refers to an N-channel MOS transistor. The same goes for a comparator 36d described hereinbelow in Embodiment 4.

The comparator 36 is a hysteresis comparator as shown in FIG. 11(a). First described is how each element is connected to the others. The respective sources of the MOS transistors QP1 and QP2 are connected to each other, and are connected to a power source Vdd via a current source I20. The gate of a MOS transistor QP1 serves as one of the input terminals of the comparator 36, and the output signal bpf of the BPF 20b is input to the gate of the MOS transistor QP1. The gate of a MOS transistor QP2 serves as another one of the input terminals of the comparator 36, and a threshold voltage Vth (collective name for threshold voltages Vth1 to Vth4) is input to the gate of the MOS transistor QP2.

The drain of the MOS transistor QP1 is connected to the drain of a MOS transistor QN1. The MOS transistor QN1 and a MOS transistor QN2 form a current mirror circuit. The drain of the MOS transistor QP2 is connected to the drain of a MOS transistor QN4. The MOS transistor QN4 and a MOS transistor QN3 form a current mirror circuit. Furthermore, the drain of the MOS transistor QP1 is connected to the drain of the MOS transistor QN3, and the drain of the MOS transistor QP2 is connected to the drain of the MOS transistor QN2.

The gate of the MOS transistor QN1 is connected to the gate of a MOS transistor QN5, and the gate of the MOS transistor QN3 is connected to the gate of a MOS transistor QN6. The drain of the MOS transistor QN5 is connected to the drain of a MOS transistor QP3. The MOS transistors QP3 and a MOS transistor QP4 form a current mirror circuit. The drain of the MOS transistor QN6 is connected to the drain of the MOS transistor QP4.

Further, the drain of the MOS transistor QN6 is connected to an input terminal of a CMOS inverter formed by a MOS transistor QP5 and a MOS transistor QN7. An output terminal of this CMOS inverter serves as an output terminal of the comparator 36. The respective sources of the MOS transistors QP3 and QP4 are connected to the power source Vdd, and the respective sources of the MOS transistors QN1 to QN7 are connected to a GND terminal.

Next described with reference to FIG. 11(b) and FIG. 11(c) is an operation of the comparator 36. FIG. 11(b) shows an operation through which an output signal bpf of the BPF 20b transits from a large value to a small value. FIG. 11(c) shows an operation through which an output signal bpf of the BPF 20b transits from a small value to a large value. Note that the broken lines in FIG. 11(b) and FIG. 11(c) indicates that no current is flowing.

First, the operation of FIG. 11(b) is explained. In FIG. 11(b), the value of the output signal bpf of BPS 20b is large, and therefore the output signal from the comparator 36 is at the H level (the output signal D1 and D4 is output).

When the output signal bpf>Vth−ΔV1, no current flows in the MOS transistor QP1, and therefore the MOS transistor QP2 enters the overdrive state. Since, no drain current flows in the MOS transistor QN1, no drain current flows in the MOS transistor QN2 either. Accordingly, the MOS transistor QN4 turns on, and so does the MOS transistor QN3. However, since no drain current flows in the MOS transistor QN3, the drain-source voltage Vds of the MOS transistor QN3 is 0V. Therefore, the respective gate potentials of the MOS transistors QN1 and QN2 is GND. Thus, the MOS transistors QN1 and QN2 turn off. At this point, the MOS transistor QN6 turns on, and so does the MOS transistor QP5. Accordingly, the output signal of the comparator 36 is at the H level.

The level of the output signal bpf of the BPF 20b is reduced so that: the output signal bpf=Vth−ΔV1. At this point, the MOS transistor QP2 exits the overdrive state, and the drain current of the MOS transistor QP2 can be reduced. When a drain current starts to flow in each of the MOS transistor QP1 and the MOS transistor QP2, the drain current flowing in the MOS transistor QP1 flows into the MOS transistor QN3. Thus, the drain current flowing in the MOS transistor QP1 is N times as much as that flows in the MOS transistor QP2. Thus, the drain current M1 of the MOS transistor QP1={N/(N+1)}×I20, and the drain current M2 of the MOS transistor QP2={1/(N+1)}×I20, and the differential pair is balanced.

Further, at this point, a difference in the gate-source voltage Vgs of the MOS transistor QP1 and the MOS transistor QP2 is ΔV. Here, it is supposed that: respective W/L ratios (where W is the gate width, and L is the gate length) of the drain currents M1 and M2 are equal to each other; Vgs1 is the gate-source voltage of the MOS transistor QP1; and Vgs2 is the gate-source voltage of the MOS transistor QP2. Since respective source potentials of the MOS transistor QP1 and the MOS transistor QP2 are equal to each other, $$Vth + Vgs2 = Vth - \Delta V1 + Vgs1. \quad (15)$$

Thus:

$$\Delta V1 = Vgs1 - Vgs2 = 2^{1/2} \times Vov \times \{(N/(N+1))^{1/2} - (1/(N+1))^{1/2}\}.$$

However, $Vov=(I15/(\mu 0 \times Cox \times W/L))^{1/2}$, where: μ0 is the mobility of a carrier; Cox is the capacity of the gate insulative film; and Vov is an overdrive voltage of the MOS transistors QP1 and QP2 for causing flows of the drain currents M1 and M2, in a case of not having the hysteresis (N=1).

Next, when the level of the output signal bpf of the BPF 20b is further reduced so that: the output signal bpf<Vth−ΔV1, the drain current of the MOS transistor QP1 increases, and therefore the current of the MOS transistor QN3 increases as well. However, when the drain current of the MOS transistor QP1 increases, the drain current of the MOS transistor QP2 is decreased. As such, the current of the MOS transistor QN3 is not able to increase. Accordingly, the drain current of the MOS transistor QP1 rapidly charges the gate of the MOS transistor QN1, thereby turning on the MOS transistor QN1. Thus, the drain-source voltage Vds of the MOS transistor QN3 is increased. Further, the MOS transistor QN2 is also turned on.

However, since the MOS transistor QN2 is designed so as to achieve a flow of current which is N times as much as the current flowing in the MOS transistor QN1, the current of the MOS transistor QP2, which is supposed to be increased, is reduced. For this reason, the MOS transistor QN2 acquires current from the gates of the MOS transistor QN4, thereby causing the gate potentials of the MOS transistors QN3 and QN4 to fall. Thus, the MOS transistors QN3 and QN4 are turned off. However, since there is a limit to the amount of the current the MOS transistor QN2 is able to acquire, the drain current stops flowing in the MOS transistor QN2 when the amount reaches the limit, and the drain-source voltage Vds of the MOS transistor QN2 changes to 0V. As a result, the respective gate potentials of the MOS transistors QN3 and QN4 are GN1D, and no drain current flows in the MOS transistor QP2.

As described, the balance is instable while: the output signal bpf=Vth−ΔV1. When: the output signal bpf<Vth−ΔV1, the distribution of current in the circuit is reversed, and the output signal of the comparator 36 switches to an L level.

FIG. 11(c) shows a case where the level of the output signal bpf of the BPF 20b rises, while the output signal level of the comparator 36 is in L level as in FIG. 11(b). In the figure, the output signal level of the comparator 36 is in L level.

In FIG. 11(b), the source potentials of the MOS transistors QP1 and QP2 are higher after the state of output signal bpf of the BPF 20b has transited from output signal bpf=Vth−ΔV1 to output signal bpf<Vth−ΔV1, as compared with the source potentials at the moment of transition. This is because the state transition is caused by a positive feedback, and the MOS transistor QP1 enters the overdrive state if the output signal bpf of the BPF 20b is less than Vth−ΔV even by a slightest amount. Accordingly, when the level of the output signal bpf from the BPF 20b rises while the output signal from the comparator 36 is at the L level as in FIG. 11(c), the drain current of the MOS transistor QP1 does not decrease unless the output signal bpf rises up to Vth+DV2 which is larger than Vth−ΔVT. As a result, the drain current does not flow in the MOS transistor QP2. Thus, while: the output signal bpf<Vth+ΔV2, the drain current flows in the MOS transistor QP1 but not in the MOS transistor QP2. Therefore, the current distribution is the same as: the output signal bpf<Vth−ΔV1. Accordingly, the output signal of the comparator 36 is at the L level.

When the level of the output signal bpf rises to Vth+ΔV2, the drain current flows in both of the MOS transistors QP1 and QP2.

At this point, the drain current M1 of the MOS transistor QP1={1/(N+1)}×I15, and the drain current M2 of the MOS transistor QP2={N/(N+1)}×I15. Thus, the differential pair is balanced.

At this point, Vth+Vgs2=Vth+ΔV2+Vgs1.

Thus, $$\Delta V2 = Vgs2 - Vgs1 = 2^{1/2} \times Vov \times \{(N/(N+1))^{1/2} - (1/(N+1))^{1/2}\} \quad (16)$$

Accordingly, based on the Formulas (15) and (16), $$\Delta V1 = \Delta V2 = \Delta V,$$

and Vth−ΔV1 and Vth+ΔV2 are symmetrical to each other in relation to Vth.

Next, when the level of the output signal bpf of the BPF 20b rises so that output signal bpf>Vth+ΔV2, the current distribution is the same as that in a case of the output signal bpf>Vth−ΔV1. Therefore, the level of the output signal from the comparator 36 is at the H level. At this point, due to an effect from the positive feedbacking, the drain current stops flowing in the MOS transistor QP1, and the MOS transistor QP2 enters the overdrive state. If the level of the output signal bpf of the BPF 20b is reduced during this state, the change explained with reference to FIG. 11(b) occurs.

By configuring the comparator 36 as the above-described hysteresis comparator, the respective pulse widths of the outputs D1 to D3 increase, and the respective counting operations of the counters 39a and 39b are triggered without fail, even if the level of the output signal bpf of the BPF 20b is nearby the threshold voltage Vth.

FIG. 12(a) shows an exemplary configuration of the oscillation circuit 37, and FIG. 12(b) shows its operation waveform. Note that a cycle tosc in the figure is the cycle of the output signal osc from the oscillation circuit. First, connections of elements in the oscillation circuit 37 are described.

The respective sources of a MOS transistor QP11, a MOS transistor QP12, and a MOS transistor QP13 are connected to the power source Vdd. The drain of the MOS transistor QP11 is connected to the drain of a MOS transistor QP12. The MOS transistor QP12 and the MOS transistor QP13 form a current mirror circuit. The drains of the MOS transistors QP11 and QP12 are connected to a GND terminal via a current source I21. The respective sources of a MOS transistor QN11, a MOS transistor QN12, and a MOS transistor QN13 are connected to a GND terminal. The drain of the MOS transistor QN11 is connected to the drain of the MOS transistor QN12. The MOS transistor QN12 and the MOS transistor QN13 form a current mirror circuit. The drains of the MOS transistors QN11 and QN12 are connected to the power source Vdd via a current source I22.

The drain of the MOS transistor QP13 and the drain of the MOS transistor QN13 are connected to each other. Between (i) a connection point via which the drains are connected and (ii) the GND terminal, a MOS transistor QN14 and a capacitor C20 are connected in parallel. Further, to this connection point, an inverting input terminal of the comparator 47a and an noninverting input terminal of the comparator 47b are connected. A threshold voltage Vth12 is input to the noninverting input terminal of the comparator 47a, and a threshold voltage Vth11 is input to the inverting input terminal of the comparator 47b. The threshold voltage Vth11 and the threshold voltage Vth12 have the following relation: the threshold voltage Vth11<the threshold voltage Vth12.

An output terminal of the comparator 47a is connected to a set terminal S of a set/reset flip-flop (Hereinafter, simply referred to as SRFF). An output terminal of the comparator 47b is connected to a reset terminal R of the SRFF. An output terminal Q bar of the SRFF is connected to the respective gates of the MOS transistors QP11 and the MOS transistor QN11. To the gate of the MOS transistor QN14, a reset signal for resetting the oscillation circuit 37 is input from the outside. An output terminal of the oscillation circuit 37 is an output terminal Q of the SRFF.

Next, an operation of the oscillation circuit 37 is described, with reference to FIG. 12(b).

First, it is supposed that a signal at the L level is output from the output terminal Q of the SRFF. This causes an output current from the current source I21 to flow into the capacitor C20 via the current mirror circuit including the MOS transistors QP12 and QP13, thereby charging the capacitor C20. Here, at this point, an output current from the current source I22 flows into the GND via the MOS transistor QN11 which is in the ON state. Therefore, the current from the current source I22 does not contribute to the charging of the capacitor C20.

Through the charging, a potential Cosc of the capacitor C20 rises gradually. When the potential Cosc surpasses the threshold voltage Vth12 of the comparator 47a, the level of the output signal from the comparator 47a switches to the L level. Needless to say that the potential Cosc at this point has surpassed the threshold voltage Vth11. As such, the level of the output signal from the comparator 47b is at the H level. Therefore, a signal at the H level is output from the output terminal of the SRFF.

Next, in response to the output of an H level signal from the output terminal Q of the SRFF, the MOS transistor QN11 turns off, and the MOS transistors QN 12 and QN13 are turned on by the output current from the current source I22. Hence, the potential Cosc of the capacitor C20 is discharged. As a result, the potential Cose is gradually decreased. When it falls below the threshold voltage Vth11 at the comparator 47b, the level of the output signal from the comparator 47b switches to the L level. Needless to say that the potential Cosc at this point is less than the threshold voltage Vth12. As such, the level of the output signal from the comparator 47a is at the H level. Therefore, a signal at the L level is output from the output terminal Q of the SRFF. By repeating the operation thus described, the output signal osc shown in FIG. 1 is output.

The oscillation frequency fose of the oscillation circuit 37 can be derived from the following Formula (17). In the Formula (17), it is supposed that respective output current values of the current sources I21 and I22 are equal to each other. As is apparent from the Formula (17), controlling of the output current value of the current source I21 and/or that of the current source I21 allow(s) controlling of the oscillation frequency fosc.

$$fosc = I/(2 \times C20 \times (Vth12 - Vth11)) \quad (17),$$

where:

I is output current values of the current source I21 and the current source I22.

Here, it is preferable that the oscillation frequency fosc be the same as the center frequency of the BPF 20b for the following reason. Namely, the comparator 36 performs comparison using the output signal from the BPF 20b. As such, the frequency of the output signal from the comparator 36 is the center frequency of the BPF 20b. By setting the oscillation frequency fosc of the oscillation circuit 7 to the same frequency as the center frequency of the BPF 20b, the differential of timing between the respective output signals of the comparator 36 and the oscillation circuit 37 is reduced. Thus, malfunctions of the logic circuit 38 is restrained. It is also preferable that the oscillation frequency fosc be smaller than the center frequency of the BPF 20b. This is because, setting of the oscillation frequency fosc to a smaller frequency than the center frequency of the BPF 20b allows an increase in the time constant of the counter 39a, which time constant performs a counting operation in response to the output signal osc from the oscillation circuit 37, without a need of increasing the number of bits of the counter 39a.

Figure 13:
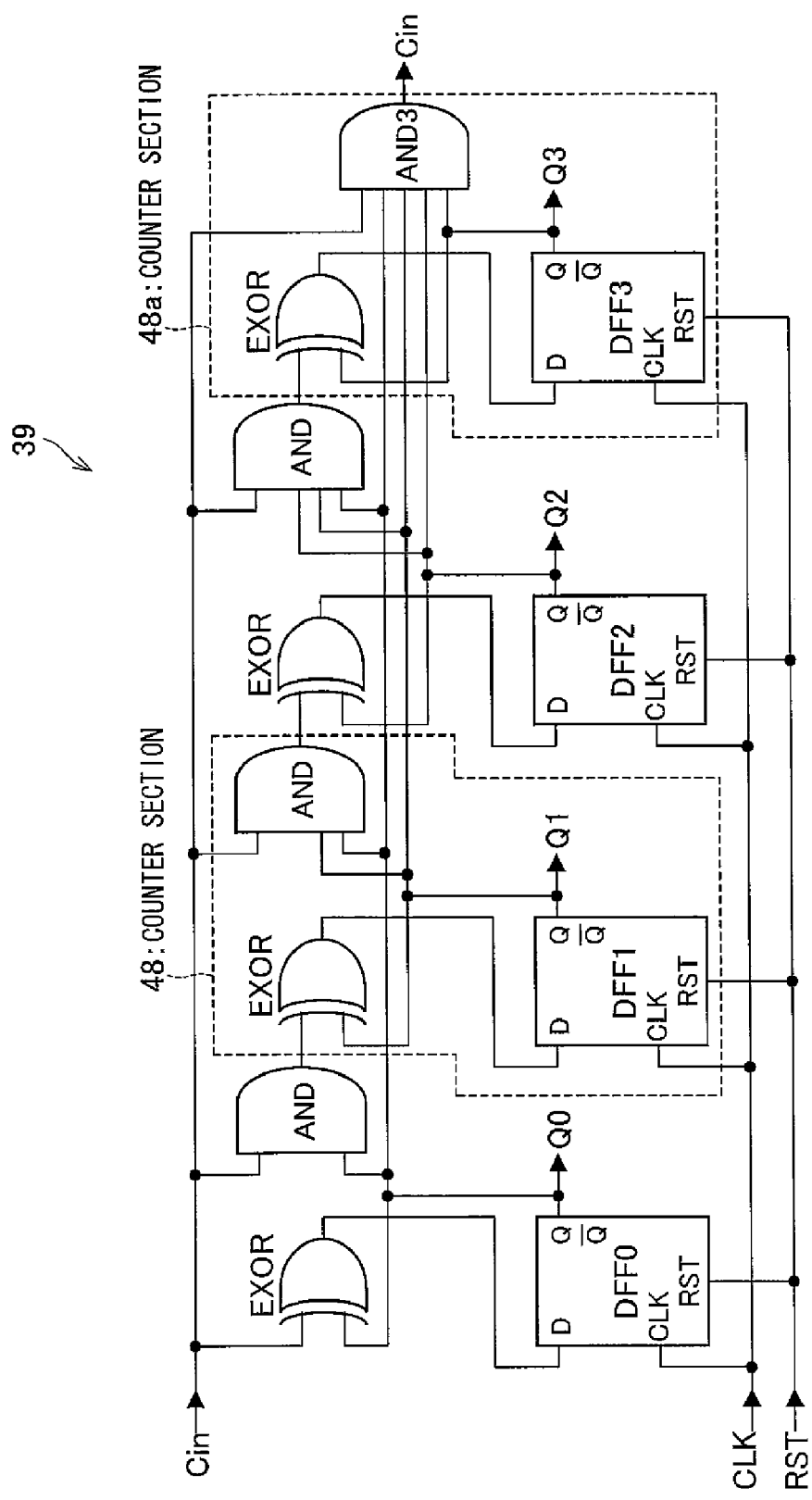
FIG. 13 is a diagram showing a specific configuration of a counter in the logic circuit.

FIG. 13 shows a specific configuration of the counter 39.

The counter includes plural 4-bit synchronous binary counters. Each of the 4-bit synchronous binary counters includes 4 stages of counter sections 48, each stage including: an exclusive circuit (Hereinafter simply referred to as EXOR); an AND circuit (Hereinafter simply referred to as AND); and a D flip-flop (D flip-flop 40)(Hereinafter simply referred to as DFF). Note that a single 4-bit synchronous binary counter is hereinafter referred to as a set. Further, an output Q0 is an output from a DFF0, and an output Q1 is an output from a DFF1. The same goes for the other DFFs as well.

In the counter section 48 of an n th stage (where n is an integer of 1 to 4) in a set, one of input terminals of the EXOR is connected to an output terminal of the AND in the counter section 48 of the n−1 th stage. Another one of the input terminals is connected to an output terminal Q of the DFF in the n th stage. The output terminal of the EXOR is connected to an input terminal D of the DFF in the counter section 48 of the n th stage. To one of the input terminals of the EXOR in the counter section 48 of the first stage in the set, a carry signal cin from a lower order (from the preceding set) is input.

To the AND in the counter section 48 of the n th stage in the set, the carry signal cin from the lower order (preceding set), an output from the DFF of the counter section 48 of the n th stage, and the respective outputs from the DFFs of all the preceding stages (i.e. n−1 th, n−2 th . . . first stage) are input. For example, it is supposed that the counter section 48a in the figure is the counter section 48 of the n th stage. The carry signal cin from the lower order (preceding set), an output Q3 from the DFF3 in the counter section 48a, and outputs of all the DFFs in the preceding stages are input to the AND3 in the counter section 48a. The respective outputs from the DFFs of all the preceding stages in this case are: an output Q0 from a DFF0 in the first stage; an output Q1 from a DEF1 in the n−2 th stage; and an output Q2 from a DFF2 in the n−1 th stage.

Each set having the configuration as described above counts pulses from 0000 to 1111, in response to input of clock CLK. Note that the AND in the counting section 48 of the final stage (i.e., AND3) outputs a carry signal cin to a counter of an upper order (subsequent set), when the DFF output of the set is "1111". Thus, it is possible to configure a multiple-bit counter. In a case of the infrared remote control receiver 50a, the center frequency of the BPF 20b is 40 kHz and the pulse cycle is 25 sec, in general. Thus, according to 25 μsec× $2^{14}$=0.4096 sec, a time constant of 300 mscc or more is obtained with a counter of 14 bits or more.

Figure 14:
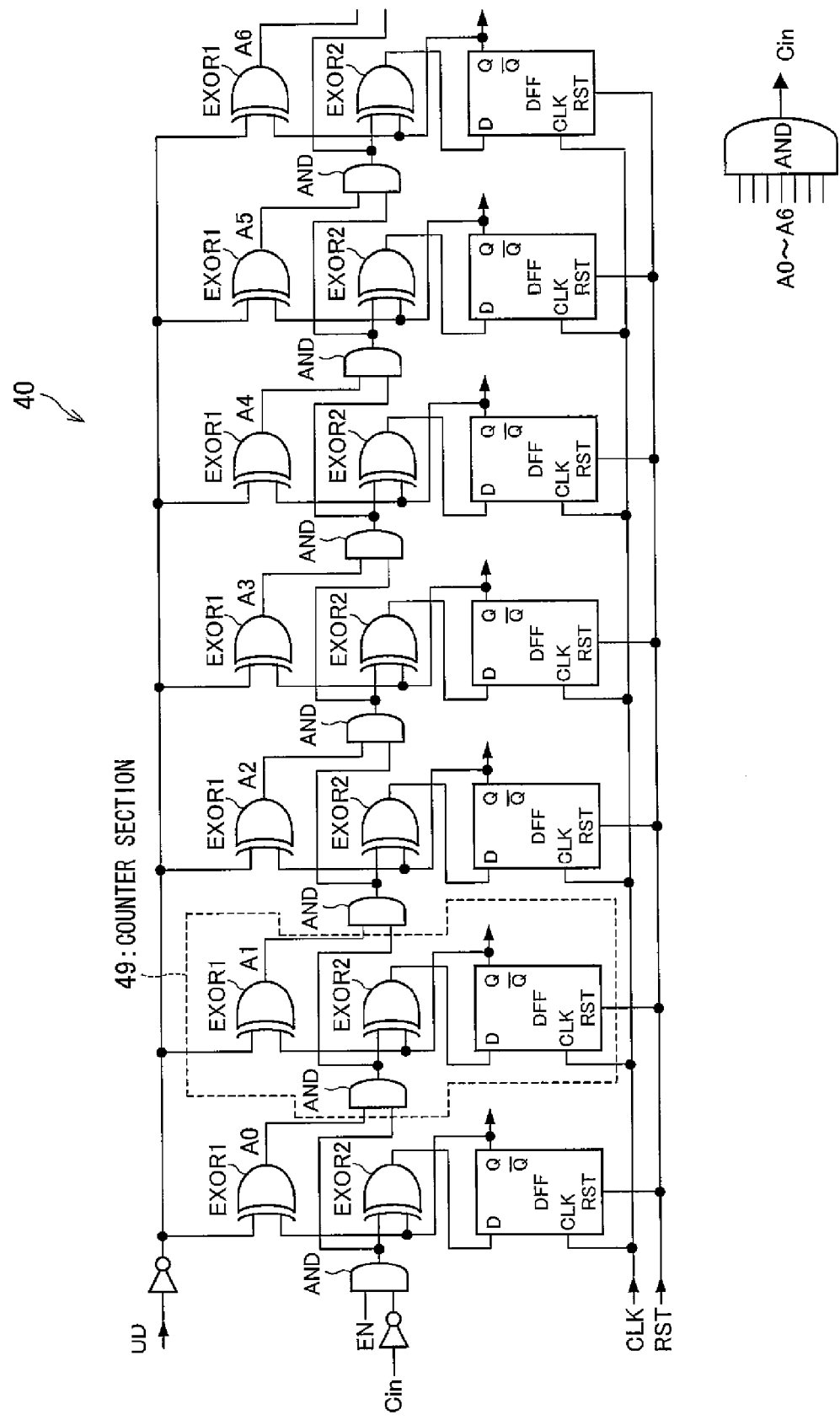
FIG. 14 is a diagram showing a specific configuration of an up-down counter in the logic circuit.
Figure 15:
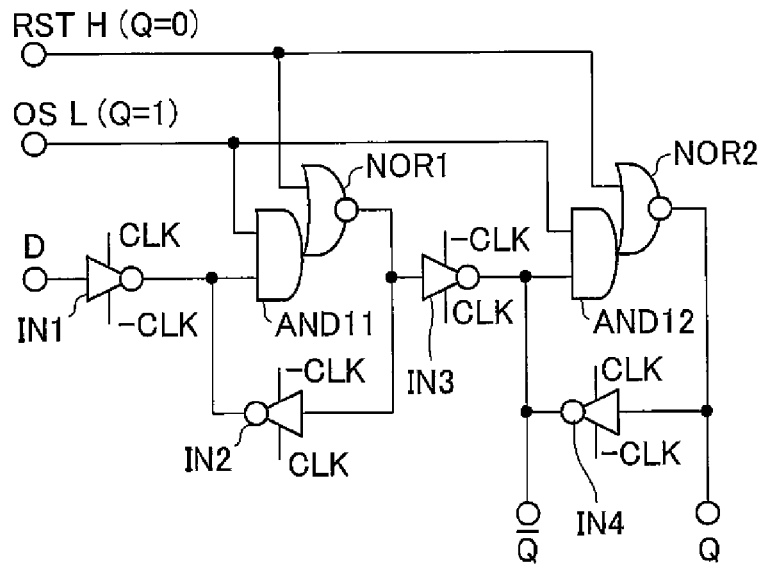
FIG. 15(*a*) is a diagram showing a specific configuration of a D flip-flop in each of the counter and the up-down counter FIG. 15(*b*) is a diagram showing an operation of the D flip-flop.
Figure 15:
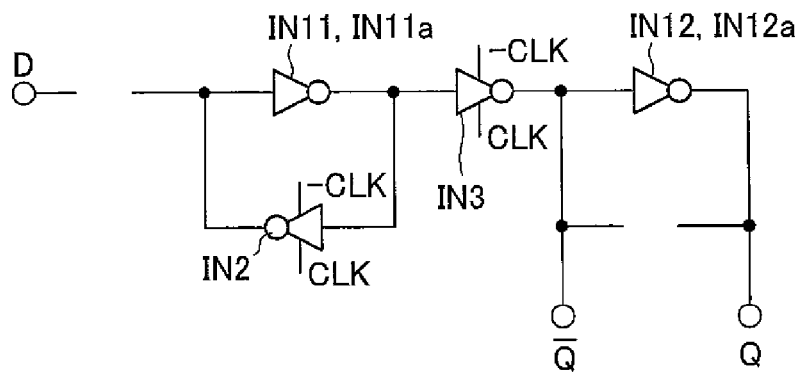
Figure 15:
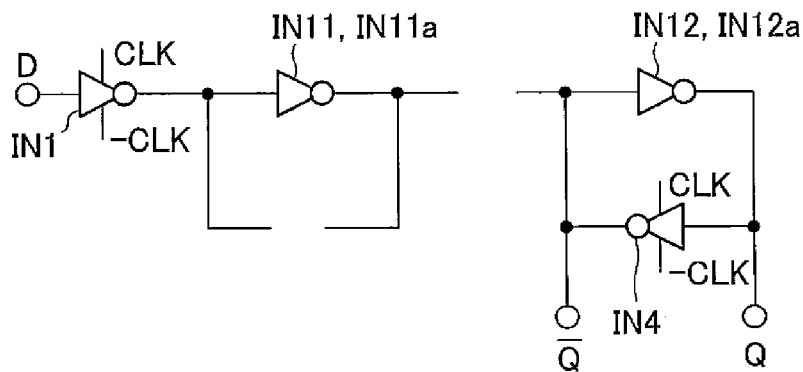

FIG. 14 shows a specific configuration of the up-down counter 40.

The up-down counter 40 includes plural 7-bit synchronous binary counters. Each of the 7-bit synchronous binary counters includes 7 stages of counter sections 49, and an AND 5. Each counter section 49 includes: 2 EXORs, an AND, and a DFF. To the AND 5, outputs A0 to A6 respectively from EXORs 1 of all the counting sections 49 are input. Note that a single 7-bit synchronous binary counter is hereinafter referred to as a set. The AND 5 in a set outputs a carry signal Cina to a counter of an upper order (subsequent set), when outputs of the EXORs 1 of all the counter sections 49 are "1".

In a counter section 49 of the n th stage (where n is an integer of 1 to 7) in the set, a count control signal UD is input to one of input terminals of the EXOR 1, and the another one of the input terminals is connected to one of input terminals of an EXOR 2 and an output terminal Q of a DFF of the same stage. An AND in the n th stage is connected to an output terminal of an AND and an output terminal of the EXOR 1 in the n−1 th stage. The output terminal of the AND in the n th stage is connected to an input terminal of an EXOR 2 of the counter section 49 in the nth stage. The output terminal of the AND is also connected, along with an output terminal of the EXOR 1 of the counter section 49 in the n th stage, to an AND of a counter section 49 in the n+1 th stage. The output terminal of the EXOR 2 of the counter section 49 in the n th stage is connected to an input terminal D of the DDF of the counter section 49 in the n th stage. To the AND of the counter section 49 of the first stage in the set, an enable signal EN and a carry signal Cina from a lower order (preceding set) are input.

The up-down counter 40 having the configuration as described above counts pulses from 0000000 to 1111111, in response to input of clock CLK. Note that up-counting is performed when an H-level signal is input to the count control signal UD, and down-counting is performed when an L-level signal is input.

Here, each of the counter 39 and the up-down counter 40 has a scan path, and is able to perform a shift-register operation. In wafer test performed at a predetermined occasion, the counter 39 and the up-down counter 40 are operated by using the same clock CLK (whereas, in a normal operation other than the wafer test, the clocks are operated by using different clocks respectively). This allows easier designing of the test, and improves a failure detection rate.

FIG. 15(a) shows a specific example of configuration of the DFF used in the counter 39 and the up-down counter 40. FIG. 15(b) and FIG. 15(c) show an operation of the DFF. The DFF includes: a clocked inverter (Hereinafter simply referred to as inverter IN); an AND; and a NOR circuit (Hereinafter referred to as NOR). First, connections of elements are described.

An input terminal D of the DFF is connected to an inverter IN 1, and an output terminal of the inverter IN 1 is connected to an input terminal (second input terminal) of an AND 11. To another input terminal (first input terminal) of the AND 11, an H output setting terminal OS (initial value setting means) for setting an output of the DEE is connected. An output terminal of the AND 11 is connected to an input terminal (second input terminal) of a NOR 1, and another input terminal (first input terminal) of the NOR 1 is connected to a reset terminal RST (initial value setting means) serving as an L output setting terminal for resetting the DEF. An output terminal of the NOR 1 is connected to an inverter IN 2, and an output terminal of the inverter IN 2 is connected to the second input terminal of the AND 11.

Further, the output terminal of the NOR 1 is connected to an inverter IN 3) and an output terminal of the inverter IN 3 is connected to an input terminal (second input terminal) of an AND 12. Another input terminal (first input terminal) of the AND 12 is connected to the H output setting terminal OS. An output terminal of the AND 12 is connected to an input terminal (second input terminal) of a NOR 2, and another input terminal of the NOR 2 is connected to the reset terminal RST. An output terminal of the NOR 2 is connected to an inverter TN 4, and an output terminal of the inverter IN 4 is connected to the output terminal of the inverter IN 3. The output terminal of the NOR 2 serves as an output terminal Q of the DFF, and the output terminal of the inverter IN 4 serves as an output terminal Q bar of the DFF.

Next, an operation of the DFF is described with reference to FIG. 15(b) and FIG. 15(c). FIG. 15(b) shows a case where an H-level signal is input as the clock CLK, whereas FIG. 15(c) shows a case where an L-level signal is input as the clock CLK. As mentioned, the DFF is provided with the H output setting terminal OS and the reset terminal RST, so that it is possible to set an output of the DFF Specifically, an output of the DFF (output terminal Q) can be set to H level, by inputting a signal at the LT level to the H output setting terminal OS. On the other hand, an output of the DFF (output terminal Q) can be reset by inputting an H-level signal to the reset terminal RST: i.e., the output of DFF is set to L level. Each of the cases are described below, First described is a case of FIG. 15(b) where an H-level signal is input as a clock CLK, and an H-level signal is input to the reset terminal RST, so as to acquire an L-level output from the DFF.

See FIG. 15(b) for the following description. When an H-level signal is input as a clock CLK, the inverter TN 1 and the inverter IN 4 enter a high-impedance state. Then, by inputting an H-level signal to the reset terminal RST, the signal is input to the first input terminal of NOR 1. Hence, no matter what level the output from the AND 11 is , the output from the NOR 1 is at the L level. Therefore, the AND 11 and NOR 1 can be regarded as an inverter whose output is at the L level (IN 11 in the figure). Similarly, the AND 12 and the NOR 2 can be regarded as an inverter whose output is at the L level (TN 12 in the figure). Thus, an L-level output is acquired from the DFF.

Next described is a case of FIG. 15(c) where an L-level signal is input as a clock CLK, and an H-level signal is input to the reset terminal RST, so as to acquire an L-level output from the DFF.

In this case, the inverter IN 2 and the inverter IN 3 enter the high-impedance state. The AND 11 and NOR 1 can be regarded as IN 11 whose output is at the L level, and the AND 12 and the NOR 2 can be regarded as the inverter IN 12 whose output is at the L level. Thus, an L-level output is acquired from the DFF.

Next described is a case of FIG. 15(b) where an H-level signal is input as a clock CLK, and an L-level signal is input to H output setting terminal OS, so that an H-level output is acquired from the DFF.

As shown in FIG. 15(b), the inverters IN 1 and IN 4 enter the high-impedance state, when an H-level signal is input as a clock CLK. Then, by inputting an L-level signal to the H output setting terminal OS, an L-level signal is input to the first input terminal of the AND 11. As a result, the output from the AND 11 is at the L level without fail. Since an L-level signal is input from the reset terminal RST to the first input terminal NOR 1, the output of the NOR 1 is at the H level without fail. As a result, the AND 11 and NOR 1 can be regarded as a single inverter (IN 11a in the figure) whose output is at the H level. Similarly, the AND 12 and NOR 2 can be regarded as a single inverter (IN 12a in the figure) whose output is at the H level. Thus, an H-level output is acquired from the DFF.

Next described is a case of FIG. 15(c) where an L-level signal is input as a clock CLK, and an L-level signal is input to the H-output setting terminal OS, so as to acquire an H-level output from the DFF.

In this case, the inverters IN 2 and IN 3 enter the high-impedance state. Thus, the AND 11 and NOR 1 can be regarded as IN 11a whose output is at the H level. Further, the AND 12 and NOR2 can be regarded as an inverter IN 12a whose output is in the H-level. Thus, an H-level output is acquired from the DFF.

As described, the output of the DFF can be set by inputting an L-level signal to the H output setting terminal OS or inputting an H-level signal to the reset terminal RST. Through this, it is possible to set the gain of the amplifier 34, and set the gain and Q-value of the BPF 20b at the time of turning-on the power. This allows the gain of the amplifier 34 and the gain and Q-value of the BPF 20b to be respectively set to values which are suitable for the use environment. Hence, an infrared remote control receiver 50a which is adaptable for various use environments is realized.

Embodiment 4

Figure 16:
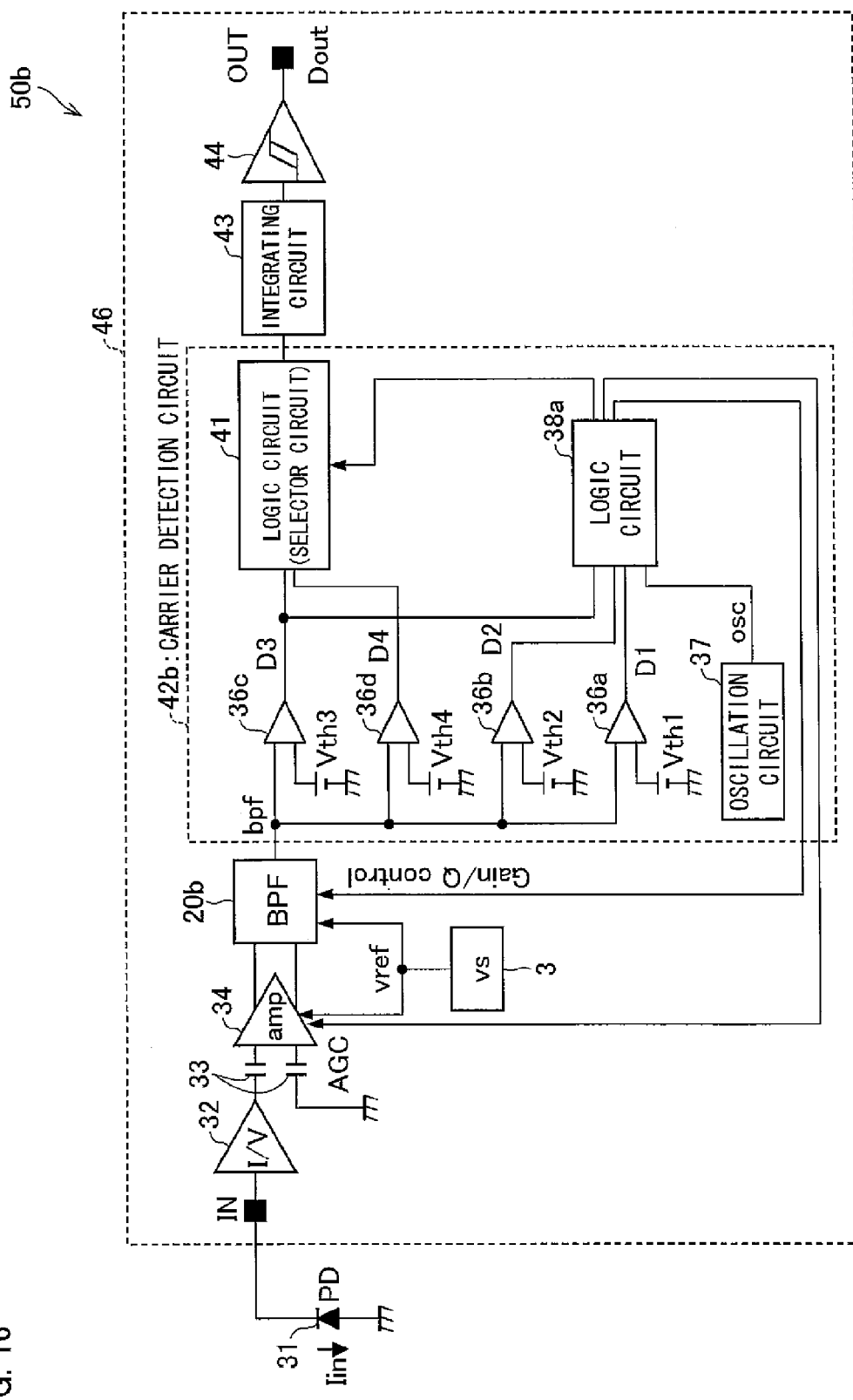
FIG. 16 is a diagram showing a configuration of an infrared remote control receiver according to another embodiment.
Figure 17:
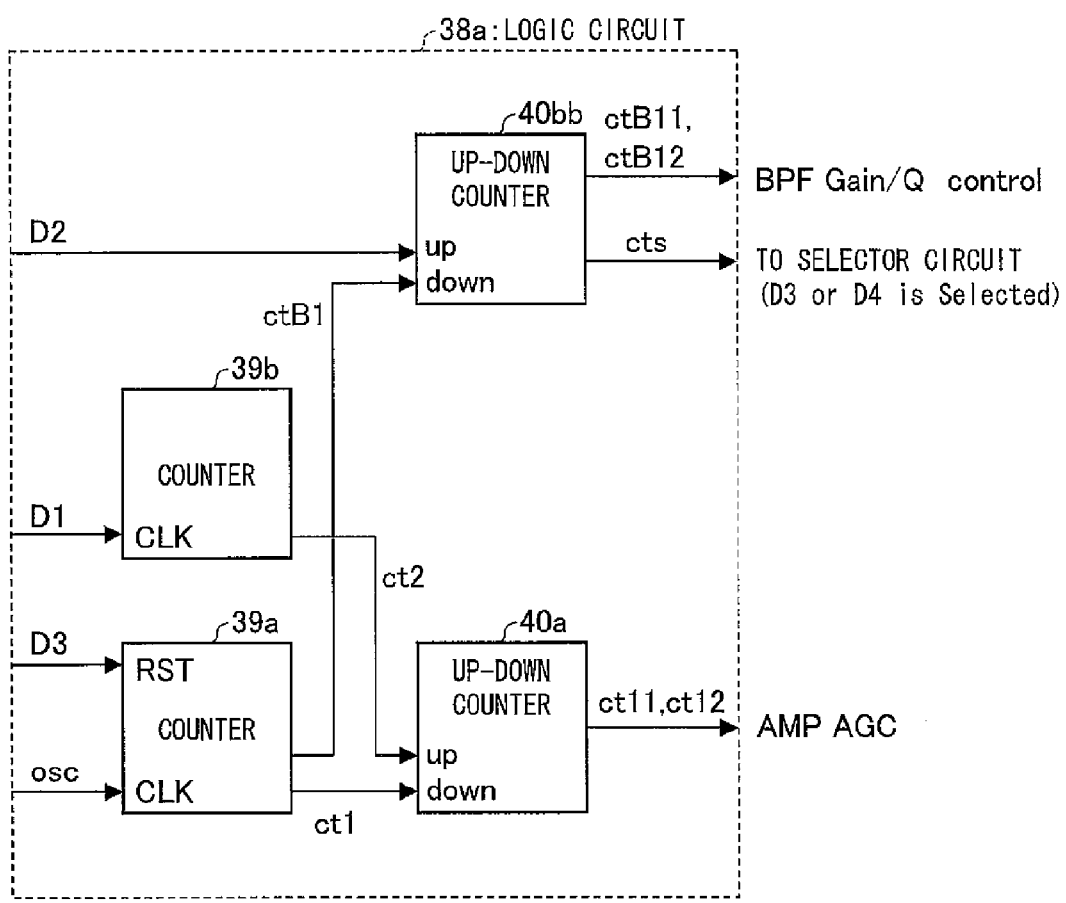
FIG. 17 is a block diagram showing a configuration of a logic circuit in the infrared remote control receiver show in FIG. 16.
Figure 18:
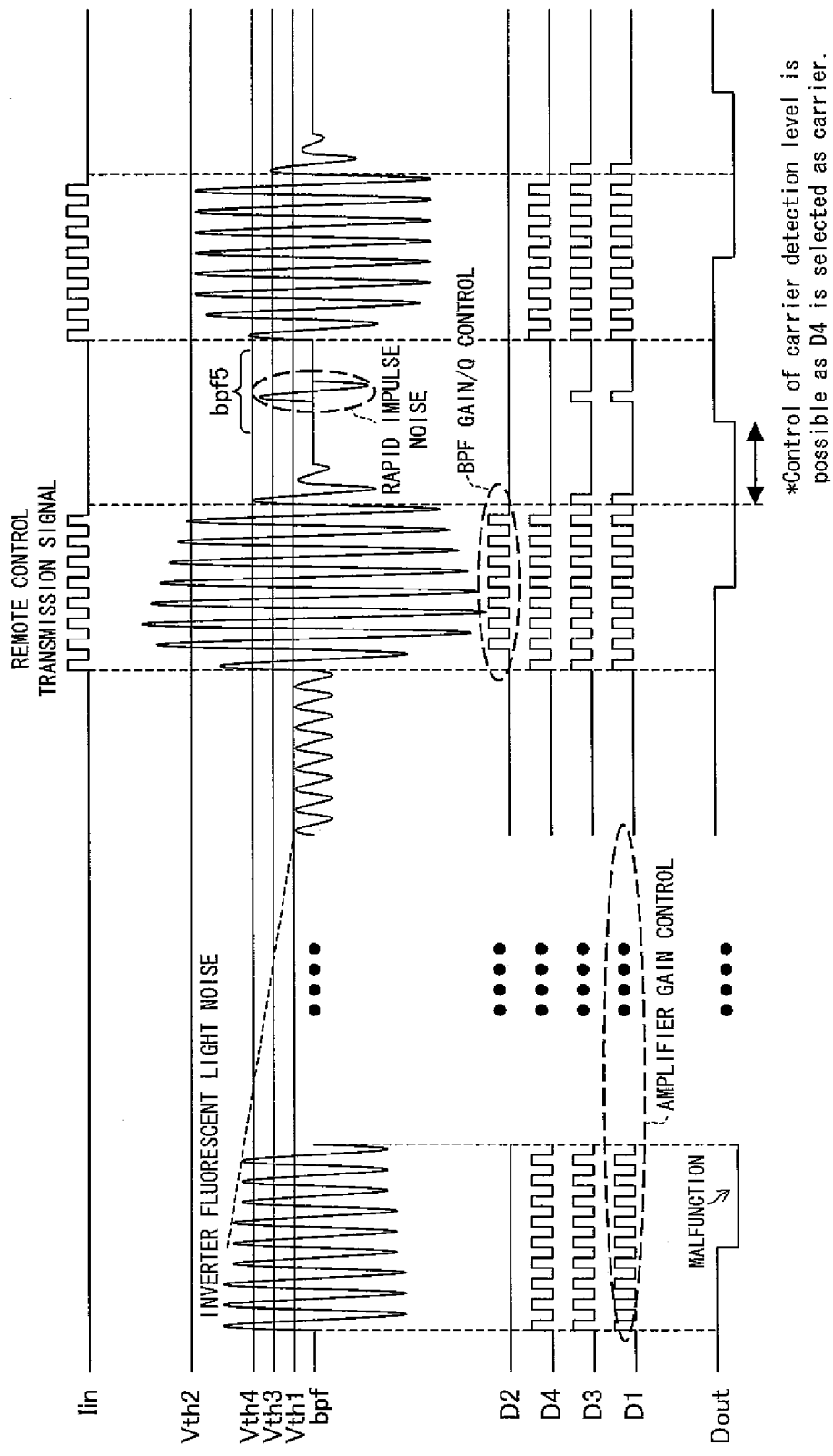
FIG. 18 is a diagram showing an operation of each circuit in the infrared remote control receiver shown in FIG. 16.

The following describes another embodiment of the present invention, with reference to FIG. 16 to FIG. 18.

FIG. 16 shows a configuration of an infrared remote control receiver 50b. Note that members with the same reference numerals as those of the foregoing infrared remote control receiver 50a shown in FIG. 8 have the same functions, and explanations for these members are therefore omitted here.

The configuration of the infrared remote control receiver 50b is different from that of the infrared remote control receiver 50a in that the infrared remote control receiver 50b is provided with a carrier detection circuit 42b serving as the carrier detection circuit 42a, The carrier detection circuit 42b is different from the carrier detection circuit 42a in that the carrier detection circuit 42b includes a comparator 36d (fourth comparing circuit), a logic circuit 38a serving as the logic circuit 38, and a selector circuit 41. To one of input terminals of the comparator 36d, an output signal bpf from the BPF 20b is input. To another one of the input terminals, a threshold voltage Vth4 (fourth threshold voltage) whose level is a second signal detection level (a second carrier detection level) is input. The threshold voltages Vth1 to Vth4 have the following relation: Vth1<Vth3<Vth4<Vth2.

FIG. 17 shows an exemplary configuration of the logic circuit 38a.

The configuration of the logic circuit 38a is substantially the same as the logic circuit 38; however, the logic circuit 38a includes an up-down counter 40bb serving as the up-down counter 40b. The up-down counter 40bb controls the BPF 20b, and also controls the selector circuit 41. More specifically, when an output signal D2 from the comparator 36b is input, the up-down counter 40bb outputs a selector control signal cts to the selector circuit 41.

The selector circuit 11 receives the output signal D3 from the comparator 36c and an output signal D4 from the comparator 36d, and selects therefrom a carrier. The carrier is selected based on the selector control signal output from the up-down counter 40bb in the logic circuit 38a. The output signal D4 of the comparator 36d is selected as the carrier when the selector control signal cts is input.

When the output signal D2 of the comparator 36b is output: i.e., when it is judged that a problem such as an increase in the pulse width of the output signal D3 of the comparator 36c may occur, the output signal D4 of the comparator 6d is output as the carrier to the subsequent stage. Thus, outputting of suitable carrier for the remote control transmission signal is possible. Thus, a problem of not being able to receive signals will not occur. Further, since the output carrier is the output signal D4 of the comparator 6d which signal has been acquired as a result of the comparison with the threshold voltage Vth4 higher than the threshold voltage Vth2, it is possible to further restrain the malfunctions attributed to the fluorescent light noise.

Further, the configuration of the Embodiment 4 is capable of handling a case where fluorescent light noise is suddenly generated while remote control transmission signals are input; e.g. where a fluorescent light is suddenly turned on. See FIG. 18 for the explanation below. FIG. 18 shows respective operational waveforms of the circuits in the infrared remote control receiver 50b, in a case where the fluorescent light noise occurs.

As shown in the figure, even if the fluorescent light noise suddenly occurs (signal bpf 5 in the figure), the output signal D2 from the comparator 36b is output before the occurrence of the noise. Therefore, the selector circuit 41 outputs as the carrier the output signal D4 of the comparator 36d. Thus, it is possible to restrain malfunctions attributed to the sudden occurrence of the fluorescent light noise.

Figure 19:
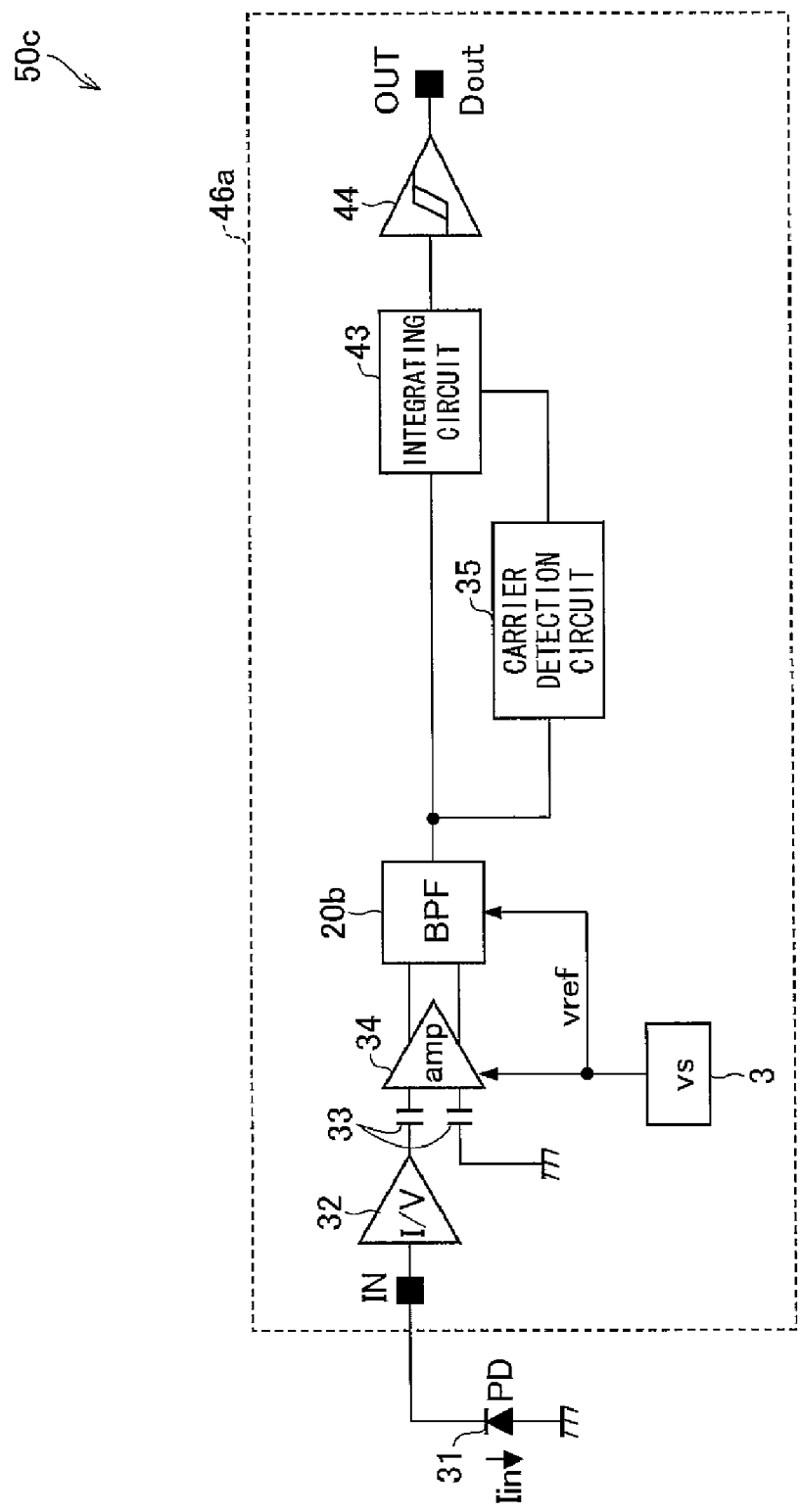
FIG. 19 is a diagram showing a configuration of an infrared remote control receiver of another embodiment.

An infrared remote control receiver of the present invention is not limited to the configurations of the foregoing Embodiments 3 and 4, configuration of the infrared remote control receiver 50c shown in FIG. 19 is also adoptable. Although the infrared remote control receiver 50c has the same configuration as the infrared remote control receiver 50a, the following is also possible: an infrared remote control receiver 50c in which (i) the carrier detection circuit 42a is replaced with a carrier detection circuit 35 which only performs carrier detection and (ii) respective outputs from the carrier detection circuit 35 and the BPF 20b are input to the integrating circuit 43. Since this configuration also has the amplifier 34 and the BPF 20b, the power-source noise canceling characteristic is improved while the dynamic range is kept from decreasing.

Embodiment 5

Another embodiment of the present invention is described below with reference to FIG. 20.

Each of the embodiments 3 and 4 deals with a case where a BPF of the present invention are adopted to an infrared remote control receiver. However, it is not only an infrared remote control receiver that can adopt the BPF and/or BEF of the present invention. For example, the BEF and BPF of the present invention can be also adopted to: (i) an optical space transmission/reception device (infrared signal processing circuit) whose transmission rate is 2.4 kbps to 115.2 kbps, 1.152 Mbps, or 4 Mbps, and whose spatial transmission distance is approximately 1 m; or (ii) a device (infrared signal processing circuit) in compliance with an IrDA Control standard, whose transmission rate is 75 kbps, sub carrier wave is 1.5 MHz, and spatial transmission distance is 1 m or longer. As an example, the present embodiment deals with a case where the BPF (BPF 20b) of the present invention is applied to a device in compliance with the IrDA Control standard (hereinafter simply referred to as IrDA Control device).

Figure 20:
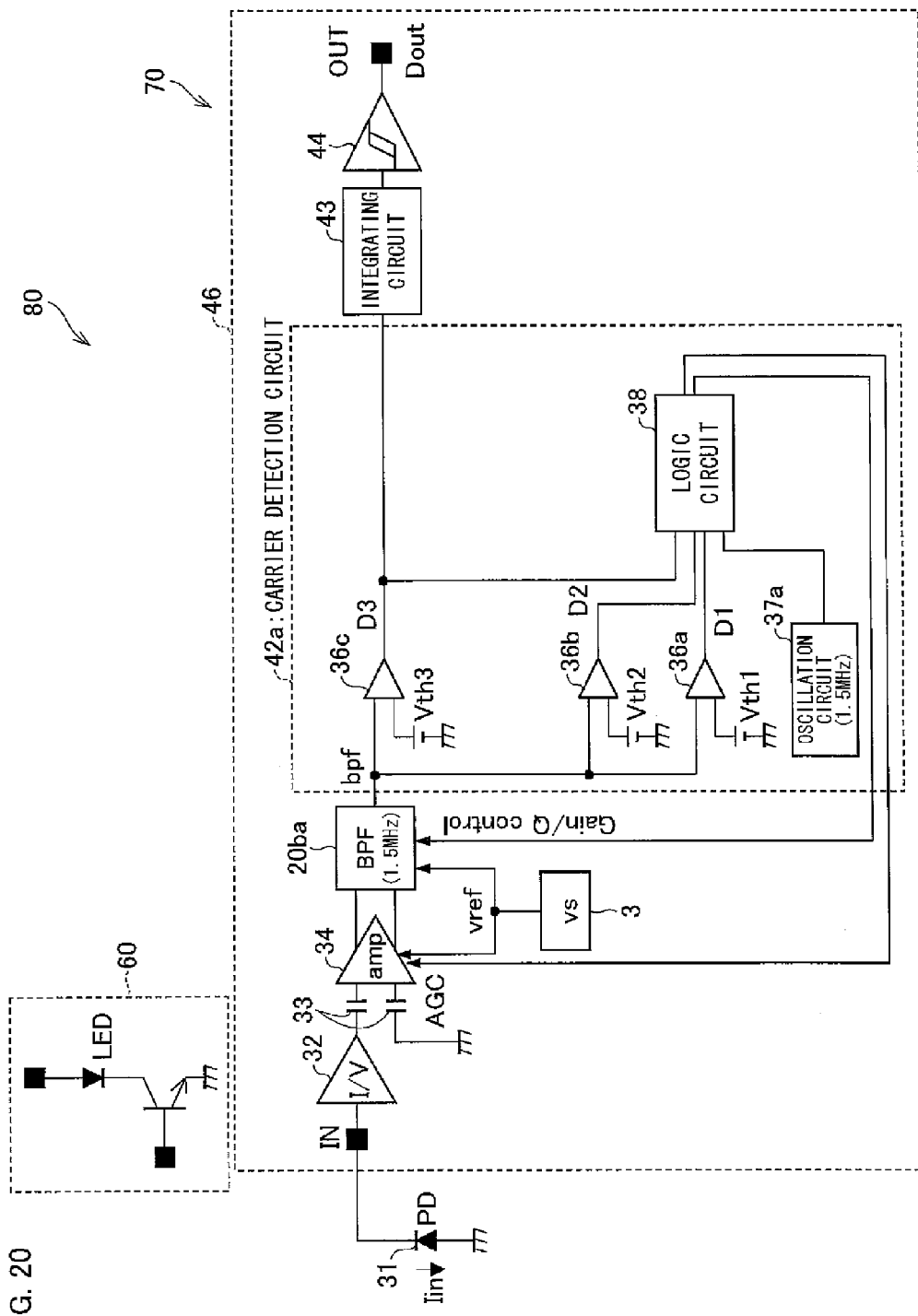
FIG. 20 is a diagram showing a configuration of an IrDA Control of the other embodiment.

FIG. 20 shows an exemplary configuration of an IrDA control device 80. Note that members with the same symbols as those of the infrared remote control receiver 50a shown in FIG. 1 have the same functions, and therefore no particular explanations regarding operations or the like of those members are provided here.

To perform two-way communication, the IrDA Control device 80 includes a transmission section 60 and a reception section 70. The transmission section 60 includes an LED and a drive circuit therefor. The reception section 70 has the similar configuration as that of the infrared remote control receiver 50a. However, since the subcarrier of the IrDA control is 1.5 MHz, the reception section 70 includes: a BPF 20ba (serving as the PPF 20b) whose center frequency is 1.5 MHz; and an oscillation circuit 37a (serving as the oscillation circuit 37) whose oscillation frequency fosc is 1.5 MHz.

IrDA Control device 80 having the above configuration is capable of, for example, (i) reducing inverter fluorescent light noise and (ii) reducing distortion in the waveform of an output from the BPF. Since this configuration also has the amplifier 34 and the BPF 20ba, the power-source noise canceling characteristic is improved while the dynamic range is kept from decreasing.

Figure 21:
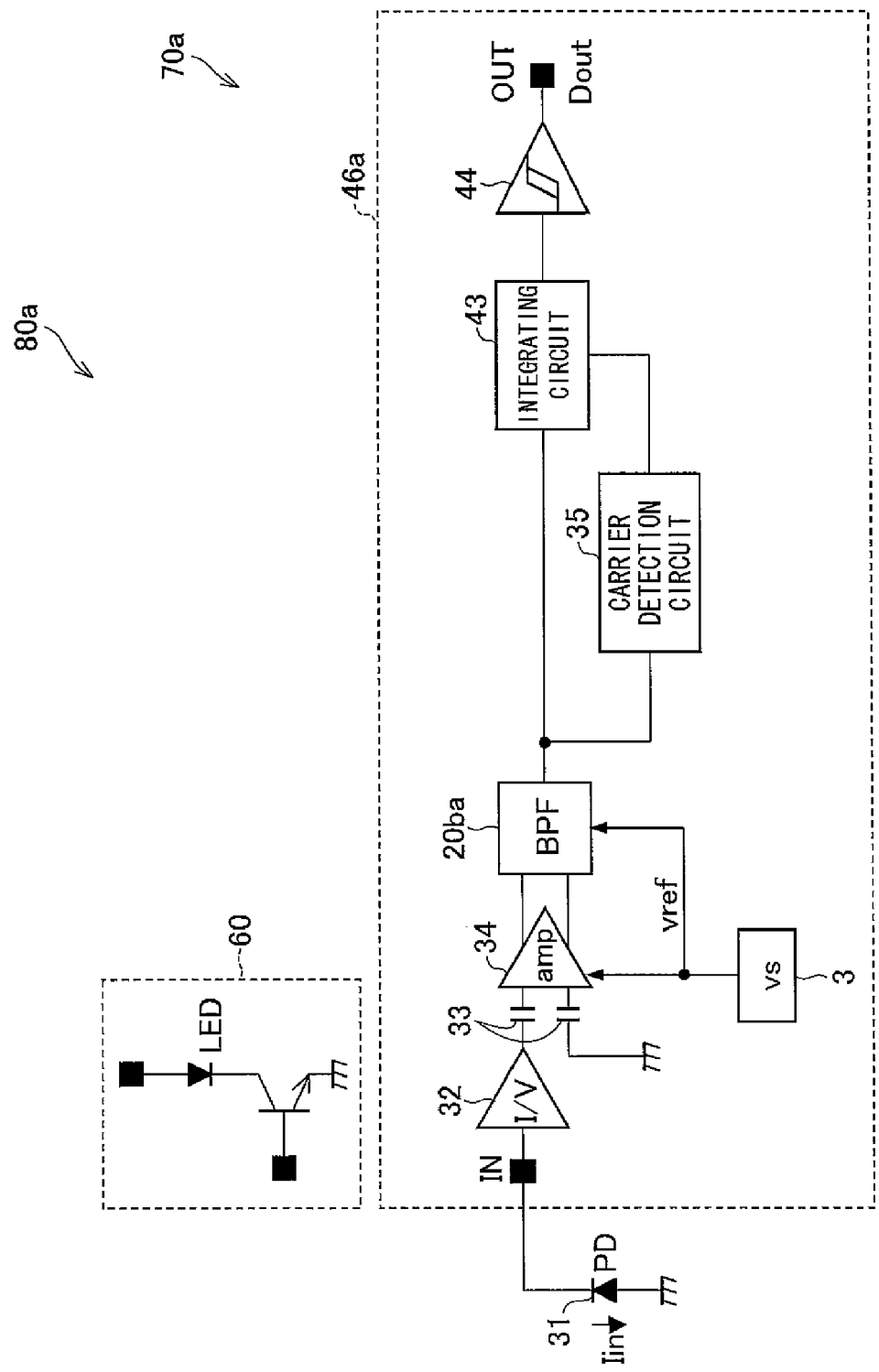
FIG. 21 is a diagram showing a configuration of another IrDA Control.

It is needless to say that the configuration of the IrDA Control device 80 is not limited to the above, and configurations of the foregoing embodiments can be suitably adopted to the configuration of the IrDA Control device 80. For example, a configuration of an IrDA control device 80a shown in FIG. 21 is also possible. The IrDA Control device 80a has a configuration which is the same as the IrDA Control device 80, except in that the reception section 70 is replaced with a reception section 70a. The reception section 70a has the same configuration as the infrared remote control receiver 50c, except in that the BPF20b is replaced with the BPF20ba whose center frequency is at 1.5 MHz. The IrDA Control device 80a is also capable of, for example, reducing inverter fluorescent light noise and reducing distortion in the waveform of an output from the BPF. Further, since this configuration also has the amplifier 34 and the BPF 20ba, the power-source noise canceling characteristic is improved while the dynamic range is kept from decreasing.

With an infrared signal processing circuit of the present invention which is described in the above embodiments, problems in a conventional configuration do not take place. This point is described hereinbelow.

First, the data transferring system disclosed in Published document 1 (published Japanese translations of PCT international publication for patent applications 502147/2001 (Tokuhyou 2001-502147; Published on Feb. 13, 2001)) is provided with a certain period range T check. The system judges whether received signal is an infrared signal or noise, according to whether or not a halt period Td occurred within the period range T check. If the signal received is judged as to be noise, an amplifier is controlled. However, an infrared signal can vary depending on makers, and there are more than ten different kinds of infrared signals: e.g., NEC codes, Sony codes, RCMM codes, etc. Thus, some infrared signals are not adaptable to the halt period Td of the data transferring system, and the system is not able to receive those inadaptable infrared signals. The system is not able to handle sudden occurrence of noise due to its slow gain adjustment speed, as is pointed out in Published document 5 (Japanese Unexamined Patent Publication No. 60410/2006 (Tokukai 2006-60410; Published on Mar. 2, 2006)).

However, unlike the system of Published document 1, the infrared remote control receiver 50a for example is not configured to detect an infrared signal pattern. Therefore, the infrared remote control receiver 50a is able to handle various kinds of infrared signals. Furthermore, the infrared remote control receiver 50b having the selector circuit 41 is able to handle a case of sudden occurrence of noise.

Further, Published document 2 (published Japanese translations of PCT international publication for patent applications 506375/2004 (Tokuhyou 2004-506375; published on Feb. 26, 2004)) discloses a receiver circuit which demodulates an output signal from a BPF, and which controls an amplifier and the BPF, using the demodulated signal as a trigger. However, this receiver circuit has the following problem. Namely, when noise from fluorescent light having a high illuminance enters the receiver circuit, the output signal of the BPF is saturated by the noise. This causes the demodulated signal to be constantly at the L level. Due to this, the demodulated signal does not function as the trigger, and as the result, the amplifying circuit and bandpass filter are not controlled.

On the other hand, for example, the infrared remote control receiver 50a performs control caused by an output signal from the comparing circuit 36, which signal is obtained as a result of comparison with the output signal bpf from the BPF 20b. This output signal of the comparing circuit 36 needed for performing the control is acquired as long as the BPF 20b is oscillating. Therefore, it is possible to avoid the problem of Published document 2 that the amplifier and BPF are not controlled.

Figure 22:
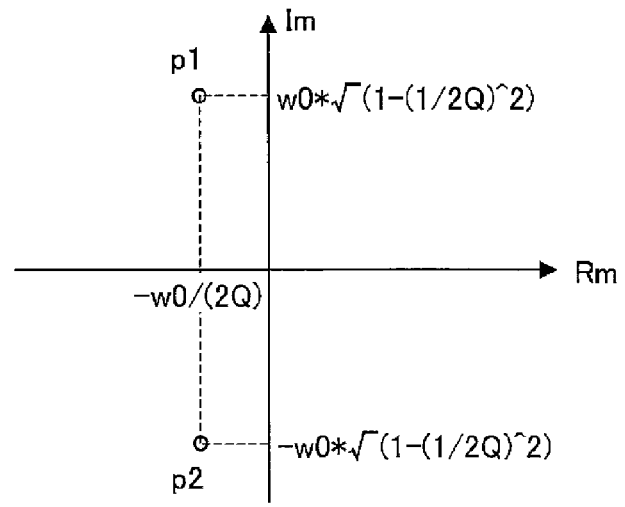
FIG. 22(*a*) is a diagram for explaining the stability of a BPF and distortion in the waveform of an output, and is showing the pole assignment of the BPF.
Figure 22:
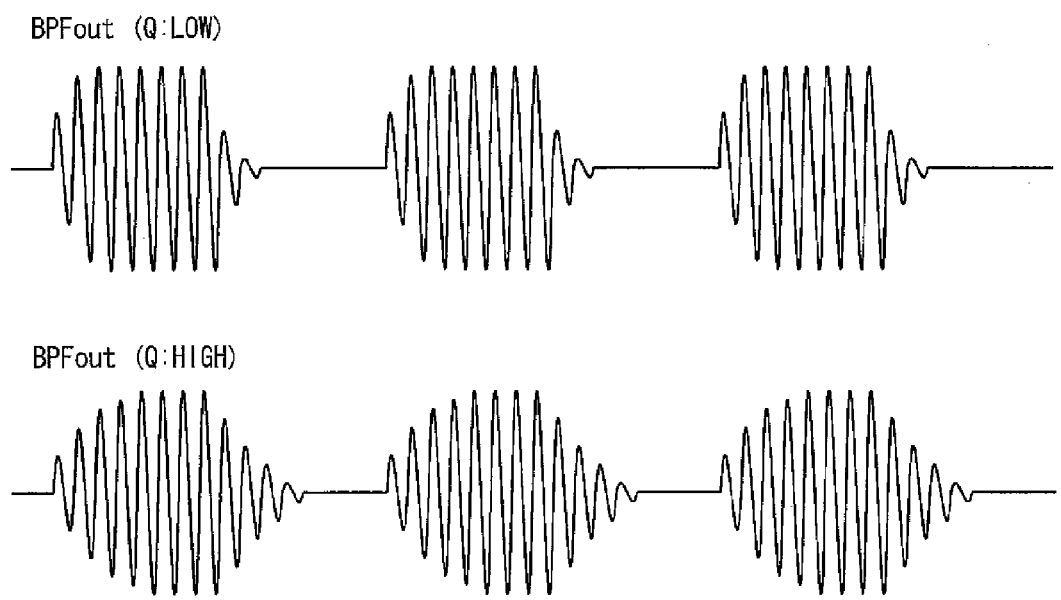
Figure 23:
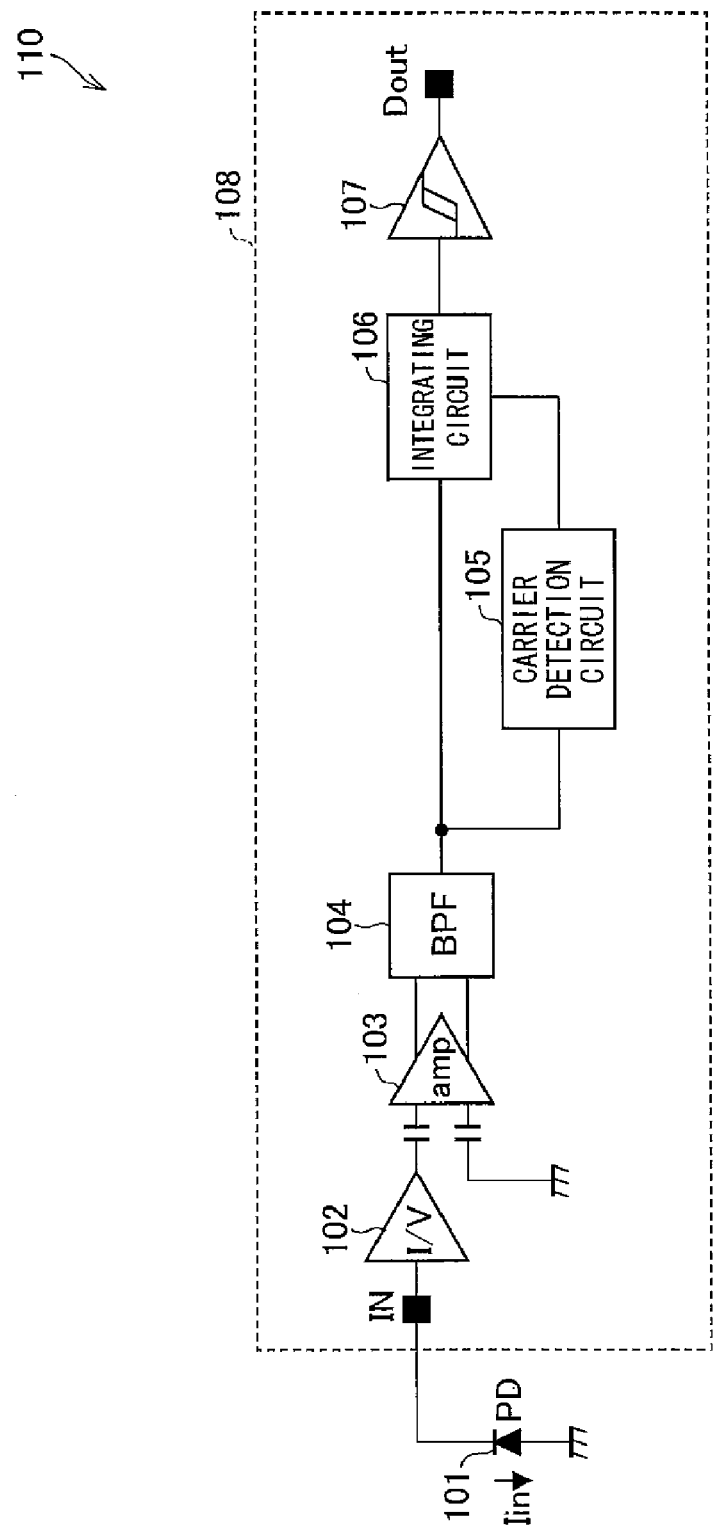
FIG. 23 is a diagram of a conventional technology, showing a configuration of an infrared remote control receiver
Figure 24:
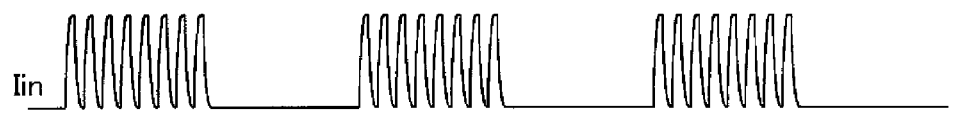
FIG. 24(a) is a diagram showing an output from a current-to-voltage-conversion circuit in the infrared remote control receiver showing in FIG. 23.
FIG. 24(b) is a diagram showing an output (solid line) of a bandpass filter circuit in the infrared remote control receiver showing in FIG. 23, and an output (dotted line) of a carrier detection circuit of the infrared remote control receiver.
FIG. 24(c) is a diagram showing an output (solid line) of an integrating circuit in the infrared remote control receiver showing in FIG. 23.
FIG. 24(d) is a diagram showing a digital output of the infrared remote control receiver shown in FIG. 23.
Figure 24:
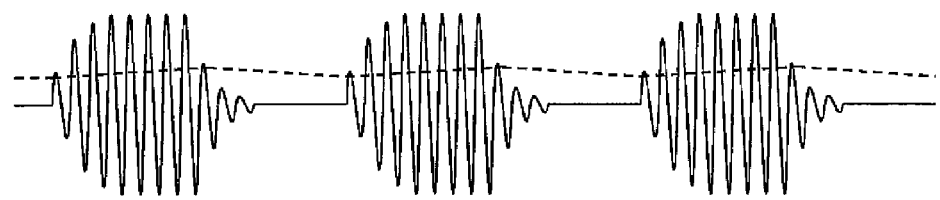
Figure 24:
Figure 24:
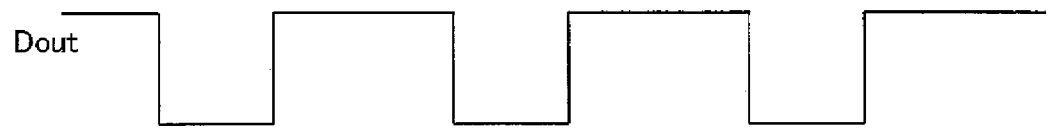
Figure 25:
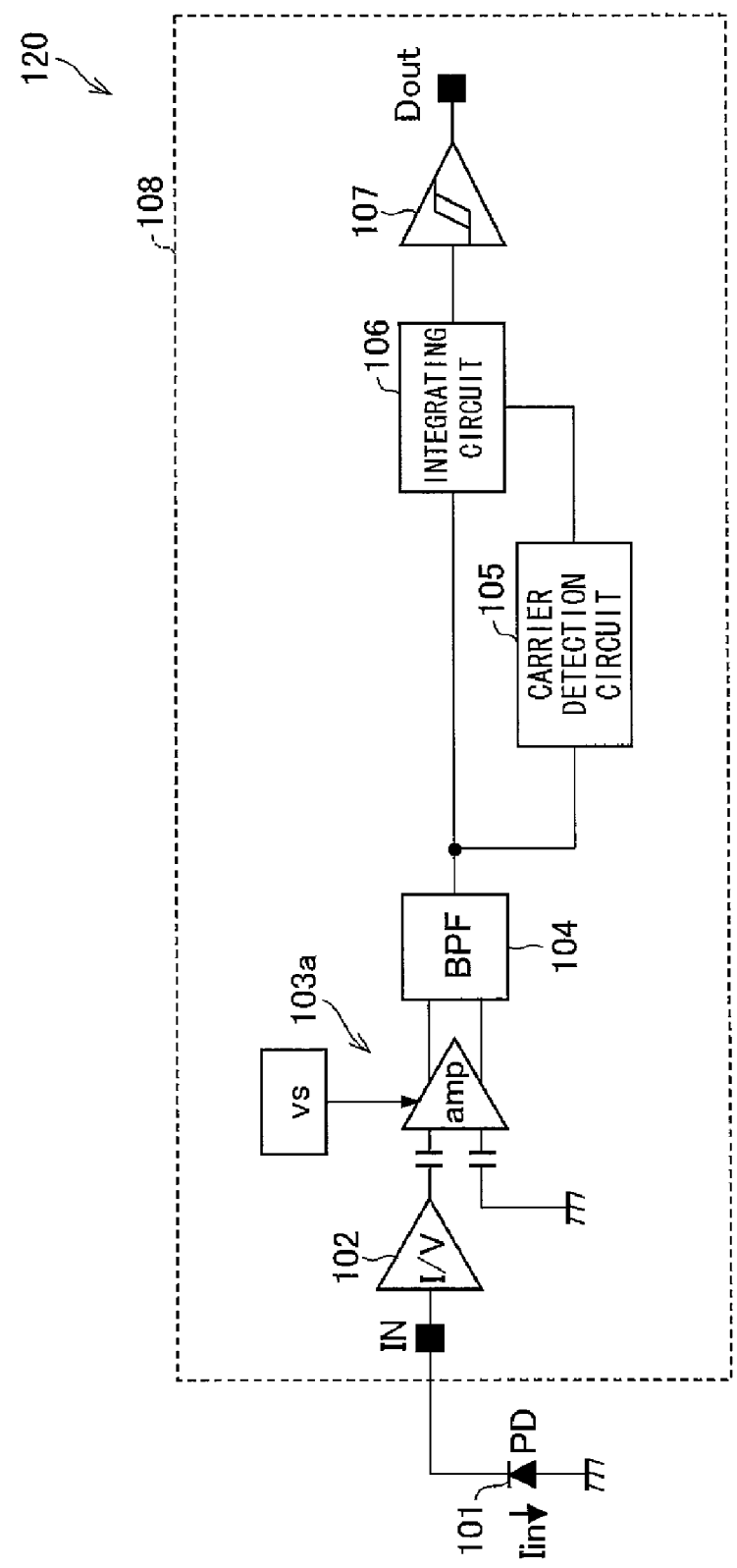
FIG. 25 is a diagram of a conventional technology, and is showing a configuration of an infrared remote control receiver having an improved power-source noise canceling characteristic.
Figure 26:
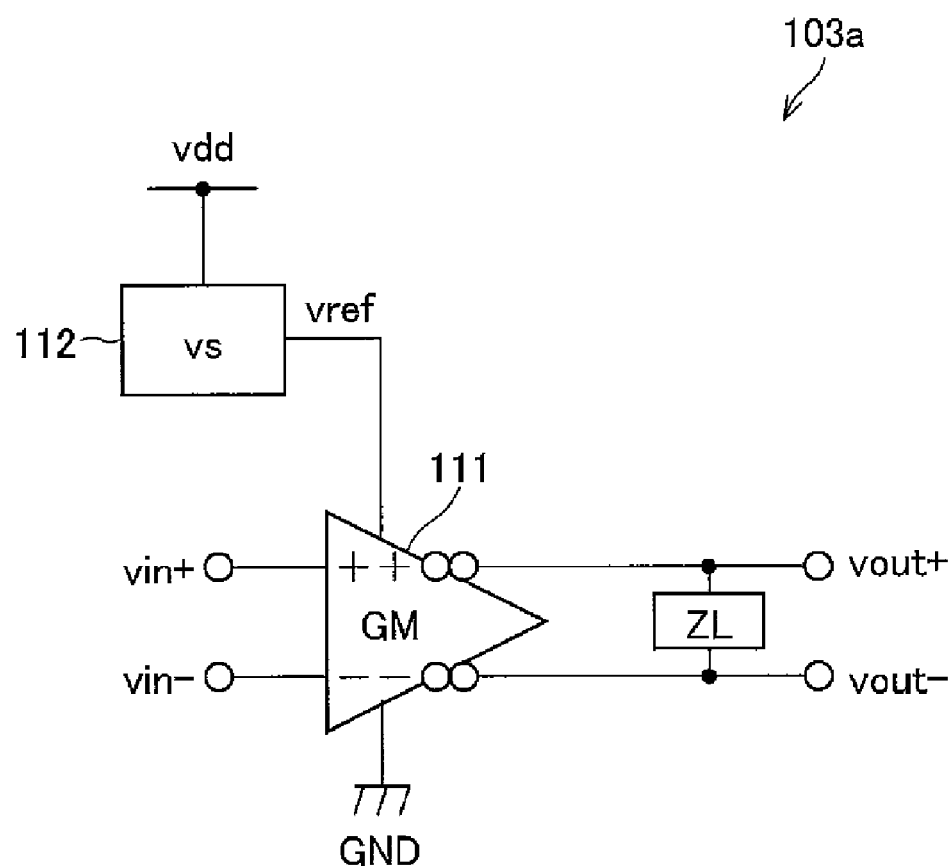
FIG. 26 is a diagram showing a configuration of a operational amplifier circuit in the infrared remote control receiver shown in FIG. 25.

Further, Published document 3 (Japanese Unexamined Patent Publication No. 56541/2004 (Tokukai 2004-56541; published on Feb. 19, 2004)) discloses a remote control light receiving device which detects an output signal of a BPF and which reduces noise by increasing the Q-value of the BPF. However, an increase of the Q-value causes a problem such as the follows: deterioration in stability of the BPF; and/or deterioration of the reception sensitivity due to increase in waveform distortion of the output signal bpf of the BPF. This is explained with reference to FIG. 22(a) and FIG. 22(b). FIG. 22(a) shows a pole assignment of the BPF, and FIG. 22(b) shows an output signal waveform of the BPF.

First described is the stability of the BPF. Formula (18) shows the transfer function of the BPF, and Formula (19) shows the polarities p1 and p2 of the BPF.

$$H(s)=(H\times\omega 0s/Q)/(s^2+\omega 0s/Q+\omega 0^2) \quad (18)$$

$$p1=(-\omega 0/2/Q, \omega 0(1-(\tfrac{1}{2}Q)^2)^{1/2})$$

$$p2=(-\omega 0/2/Q, -\omega 0(1-(\tfrac{1}{2}Q)^2)^{1/2}) \quad (19)$$

As shown in FIG. 22(a), the polarity assignment approaches to the right half plane, by increasing the Q-value of the BPF. As the result, in a negative feedback circuit, the BPF is made unstable according to Nyquist stability criterion which says a system is destabilized when the polarity assignment is in the right half plane.

Next described is the distortion of the waveform in the output signal of the BPF. A sine wave response of the BPF is obtained as follows. Namely, where Laplace transform of sine wave is as presented in Formula (20), the sine wave response of the BPF is obtained by performing reverse-Laplace transform of H(S)F(S) (Formula (7)).

$$F(s)=L(\sin(\omega 0t))=\omega 0/(s^2+\omega 0^2) \quad (20)$$

$$L^{-1}(H(s)F(s))=H(1-\exp(-\omega 0t/2/Q))\sin(\omega 0t) \quad (21)$$

It is found that the waveform distortion increases with an increase in the Q-value, since the $(1-\exp(-\omega 0t/2/Q))$ in Formula (21) influences the waveform distortion. The increase in the waveform distortion in the output signal of the BPF causes deterioration in the reception sensitivity. Especially, when the pulse width of the base frequency of the remote control transmission signal is small, the waveform distortion is relatively increased. Accordingly, the Q-value of the BPF is set to approximately 10 to 15 in general.

However, in the infrared remote control receiver 50a for example, the gain of the amplifier 34 and the gain and Q-value of the BPF 20b are judged as to be large, when the output signal D2 is output from the comparator 36b, and the BPF 20b is rapidly controlled so that the gain and Q-value of the SPF 20b are reduced. Thus, the above mentioned problems are avoided.

Further, Published document 4 (Japanese Unexamined Patent Publication No. 331076/1999 (Tokukaihei 11-331076; Published on Nov. 30, 1999)) discloses an infrared signal processing circuit which generates a reference level voltage for detecting a carrier, by using a noise level voltage or the like detected. In the infrared signal processing circuit, the reception sensitivity drops with variation in the reference voltage level at the time of inputting an infrared signal. Thus, it is necessary to smoothen the reference voltage level with a use of an integrating circuit whose time constant is large. This necessitates a capacitor with a large capacitance in the integrating circuit built of the infrared signal processing circuit. Therefore, the chip-size is increased, consequently increasing the costs.

However, in the infrared remote control receiver 50a for example, a large time constant can be set in the logic circuit 38. Therefore, it is possible to reduce the capacitance of the capacitor in the integrating circuit.

Further, Published document 5 discloses a gain adjustment circuit which reduces its time constant so as to handle sudden generation of fluorescent light noise. In this case, however, since the time constant of the gain adjustment circuit is small, the reception sensitivity is deteriorated.

In the infrared remote control receiver 50b, on the other hand, the carrier detection level is suitably modified by the selector circuit 41. This, while avoiding deterioration of the reception sensitivity, restrains malfunctions attributed to sudden occurrence of fluorescent light noise.

An operational amplifier circuit of the present embodiment may include: the voltage supply circuit includes (i) a first MOS transistor whose source is connected to the power source terminal, and whose gate and drain are connected to each other, and (ii) a second MOS transistor whose source is connected to a connection point between the gate and drain of the first MOS transistor, and whose gate and drain are connected to each other and are connected to a ground terminal; and the reference voltage is acquired from the connection point between the gate and drain of the first MOS transistor.

The reference voltage (vref) of the above configuration is expressed by the following Formula (1).

Since a current (Id) flowing in the first transistor and that flows in the second transistor equals each other, $$Id = (1/2)*\mu p*Cox*(W1/L1)*(vgs1-vth)^2 = \qquad (1)$$
$$(1/2)*\mu p*Cox*(W2/L2)*(vgs2-vth)^2.$$

Thus, $$vgs1 = vth+((W2/L2)/(W1/L1)^{1/2})*(vgs2-vth)$$

Since $$vdd = vgs1+vgs2, =$$
$$vth+((W2/L2)/(W1/L1)^{1/2})*(vgs2-vth)+vgs2.$$

Since $$vref = vgs2, = \{(W1/L1)^{1/2}/((W2/L2)^{1/2}+(W1/L1)^{1/2})\}*vdd +$$
$$\{((W2/L2)^{1/2}-(W1/L1)^{1/2})/((W2/L2)^{1/2}+(W1/L1)^{1/2})\}*vth$$

where:
Id is a drain current;
μp is the mobility of electrons;
Cox is an oxidized film capacitance;
W is a channel width;
L is a channel length;
W1/L1 is a W/L ratio of the first transistor;
W2/L2 is a W/L ratio of the second transistor;
vgs1 is a gate-source voltage of the first transistor;
vgs2 is a gate-source voltage of the second transistor;
vth is a threshold voltage; and
vdd is a power source voltage.

Here, for example, supposing that W1=W2=W, L1=9*L2=9*L,
the Formula (1) is:

$$vref=(\frac{1}{4})*vdd+(\frac{1}{2})*vth \qquad (2).$$

As is apparent from the above, a voltage which is hardly affected by the power source voltage is acquired in the voltage supply circuit. Further, in the voltage supply circuit, such a voltage is acquired with a simple configuration adopting two MOS transistors.

Further, the operational amplifier circuit of each of the embodiments may include: the voltage supply circuit includes (i) a first MOS transistor whose source is connected to the power source terminal, and whose gate and drain are connected to each other, (ii) a second MOS transistor whose source is connected to a connection point between the gate and drain of the first MOS transistor, and whose gate and drain are connected to each other and are connected to a ground terminal, and a capacitor connected in parallel to the second MOS transistor; and the reference voltage is acquired from the connection point between the gate and drain of the first MOS transistor.

With the configuration, the voltage (vrefa) is expressed by Formula (1), and is acquired by a simple configuration adopting two MOS transistors. Further, in the configuration, the capacitor is provided in parallel to the second MOS transistor, thereby forming a lowpass filter. Thus, the power source noise is cancelled, even if the noise is high frequency noise.

Further, the operational amplifier circuit of each of the embodiments may be adapted so that the common-mode feedback circuit includes MOS transistors, and at least one cascode circuit which increases an output impedance of constant current sources of the common-mode feedback circuit.

With the configuration, the output impedance of the constant current source of the common-mode feedback circuit is increased. Accordingly, a broader bandwidth can be covered.

Further, the bandpass filter circuit of each of the embodiments may be adapted so that: the voltage supply circuit includes (i) a first MOS transistor whose source is connected to the power source terminal, and whose gate and drain are connected to each other, and (ii) a second MOS transistor whose source is connected to a connection point between the gate and drain of the first MOS transistor, and whose gate and drain are connected to each other and are connected to a ground terminal; and the reference voltage is acquired from the connection point between the gate and drain of the first MOS transistor.

The reference voltage (vref) of the above configuration is expressed by the following Formula (1).

Since a current (Id) flowing in the first transistor and that flows in the second transistor equals each other, $$Id = (1/2)*\mu p*Cox*(W1/L1)*(vgs1-vth)^2 = \qquad (1)$$
$$(1/2)*\mu p*Cox*(W2/L2)*(vgs2-vth)^2.$$

Thus, $$vgs1 = vth+((W2/L2)/(W1/L1)^{1/2})*(vgs2-vth).$$

Since $$vdd = vgs1+vgs2, =$$
$$vth+((W2/L2)/(W1/L1)^{1/2})*(vgs2-vth)+vgs2.$$

Since $$vref = vgs2, = \{(W1/L1)^{1/2}/((W2/L2)^{1/2}+(W1/L1)^{1/2})\}*vdd +$$
$$\{((W2/L2)^{1/2}-(W1/L1)^{1/2})/((W2/L2)^{1/2}+(W1/L1)^{1/2})\}*vth$$

where:
Id is a drain current;
μp is the mobility of electrons;
Cox is an oxidized film capacitance;
W is a channel width;
L is a channel length;
W1/L1 is a W/L ratio of the first transistor;
W2/L2 is a W/L ratio of the second transistor;
vgs1 is a gate-source voltage of the first transistor;
vgs2 is a gate-source voltage of the second transistor;
vth is a threshold voltage; and
vdd is a power source voltage.

Here, for example, supposing that W1=W2=W, L1=9*L2=9*L,
the Formula (1) is:

$$vref=(\frac{1}{4})*vdd+(\frac{1}{2})*vth \qquad (2).$$

As is apparent from the above, a voltage which is hardly affected by the power source voltage is acquired in the voltage supply circuit. Further, in the voltage supply circuit, such a voltage is acquired with a simple configuration adopting two MOS transistors.

Further, the bandpass filter circuit of each of the embodiments may be adapted so that: the voltage supply circuit includes (i) a first MOS transistor whose source is connected to the power source terminal, and whose gate and drain are connected to each other, (ii) a second MOS transistor whose source is connected to a connection point between the gate and drain of the first MOS transistor, and whose gate and drain are connected to each other and are connected to a ground terminal, and (iii) a fourth capacitor connected in parallel to the second MOS transistor; and the reference voltage is acquired from the connection point between the gate and drain of the first MOS transistor.

With the configuration, the voltage (vrefa) is expressed by Formula (1), and is acquired by a simple configuration adopting two MOS transistors. Further, in the configuration, the fourth capacitor is provided in parallel to the second MOS transistor, thereby forming a lowpass filter. Thus, the power source noise is cancelled, even if the noise is high frequency noise.

Further, the bandpass filter circuit of each of the embodiments may be adapted so that each of the common-mode feedback circuits includes MOS transistors, and at least one cascode circuit which increases an output impedance of constant current sources of the common-mode feedback circuit.

With the configuration, the output impedance of the constant current source of the common-mode feedback circuit is increased. Accordingly, a broader bandwidth can be covered.

Further, the bandpass filter circuit of each of the embodiments may further include an adjustment section for adjusting a transconductance of at least one of the transconductance amplifier circuits.

With the configuration, the bandpass filter circuit of each embodiment is able to adjust its constant such as Q-value, by using the adjustment section to adjust the transconductance of the transconductance amplifier circuits.

Further, the infrared signal processing circuit of the present embodiment may include: a fourth comparing circuit which compares (i) the output signal from the bandpass filter with (ii) a forth threshold voltage whose level is a second signal detection level, and whose level is higher than the second threshold voltage; and a selector circuit for selecting as a carrier the output signal from the second comparing circuit or an output signal from the fourth comparing circuit.

The infrared signal processing circuit of each embodiment having the above configuration is provided with the foregoing bandpass filter circuit. Therefore, the power-source noise canceling characteristic is improved while the dynamic range is kept from being decreased. Thus, it is possible to provide an infrared signal processing circuit whose power-source noise canceling characteristic is improved while its dynamic range is kept from being decreased.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A bandpass filter circuit, comprising:
a first transconductance amplifier circuit for converting a differential input voltage into a differential output current; a second transconductance amplifier circuit for converting a differential input voltage into a differential output current; a third transconductance amplifier circuit for converting a differential input voltage into a differential output current;
a first common-mode feedback circuit to which a differential output voltage of the first transconductance amplifier circuit and a reference voltage are input, and which outputs a first control signal to the first transconductance amplifier circuit so as to make a D.C. voltage level of a differential output voltage of the first transconductance amplifier circuit equal to the reference voltage;
a second common-mode feedback circuit to which a differential output voltage of the second transconductance amplifier circuit and the reference voltage are input, and which outputs a second control signal to the second transconductance amplifier circuit so as to make a D.C. voltage level of a differential output voltage of the second transconductance amplifier circuit equal to the reference voltage;
a voltage supply circuit for supplying, as the reference voltage, a voltage which is hardly affected by the power source voltage to the first and second common-mode feedback circuits; and
a first capacitor; a second capacitor; and a third capacitor, wherein:
a noninverting input terminal is connected, via the first capacitor, to (i) a noninverting output section of the first transconductance amplifier circuit and (ii) a noninverting input section of the second transconductance amplifier circuit;
an inverting input terminal is connected, via the second capacitor, to (i) an inverting output section of the first transconductance amplifier circuit and (ii) an inverting input section of the second transconductance amplifier circuit;
a noninverting output section of the second transconductance amplifier circuit is connected to (i) an inverting input section of the first transconductance amplifier circuit, (ii) a noninverting input section and an inverting output section of the third transconductance amplifier circuit, and (iii) one end of the third capacitor;
an inverting output section of the second transconductance amplifier circuit is connected to (i) a noninverting input section of the first transconductance amplifier circuit, (ii) an inverting input section and a noninverting output section of the third transconductance amplifier circuit, and (iii) another end of the third capacitor;
the noninverting output section of the third transconductance amplifier circuit serves as an inverting output terminal, the inverting output section of the third transconductance amplifier circuit serves as a noninverting output terminal;
the noninverting output section and the inverting output section of the first transconductance amplifier circuit serve as input terminals of the first common-mode feedback circuit;
the noninverting output section and the inverting output section of the second transconductance amplifier circuit serve as input terminals of the second common-mode feedback circuit; and
the power source voltage is supplied from a power source terminal to each of the circuits.

2. The bandpass filter circuit as set forth in claim 1, wherein:
the voltage supply circuit includes
(i) a first MOS transistor whose source is connected to the power source terminal, and whose gate and drain are connected to each other, and
(ii) a second MOS transistor whose source is connected to a connection point between the gate and drain of the first MOS transistor, and whose gate and drain are connected to each other and are connected to a ground terminal; and
the reference voltage is acquired from the connection point between the gate and drain of the first MOS transistor.

3. The bandpass filter circuit as set forth in claim 1, wherein:
the voltage supply circuit includes
(i) a first MOS transistor whose source is connected to the power source terminal, and whose gate and drain are connected to each other,
(ii) a second MOS transistor whose source is connected to a connection point between the gate and drain of the first MOS transistor, and whose gate and drain are connected to each other and are connected to a ground terminal, and
(iii) a fourth capacitor connected in parallel to the second MOS transistor; and
the reference voltage is acquired from the connection point between the gate and drain of the first MOS transistor.

4. The bandpass filter circuit as set forth in claim 1, wherein:
each of the common-mode feedback circuits includes MOS transistors, and at least one cascode circuit which increases an output impedance of constant current sources of the common-mode feedback circuit.

5. The bandpass filter circuit as set forth in claim 1, further comprising:
an adjustment section for adjusting a transconductance of at least one of the transconductance amplifier circuits.

6. A bandpass filter circuit, comprising:
a first transconductance amplifier circuit for converting a differential input voltage into a differential output current; a second transconductance amplifier circuit for converting a differential input voltage into a differential output current;
a first common-mode feedback circuit to which a differential output voltage of the first transconductance amplifier circuit and a reference voltage are input, and which outputs a first control signal to the first transconductance amplifier circuit so as to make a D.C. voltage level of a differential output voltage of the first transconductance amplifier circuit equal to the reference voltage;
a second common-mode feedback circuit to which a differential output voltage of the second transconductance amplifier circuit and the reference voltage are input, and which outputs a second control signal to the second transconductance amplifier circuit so as to make a D.C. voltage level of a differential output voltage of the second transconductance amplifier circuit equal to the reference voltage;
a voltage supply circuit for supplying, as the reference voltage, a voltage which is hardly affected by the power source voltage to the first and second common-mode feedback circuits; and
a first capacitor; a second capacitor; and a third capacitor, wherein:
the first transconductance amplifier circuit includes a first output section and a second output section;
a noninverting input terminal is connected, via the first capacitor, to (i) a noninverting output section in the first output section of the first transconductance amplifier circuit and (ii) a noninverting input section of the second transconductance amplifier circuit;
an inverting input terminal is connected, via the second capacitor, to (i) an inverting output section in the first output section of the first transconductance amplifier circuit and (ii) an inverting input section of the second transconductance amplifier circuit;
a noninverting output section of the second transconductance amplifier circuit is connected to (i) an inverting input section of the first transconductance amplifier circuit, (ii) an inverting output section in the second output section of the first transconductance amplifier circuit, and (iii) one end of the third capacitor;
an inverting output section of the second transconductance amplifier circuit is connected to (i) a noninverting input section of the first transconductance amplifier circuit, (ii) a noninverting output section in the second output section of the first transconductance amplifier circuit, and (iii) another end of the third capacitor;
the noninverting output section of the second transconductance amplifier circuit serves as a noninverting output terminal, and the inverting output section of the second transconductance amplifier circuit serves as an inverting output terminal;
the noninverting output section and the inverting output section in the first output section of the first transconductance amplifier circuit serve as input terminals of the first common-mode feedback circuit;
the noninverting output section and the inverting output section of the second transconductance amplifier circuit serve as input terminals of the second common-mode feedback circuit; and
the power source voltage is supplied from a power source terminal to each of the circuits.

7. The bandpass filter circuit as set forth in claim 6, wherein:
the voltage supply circuit includes
(i) a first MOS transistor whose source is connected to the power source terminal, and whose gate and drain are connected to each other, and
(ii) a second MOS transistor whose source is connected to a connection point between the gate and drain of the first MOS transistor, and whose gate and drain are connected to each other and are connected to a ground terminal; and
the reference voltage is acquired from the connection point between the gate and drain of the first MOS transistor.

8. The bandpass filter circuit as set forth in claim 6, wherein:
the voltage supply circuit includes
(i) a first MOS transistor whose source is connected to the power source terminal, and whose gate and drain are connected to each other,
(ii) a second MOS transistor whose source is connected to a connection point between the gate and drain of the first MOS transistor, and whose gate and drain are connected to each other and are connected to a ground terminal, and
(iii) a fourth capacitor connected in parallel to the second MOS transistor; and
the reference voltage is acquired from the connection point between the gate and drain of the first MOS transistor.

9. The bandpass filter circuit as set forth in claim 6, wherein:
each of the common-mode feedback circuits includes MOS transistors, and at least one cascode circuits which increases an output impedance of constant current sources of the common-mode feedback circuit.

10. The bandpass filter circuit as set forth in claim 6, further comprising:
an adjustment section for adjusting a transconductance of at least one of the transconductance amplifier circuits.

11. An infrared signal processing circuit, comprising:
a photo-acceptance element for converting an infrared signal received into an electric signal;
an amplifying circuit for amplifying the electric signal;
a bandpass filter for extracting a carrier frequency component from the electric signal amplified; and
a carrier detection circuit including (I) a first comparing circuit which compares an output signal of the bandpass filter with a first threshold voltage whose level is a noise detection level, (II) a second comparing circuit which compares the output signal of the bandpass filter with a second threshold voltage whose level is higher than the first threshold voltage and is a first carrier detection level, (III) a third comparing circuit which compares the output signal of the bandpass filter with a third threshold voltage whose level is higher than the second threshold voltage and is a peak detection level for judging the output signal of the band pass filter and a level of the output signal, (IV) a logic circuit which (i) controls a gain of the amplifying circuit based on an output signal of the first comparing circuit so that the output signal of the first comparing circuit is not output, and (ii) controls the gain and Q-value of the bandpass filter circuit based on an output signal of the third comparing circuit so that the output signal of the third comparing circuit is not output, the carrier detection circuit outputting as a carrier an output signal of the second comparing circuit,
wherein:
the bandpass filter circuit includes:
a first transconductance amplifier circuit for converting a differential input voltage into a differential output current; a second transconductance amplifier circuit for converting a differential input voltage into a differential output current; a third transconductance amplifier circuit for converting a differential input voltage into a differential output current;
a first common-mode feedback circuit to which a differential output voltage of the first transconductance amplifier circuit and a reference voltage are input, and which outputs a first control signal to the first transconductance amplifier circuit so as to make a D.C. voltage level of a differential output voltage of the first transconductance amplifier circuit equal to the reference voltage;
a second common-mode feedback circuit to which a differential output voltage of the second transconductance amplifier circuit and the reference voltage are input, and which outputs a second control signal to the second transconductance amplifier circuit so as to make a D.C. voltage level of a differential output voltage of the second transconductance amplifier circuit equal to the reference voltage;
a voltage supply circuit for supplying, as the reference voltage, a voltage which is hardly affected by the power source voltage to the first and second common-mode feedback circuits;
a first capacitor; a second capacitor; and a third capacitor; and
an adjustment section for adjusting a transconductance of at least one of the transconductance amplifier circuits,
a noninverting input terminal being connected, via the first capacitor, to (i) a noninverting output section of the first transconductance amplifier circuit and (ii) a noninverting input section of the second transconductance amplifier circuit;
an inverting input terminal being connected, via the second capacitor, to (i) an inverting output section of the first transconductance amplifier circuit and (ii) an inverting input section of the second transconductance amplifier circuit;
a noninverting output section of the second transconductance amplifier circuit being connected to (i) an inverting input section of the first transconductance amplifier circuit, (ii) a noninverting input section and an inverting output section of the third transconductance amplifier circuit, and (iii) one end of the third capacitor;
an inverting output section of the second transconductance amplifier circuit being connected to (i) a noninverting input section of the first transconductance amplifier circuit, (ii) an inverting input section and a noninverting output section of the third transconductance amplifier circuit, and (iii) another end of the third capacitor;
the noninverting output section of the third transconductance amplifier circuit serving as an inverting output terminal, the inverting output section of the third transconductance amplifier circuit serves as a noninverting output terminal;
the noninverting output section and the inverting output section of the first transconductance amplifier circuit serving as input terminals of the first common-mode feedback circuit;
the noninverting output section and the inverting output section of the second transconductance amplifier circuit serving as input terminals of the second common-mode feedback circuit; and
the power source voltage being supplied from a power source terminal to each of the circuits.

12. The infrared signal processing circuit as set forth in claim 11, comprising:
a fourth comparing circuit which compares (i) the output signal from the bandpass filter with (ii) a forth threshold voltage whose level is a second signal detection level, and whose level is higher than the second threshold voltage; and
a selector circuit for selecting as a carrier the output signal from the second comparing circuit or an output signal from the fourth comparing circuit.

13. An infrared signal processing circuit, comprising:
a photo-acceptance element for converting an infrared signal received into an electric signal;
an amplifying circuit for amplifying the electric signal;
a bandpass filter for extracting a carrier frequency component from the electric signal amplified; and
a carrier detection circuit including (I) a first comparing circuit which compares an output signal of the bandpass filter with a first threshold voltage whose level is a noise detection level, (II) a second comparing circuit which compares the output signal of the bandpass filter with a second threshold voltage whose level is higher than the first threshold voltage and is a first carrier detection level, (III) a third comparing circuit which compares the output signal of the bandpass filter with a third threshold voltage whose level is higher than the second threshold voltage and is a peak detection level for judging the output signal of the band pass filter and a level of the output signal, (IV) a logic circuit which (i) controls a gain of the amplifying circuit based on an output signal of the first comparing circuit so that the output signal of the first comparing circuit is not output, and (ii) controls the gain and Q-value of the bandpass filter circuit based on an output signal of the third comparing circuit so that the output signal of the third comparing circuit is not output, the carrier detection circuit outputting as a carrier an output signal of the second comparing circuit, wherein:

the bandpass filter circuit includes:

a first transconductance amplifier circuit for converting a differential input voltage into a differential output current; a second transconductance amplifier circuit for converting a differential input voltage into a differential output current;

a first common-mode feedback circuit to which a differential output voltage of the first transconductance amplifier circuit and a reference voltage are input, and which outputs a first control signal to the first transconductance amplifier circuit so as to make a D.C. voltage level of a differential output voltage of the first transconductance amplifier circuit equal to the reference voltage;

a second common-mode feedback circuit to which a differential output voltage of the second transconductance amplifier circuit and the reference voltage are input, and which outputs a second control signal to the second transconductance amplifier circuit so as to make a D.C. voltage level of a differential output voltage of the second transconductance amplifier circuit equal to the reference voltage;

a voltage supply circuit for supplying, as the reference voltage, a voltage which is hardly affected by the power source voltage to the first and second common-mode feedback circuits;

a first capacitor; a second capacitor; and a third capacitor; and an adjustment section for adjusting a transconductance of at least one of the transconductance amplifier circuits, the first transconductance amplifier circuit including a first output section and a second output section;

a noninverting input terminal being connected, via the first capacitor, to (i) a noninverting output section in the first output section of the first transconductance amplifier circuit and (ii) a noninverting input section of the second transconductance amplifier circuit;

an inverting input terminal being connected, via the second capacitor, to (i) an inverting output section in the first output section of the first transconductance amplifier circuit and (ii) an inverting input section of the second transconductance amplifier circuit;

a noninverting output section of the second transconductance amplifier circuit being connected to (i) an inverting input section of the first transconductance amplifier circuit, (ii) an inverting output section in the second output section of the first transconductance amplifier circuit, and (iii) one end of the third capacitor;

an inverting output section of the second transconductance amplifier circuit being connected to (i) a noninverting input section of the first transconductance amplifier circuit, (ii) a noninverting output section in the second output section of the first transconductance amplifier circuit, and (iii) another end of the third capacitor;

the noninverting output section of the second transconductance amplifier circuit serving as a noninverting output terminal, and the inverting output section of the second transconductance amplifier circuit serves as an inverting output terminal;

the noninverting output section and the inverting output section in the first output section of the first transconductance amplifier circuit serving as input terminals of the first common-mode feedback circuit;

the noninverting output section and the inverting output section of the second transconductance amplifier circuit serving as input terminals of the second common-mode feedback circuit; and the power source voltage being supplied from a power source terminal to each of the circuits.

14. The infrared signal processing circuit as set forth in claim 13, comprising:

a fourth comparing circuit which compares (i) the output signal from the bandpass filter with (ii) a forth threshold voltage whose level is a second signal detection level, and whose level is higher than the second threshold voltage; and a selector circuit for selecting as a carrier the output signal from the second comparing circuit or an output signal from the fourth comparing circuit.

* * * * *